US009519216B2

(12) United States Patent
Naiini et al.

(10) Patent No.: US 9,519,216 B2
(45) Date of Patent: Dec. 13, 2016

(54) POSITIVE PHOTOSENSITIVE RESIN COMPOSITIONS

(75) Inventors: Ahmad A. Naiini, East Greenwich, RI (US); Il'ya Rushkin, Walpole, MA (US); William D. Weber, East Providence, RI (US); Donald W. Racicot, Providence, RI (US)

(73) Assignee: Fujifilm Electronic Materials U.S.A., Inc., North Kingstown, RI (US)

( * ) Notice: Subject to any disclaimer, the term of this patent is extended or adjusted under 35 U.S.C. 154(b) by 91 days.

(21) Appl. No.: 12/363,492

(22) Filed: Jan. 30, 2009

(65) Prior Publication Data
US 2009/0197067 A1 Aug. 6, 2009

Related U.S. Application Data

(60) Provisional application No. 61/026,075, filed on Feb. 4, 2008.

(51) Int. Cl.
| G03F 7/039 | (2006.01) |
| G03F 7/004 | (2006.01) |
| G03F 7/40  | (2006.01) |

(52) U.S. Cl.
CPC ........... G03F 7/0392 (2013.01); G03F 7/0045 (2013.01); G03F 7/40 (2013.01); *Y10T 428/265* (2015.01)

(58) Field of Classification Search
CPC .......... C03F 7/0392; G03F 7/0045; G03F 7/40
USPC ....................................................... 524/236
See application file for complete search history.

(56) References Cited

U.S. PATENT DOCUMENTS

| 4,371,685 A | 2/1983 | Ahne et al. |
| 4,395,482 A | 7/1983 | Ahne et al. |
| 4,622,285 A | 11/1986 | Ahne |
| 4,992,596 A | 2/1991 | Jeffries, III et al. |
| 5,096,999 A | 3/1992 | Hellmut et al. |
| 5,468,589 A | 11/1995 | Urano et al. |
| 5,485,250 A | 1/1996 | Kashimura et al. |
| 5,541,033 A | 7/1996 | Blakeney et al. |
| 5,554,664 A | 9/1996 | Lamanna et al. |
| 5,554,797 A | 9/1996 | Schulz et al. |
| 5,558,978 A | 9/1996 | Schädeli et al. |
| 5,612,170 A | 3/1997 | Takemura et al. |
| 5,879,856 A | 3/1999 | Thackeray et al. |
| 6,040,107 A | 3/2000 | Blakeney et al. |
| 6,133,412 A | 10/2000 | Malik et al. |
| 6,143,467 A | 11/2000 | Hsu et al. |
| 6,159,653 A * | 12/2000 | Malik ................... C08F 257/02 430/270.1 |
| 6,852,466 B2 | 2/2005 | Trefonas, III et al. |
| 7,132,205 B2 | 11/2006 | Rushkin et al. |
| 2003/0073040 A1* | 4/2003 | Iwasawa et al. ............... 430/312 |
| 2003/0157428 A1* | 8/2003 | Trefonas et al. ............ 430/270.1 |
| 2003/0186161 A1* | 10/2003 | Fujimori .................... 430/270.1 |
| 2004/0253542 A1* | 12/2004 | Rushkin et al. ............ 430/281.1 |
| 2006/0216641 A1* | 9/2006 | Naiini et al. ................ 430/270.1 |
| 2007/0072117 A1 | 3/2007 | Mizutani et al. |
| 2007/0099111 A1 | 5/2007 | Naiini et al. |
| 2007/0166643 A1 | 7/2007 | Sato et al. |
| 2007/0172761 A1* | 7/2007 | Takahashi et al. ......... 430/270.1 |
| 2007/0190454 A1 | 8/2007 | Lee et al. |
| 2008/0076849 A1 | 3/2008 | Sato et al. |

FOREIGN PATENT DOCUMENTS

| EP | 1679184 A1 | 7/2006 | |
| JP | H09-179303 | 7/1997 | ............. G03F 7/039 |
| JP | 2006-526812 | 11/2006 | ............. G03F 7/039 |
| JP | 2007-086606 | 4/2007 | ............. G03F 7/039 |
| JP | 2007-094317 | * 4/2007 | ............. G03F 7/039 |
| JP | 2007-178849 | 7/2007 | ............. G03F 7/039 |
| JP | 2007-219516 | 8/2007 | ............. G03F 7/004 |
| WO | WO 2005/000912 | 1/2005 | |
| WO | WO 2007/022124 | 2/2007 | ............... G03C 1/00 |

OTHER PUBLICATIONS

Machine translation of JP 2007-094317. Apr. 2007.*
International Search Report and the Written Opinion in PCT/US2009/032675, Apr. 6, 2009.
Office Action issued in corresponding Japanese Patent Application No. 2010-545213 dated Aug. 6, 2013 (8 pages).

* cited by examiner

*Primary Examiner* — John Uselding
(74) *Attorney, Agent, or Firm* — Fish & Richardson P.C.

(57) ABSTRACT

The present disclosure relates to compositions that include at least one polybenzoxazole precursor polymer, at least one photoacid generator, and at least one basic compound. Articles, films, and methods related to these compositions are also disclosed.

40 Claims, No Drawings

POSITIVE PHOTOSENSITIVE RESIN COMPOSITIONS

CROSS-REFERENCE TO RELATED APPLICATION

Pursuant to 35 U.S.C. §119(e), this application claims priority to U.S. Provisional Application Ser. No. 61/026,075, filed Feb. 4, 2008, the contents of which are hereby incorporated by reference.

FIELD OF THE DISCLOSURE

The present disclosure relates to positive photosensitive resin compositions suitable for use in microelectronic applications. More particularly, the present disclosure relates to a chemically amplified, positive working photosensitive polybenzoxazole (PBO) precursor composition and a process for preparing heat-resistant relief structures using the polybenzoxazole precursor photosensitive composition.

BACKGROUND OF THE DISCLOSURE

Polybenzoxazole (PBO) polymers are used as stress buffer coatings and as interlayer dielectric materials in the fabrication of microelectronic devices and packages. Stress buffer coatings are coatings applied as the top layer of microelectronic devices such as memory chips in order to mitigate stress related reliability problems in the function of packaged devices. As interlayer dielectric materials, PBO polymer layers function as dielectric coatings that provide electrical isolation between metallic conductors that are located in the same wiring plane, between wiring planes located above or below the PBO layer, or between metallic conductors passing through the PBO layer that are connected to metallic conductors positioned above or below the PBO layer.

For reasons of processing efficiency and high productivity in the manufacture of microelectronic devices, microelectronic lithography processes require reproducible performance from photoimageable materials. Photospeed, as measured by the energy dose needed for optimal processing, is one of the important lithography parameters requiring a high degree of reproducibility. Thus, the coating composition must have a high degree of batch-to-batch photospeed reproducibility.

BRIEF SUMMARY OF THE DISCLOSURE

In one aspect, the present disclosure relates to a positive tone photosensitive composition including:
(a) at least one polybenzoxazole precursor polymer;
(b) at least one photoacid generator (PAG); and
(c) at least one basic compound selected from the group consisting of
(1) tertiary amines of Structure XIV:

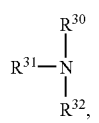

Structure XIV in which $R^{30}$, $R^{31}$, and $R^{32}$ are independently selected from the group consisting of a $C_1$-$C_{30}$ substituted or unsubstituted linear, branched, or cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ alkyl group containing at least one ether linkage;

(2) secondary amines of Structure XIV:

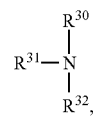

Structure XIV in which $R^{30}$ is a hydrogen atom; and $R^{31}$ and $R^{32}$ are independently selected from the group consisting of a $C_3$-$C_{30}$ substituted or unsubstituted linear, branched, or cyclic alkyl, a $C_3$-$C_{30}$ tertiary aminoalkyl, a $C_3$-$C_{30}$ substituted or unsubstituted linear, branched, or cyclic hydroxyalkyl, a $C_6$-$C_{30}$ substituted or unsubstituted aryl, and a $C_3$-$C_{30}$ alkyl group containing at least one ether linkage, provided that $R^{31}$ and $R^{32}$ have at least two substituents on the carbon directly bonded to the nitrogen;

(3) cyclic amines of Structure XVI:

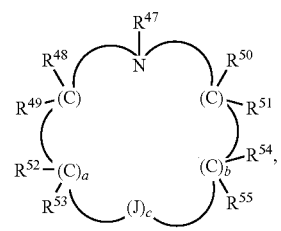

Structure XVI in which $R^{47}$ is a hydrogen atom, a $C_1$-$C_6$ substituted or unsubstituted linear, branched, or cyclic alkyl, or a $C_6$-$C_{10}$ substituted or unsubstituted aryl; $R^{48}$, $R^{49}$, $R^{50}$, $R^{51}$, $R^{52}$, $R^{53}$, $R^{54}$, and $R^{55}$ are, independently, a hydrogen atom, a $C_1$-$C_6$ substituted or unsubstituted linear, branched, or cyclic alkyl, or a $C_6$-$C_{10}$ substituted or unsubstituted aryl; J is an oxygen atom, a sulfur atom, or a $NR^{56}$ group in which $R^{56}$ is a hydrogen atom, a $C_1$-$C_6$ substituted or unsubstituted linear, branched, or cyclic alkyl, or a $C_6$-$C_{10}$ substituted or unsubstituted aryl; a and b are independently 1, 2, or 3; and c is 0 or 1;

(4) cyclic amines of Structure XVII:

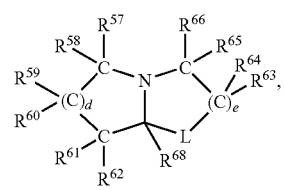

Structure XVII in which L is an oxygen atom, a sulfur atom, $NR^{67}$, or $CR^{69}R^{70}$ where $R^{67}$ is a hydrogen atom, a $C_1$-$C_6$ substituted or unsubstituted linear, branched, or cyclic alkyl, a $C_6$-$C_{10}$ substituted or unsubstituted aryl, or together with $R^{68}$ forms a second bond between L and the carbon to which it is attached; $R^{69}$ and $R^{70}$ are independently a hydrogen atom, a $C_1$-$C_6$ substituted or unsubstituted linear, branched, or cyclic alkyl, or a $C_6$-$C_{10}$ substituted or unsubstituted aryl; $R^{57}$-$R^{66}$ are independently a hydrogen atom, a $C_1$-$C_6$ substituted or unsubstituted linear, branched, or cyclic alkyl, or a $C_6$-$C_{10}$ substituted or unsubstituted aryl; $R^{68}$ is a hydrogen atom or together with $R^{67}$ forms a second bond between L and the carbon to which $R^{68}$ is attached; d is 1, 2, or 3; and e is 1, 2, or 3;

(5) tertiary alicyclic amines; and
(6) quaternary ammonium hydroxides, in which the composition is a chemically amplified composition; provided that when the basic compound is a tertiary amine of Structure XIV, the number of carbon atoms in the basic compound is at least 6 and not all of $R^{30}$, $R^{31}$, and $R^{32}$ are a $C_6$-$C_{30}$ substituted or unsubstituted aryl. The term "chemically amplified composition" mentioned herein generally refers to a composition that, upon irradiation with a suitable actinic ray, produces a suitable amount of an acid that catalyzes a deprotection reaction of the photosensitive polymer contained therein so that the solubility of the composition in an aqueous base is modified (e.g., increased).

In the context of this disclosure, a group (e.g., alkyl) defined by a certain carbon number range (e.g., $C_1$-$C_{30}$) mentioned herein includes all of the species having a carbon number within that range. For example, a $C_1$-$C_6$ substituted or unsubstituted linear, branched, or cyclic alkyl includes all of the substituted or unsubstituted linear, branched, cyclic alkyl groups having one, two, three, four, five, or six carbon atoms.

In another aspect, the present disclosure relates to a film including or derived from an above-described composition.

In another aspect, the present disclosure relates to an article that includes a substrate and an above-described film supported by the substrate.

In still another aspect, the present disclosure relates to a method that includes treating an above-described composition on a substrate to form a relief pattern on the substrate and an article prepared by this method.

Embodiments can include one or more of the following features.

In some embodiments, the polybenzoxazole precursor polymer has Structure I, II, or II*:

1000, y is an integer from 0 to about 500, provided that $(x+y)\le 1000$; B is an acid sensitive group $R^1$ or a moiety E-O—$R^2$ containing an acid sensitive group $R^2$; E is a divalent aromatic, aliphatic or heterocyclic group which is not acid labile and makes an -E-OH moiety an aqueous base solubilizing group, $k^3$ is a fractional number between 0.1 and 2, $k^4$ is a fractional number between 0 and 1.9 provided that $(k^3+k^4)=2$; G is a substituted or unsubstituted monovalent organic group having a carbonyl, carbonyloxy or sulfonyl group attached directly to the terminal NH of the polymer, and G* is a substituted or unsubstituted divalent organic group having at least one carbonyl or sulfonyl group attached directly to the terminal N of the polymer.

In some embodiments, the composition further includes a tertiary amine of Structure XIV, in which $R^{30}$, $R^{31}$, and $R^{32}$ are $C_6$-$C_{30}$ substituted or unsubstituted aryl (e.g., phenyl).

In some embodiments, the composition further includes an adhesion promoter. The adhesion promoter can include a compound selected from the group consisting of vinylalkoxysilanes, methacryloxyalkoxysilanes, mercaptoalkoxysilanes, epoxyalkoxysilanes and glycidoxyalkoxysilanes.

In some embodiments, the composition further includes a solvent.

In some embodiments, the uncured film has a thickness of at least about 4 μm. In a preferred embodiment the uncured film thickness is at least about 6 μm. In a more preferred embodiment the uncured film thickness is at least about 8 μm.

In some embodiments, the substrate includes a wafer, such as a silicon wafer, a ceramic wafer, a gallium arsenide wafer, an indium phosphide wafer, a glass wafer, a metal wafer, or a plastic wafer. In some embodiments, the wafer is a metal coated wafer.

In some embodiments, the method further includes applying the composition to the substrate prior to treating the composition.

In some embodiments, treating the composition includes baking the composition to form a baked composition. In such embodiments, treating the composition can further include exposing the baked composition to actinic radiation to form an exposed composition, developing the exposed

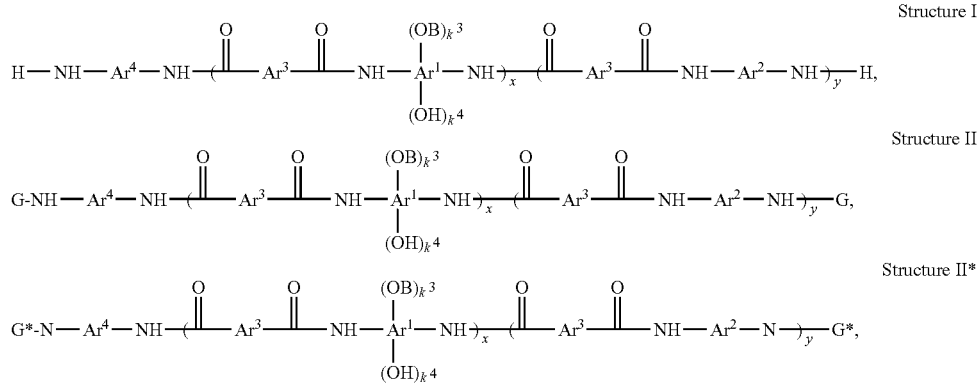

Structure I

Structure II

Structure II* in which $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar^1$ $(OB)_k^3(OH)_k^4$ or $Ar^2$; x is an integer from about 4 to about composition with an aqueous developer, thereby forming an uncured relief image on the substrate, and curing the relief image.

Optionally, the photosensitive composition may contain other additives, which may include, but are not limited to, photosensitizers, surfactants, dyes, adhesion promoters, and leveling agents.

The present disclosure also relates to the process for preparing heat-resistant relief structures from the aforementioned positive working photosensitive composition and the articles of manufacture obtained by the combination of the composition and the method of use according to the disclosure.

The heat resistant positive working photosensitive composition can be coated on a substrate to create a film, which can then be subjected to patterning through a photolithographic process. After photolithographic processing, the patterned film can be converted to a heat resistant polybenzoxazole relief image by application of additional heat. The photosensitive resin compositions can be used as stress buffer coatings, alpha particle barrier films, interlayer dielectrics, and patterned engineering plastic layers in the manufacturing of microelectronic devices.

The details of one or more embodiments are set forth in the description below. Other features, objects, and advantages of the embodiments will be apparent from the description and from the claims.

DETAILED DESCRIPTION OF THE DISCLOSURE

The inventors discovered that photoimageable coating compositions that use photochemically generated acids to effect the operation of the imaging chemistry can be susceptible to unacceptable variation in batch-to-batch photospeed due to the presence of small amount of basic impurities that neutralize a portion of the photochemically generated acid before the acid can initiate the imaging chemistry process. This disclosure describes a strategy for removing this variation by formulating the coating composition in a manner that achieves a constant amount of total base in the composition. Specifically, this disclosure describes a positive working photosensitive composition (e.g., a chemically amplified positive working photosensitive composition) containing small amounts of certain basic compounds and PBO precursors blocked with different moieties. The presence of the basic compound surprisingly slows down the photospeed of these compositions, thereby resulting in compositions with high batch-to-batch photospeed reproducibility. The inventors also surprisingly discovered that presence of a small amount of base in positive working photosensitive PBO compositions can greatly improve shelf life of these compositions, and remove chemical undercut of a film made by these compositions (e.g., in the presence of a certain adhesion promoter such as an epoxy adhesion promoter). The term "chemical undercut" mentioned herein generally refers to loss of a portion of the bottom of a film (e.g., a portion along the interface between the film and a substrate) during a lithographic process.

In some embodiments, the present disclosure relates to a positive tone photosensitive composition containing:
(a) at least one polybenzoxazole precursor polymer having Structure I or II or II*

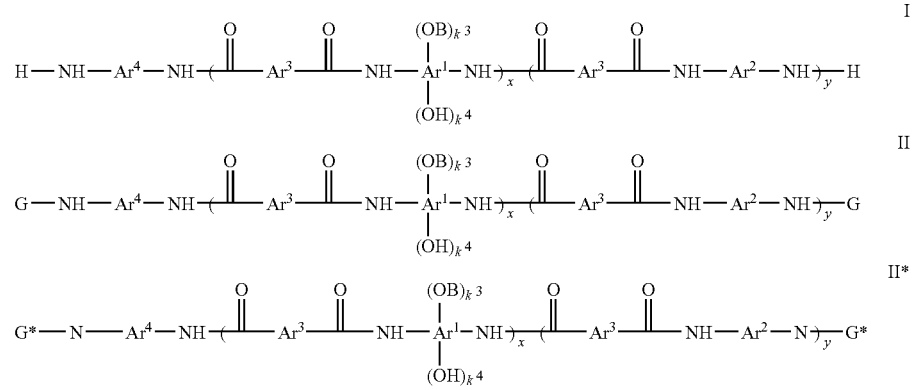

in which $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon, or mixtures thereof; $Ar^3$ is a divalent aromatic group, a divalent aliphatic group, a divalent heterocyclic group, or mixtures thereof; $Ar^4$ is $Ar^1(OB)_{k^3}(OH)_{k^4}$ or $Ar^2$; x is an integer from about 4 to about 1000, y is an integer from 0 to about 500, provided that $(x+y) \leq 1000$; B is an acid sensitive group $R^1$ or a moiety $E-O-R^2$ containing an acid sensitive group $R^2$; E is any suitable divalent aromatic, aliphatic or heterocyclic group which is not acid labile and makes an -E-OH moiety an aqueous base solubilizing group, $k^3$ is a fractional number between 0.1 and 2, $k^4$ is a fractional number between 0 and 1.9 provided that $(k^3+k^4)=2$; G is a substituted or unsubstituted monovalent organic group having a carbonyl, carbonyloxy or sulfonyl group attached directly to the terminal NH of the polymer and G* is a substituted or unsubstituted divalent organic group having at least one carbonyl or sulfonyl group attached directly to the terminal N of the polymer;
(b) at least one photoacid generator which releases acid upon irradiation (PAG); and
(c) at least one basic compound selected from the group consisting of
(1) tertiary amines of Structure XIV:

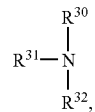

in which $R^{30}$, $R^{31}$, and $R^{32}$ are independently selected from the group consisting of a $C_1$-$C_{30}$ substituted or unsubstituted linear, branched, or cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ alkyl group containing at least one ether linkage;

(2) secondary amines of Structure XIV:

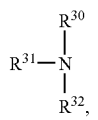

Structure XIV in which $R^{30}$ is a hydrogen atom; and $R^{31}$ and $R^{32}$ are independently selected from the group consisting of a $C_3$-$C_{30}$ substituted or unsubstituted linear, branched, or cyclic alkyl, a $C_3$-$C_{30}$ tertiary aminoalkyl, a $C_3$-$C_{30}$ substituted or unsubstituted linear, branched, or cyclic hydroxyalkyl, a $C_6$-$C_{30}$ substituted or unsubstituted aryl, and a $C_3$-$C_{30}$ alkyl group containing at least one ether linkage, provided that $R^{31}$ and $R^{32}$ have at least two substituents on the carbon directly bonded to the nitrogen;

(3) cyclic amines of Structure XVI:

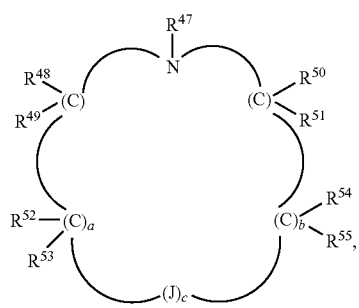

Structure XVI in which $R^{47}$ is a hydrogen atom, a $C_1$-$C_6$ substituted or unsubstituted linear, branched, or cyclic alkyl, or a $C_6$-$C_{10}$ substituted or unsubstituted aryl; $R^{48}$, $R^{49}$, $R^{50}$, $R^{51}$, $R^{52}$, $R^{53}$, $R^{54}$, and $R^{55}$ are, independently, a hydrogen atom, a $C_1$-$C_6$ substituted or unsubstituted linear, branched, or cyclic alkyl, or a $C_6$-$C_{10}$ substituted or unsubstituted aryl; J is an oxygen atom, a sulfur atom, or a $NR^{56}$ group in which $R^{56}$ is a hydrogen atom, a $C_1$-$C_6$ substituted or unsubstituted linear, branched, or cyclic alkyl, or a $C_6$-$C_{10}$ substituted or unsubstituted aryl; a and b are independently 1, 2, or 3; and c is 0 or 1;

(4) cyclic amines of Structure XVII:

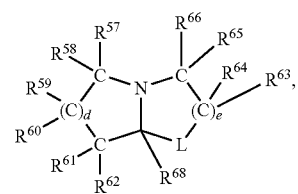

Structure XVII in which L is an oxygen atom, a sulfur atom, $NR^{67}$, or $CR^{69}R^{70}$ where $R^{67}$ is a hydrogen atom, a $C_1$-$C_6$ substituted or unsubstituted linear, branched, or cyclic alkyl, a $C_6$-$C_{10}$ substituted or unsubstituted aryl, or together with $R^{68}$ forms a second bond between L and the carbon to which it is attached; $R^{69}$ and $R^{70}$ are independently a hydrogen atom, a $C_1$-$C_6$ substituted or unsubstituted linear, branched, or cyclic alkyl, or a $C_6$-$C_{10}$ substituted or unsubstituted aryl; $R^{57}$-$R^{66}$ are independently a hydrogen atom, a $C_1$-$C_6$ substituted or unsubstituted linear, branched, or cyclic alkyl, or a $C_6$-$C_{10}$ substituted or unsubstituted aryl; $R^{68}$ is a hydrogen atom or together with $R^{67}$ forms a second bond between L and the carbon to which $R^{68}$ is attached; d is 1, 2, or 3; and e is 1, 2, or 3;

(5) tertiary alicyclic amines; and (6) quaternary ammonium hydroxides, provided that when the basic compound is a tertiary amine of Structure XIV, the number of carbon atoms in the basic compound is at least 6 and not all of $R^{30}$, $R^{31}$, and $R^{32}$ are a $C_6$-$C_{30}$ unsubstituted aryl.

Optionally, the photosensitive composition may also contain other additives, which may include, but are not limited to, photosensitizers, surfactants, dyes, adhesion promoters, and leveling agents and a solvent.

The PBO precursor polymers are synthesized employing a multi-step synthetic process. The first step in preparation of the PBO precursor polymers of Structure I, II or II* bearing acid labile functional groups is to produce the PBO precursor base polymer of Structure III:

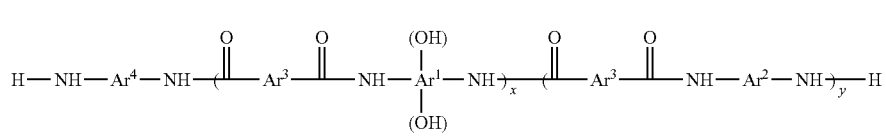

III in which $Ar^1$, $Ar^2$, and $Ar^3$ are as defined previously and $Ar^4$ is $Ar^1(OH)_2$ or $Ar^2$.

The polymers of Structure III can be prepared from the reaction of monomers having structure VI with one or more monomers of structure IV and optional amount of monomers having structure V in the presence of a base.

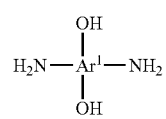

IV

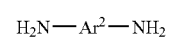

V

VI $Ar^1$, $Ar^2$, $Ar^3$ are as previously defined, and W is selected from the group consisting of a carboxylic acid group, a carboxylic acid ester group, an acid halide group and an acid anhydride group.

In Structures I, II, II*, III and IV, $Ar^1$ is a tetravalent aromatic group or a tetravalent heterocyclic group, or mixtures thereof. Examples of $Ar^1$ include, but are not limited to:

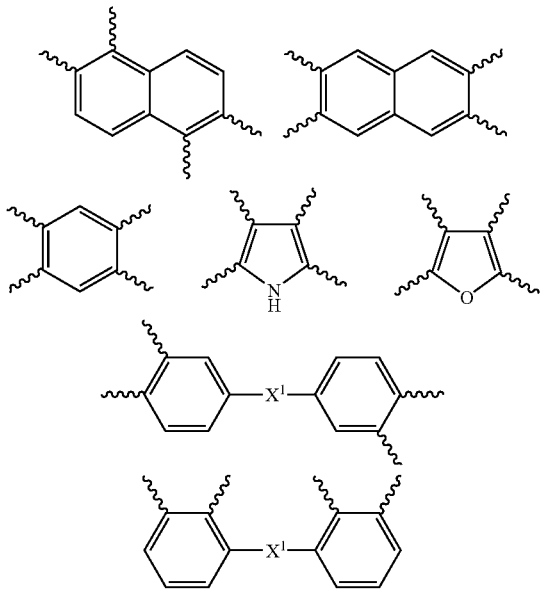

in which $X^1$ is —O—, —S—, —C(CF$_3$)$_2$—, —CH$_2$—, —SO$_2$—, —NHCO— or —SiR$^{13}_2$— and each $R^{13}$ is independently a $C_1$-$C_7$ linear or branched alkyl, a $C_5$-$C_8$ cycloalkyl group or a substituted or unsubstituted $C_6$-$C_{20}$ aryl group Examples of $R^{13}$ include, but are not limited to, —CH$_3$, —C$_2$H$_5$, n-C$_3$H$_7$, i-C$_3$H$_7$, n-C$_4$H$_9$, t-C$_4$H$_9$, cyclohexyl, phenyl, methylphenyl, and naphthyl. A mixture of monomers of Structure IV with the same or different $Ar^1$ groups may be employed.

Examples of monomers having Structure IV containing $Ar^1$ include, but are not limited to, 2,2-bis(3-amino-4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl) propane. The substitution pattern of the two hydroxy and two amino groups in the monomer of Structure IV may be any of the possible substitution patterns with the proviso that the each amino group has an ortho relationship with a hydroxyl group in order to be able to form the benzoxazole ring. Furthermore, the polybenzoxazole precursor base polymer of Structure I may be synthesized using a mixture of two or more monomers described by generic Structure IV.

In Structures I, II, and II* (and III and V), $Ar^2$ is a divalent aromatic, a divalent heterocyclic, a divalent alicyclic, or a divalent aliphatic group that may contain silicon. Examples of $Ar^2$ include, but are not limited to,

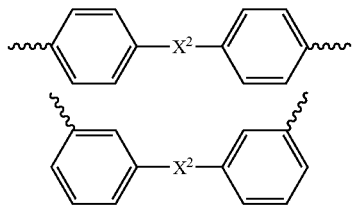

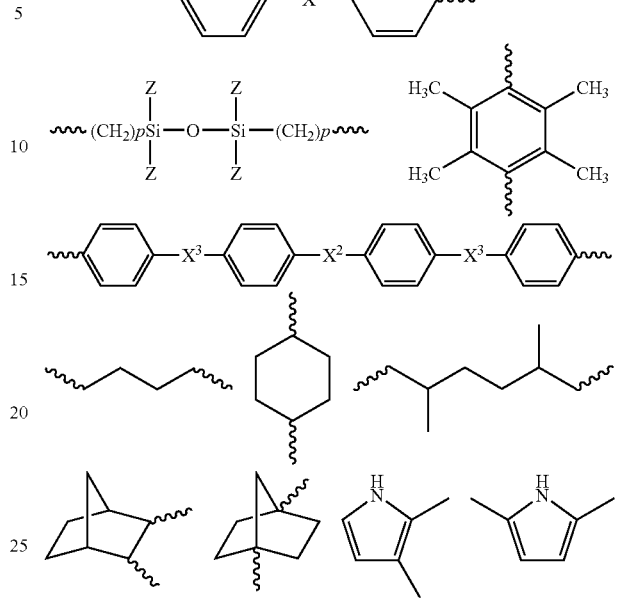

in which $X^2$ is —O—, —S—, —C(CF$_3$)$_2$—, —C(CH$_3$)$_2$—, —CH$_2$—, —SO$_2$—, —NHCO— or —SiR$^{14}_2$— and each $R^{14}$ is independently a $C_1$-$C_7$ linear or branched alkyl or a $C_5$-$C_8$ cycloalkyl group or a substituted or unsubstituted $C_6$-$C_{20}$ aryl group, $X^3$ is —O—, —S—, —C(CF$_3$)$_2$—, —C(CH$_3$)$_2$—, —CH$_2$—, —SO$_2$—, or —NHCO—, Z is hydrogen atom, a $C_1$-$C_8$ linear, branched or cyclic alkyl, or a $C_6$-$C_{10}$ aryl group and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl, phenyl, naphthyl, methylphenyl and cyclooctyl. Examples of $R^{14}$ include, but are not limited to, —CH$_3$, —C$_2$H$_5$, n-C$_3$H$_7$, i-C$_3$H$_7$, n-C$_4$H$_9$, t-C$_4$H$_9$, cyclohexyl, phenyl, methylphenyl, and naphthyl.

Examples of monomers having the Structure V containing $Ar^2$ include, but are not limited to, 5(6)-diamino-1-(4-aminophenyl)-1,3,3-trimethylindane, m-phenylenediamine, p-phenylenediamine, 2,2'-bis(trifluoromethyl)-4,4'-diamino-1,1'-biphenyl, 3,4'-diaminodiphenyl ether, 3,3'-diaminodiphenyl ether, 4,4'-diaminodiphenyl ether, 2,4-toluenediamine, 3,3'-diaminodiphenyl sulfone, 3,4'-diaminodiphenyl sulfone, 4,4'-diaminodiphenyl sulfone, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-amino-phenoxy)benzene, 1,4-bis (gamma-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1, 10-dimethyldecane, 2,11-diaminidodecane, 1,12- diaminooctadecane, 2,17-diaminoeicosane, 3,3'-dimethyl-4,4'-diaminodiphenylmethane, bis(4-aminocyclohexyl)methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline) 3,3'sulfonyl-dianiline, 3,3'sulfonyl-dianiline. Furthermore, the polybenzoxazole precursor base polymer of Structure I may be synthesized using a mixture of two or more monomers described by generic Structure V.

In Structures I, II, and II* (and III and VI), $Ar^3$ is a divalent aromatic, a divalent aliphatic, or a divalent heterocyclic group. Examples of $Ar^3$ include, but are not limited to:

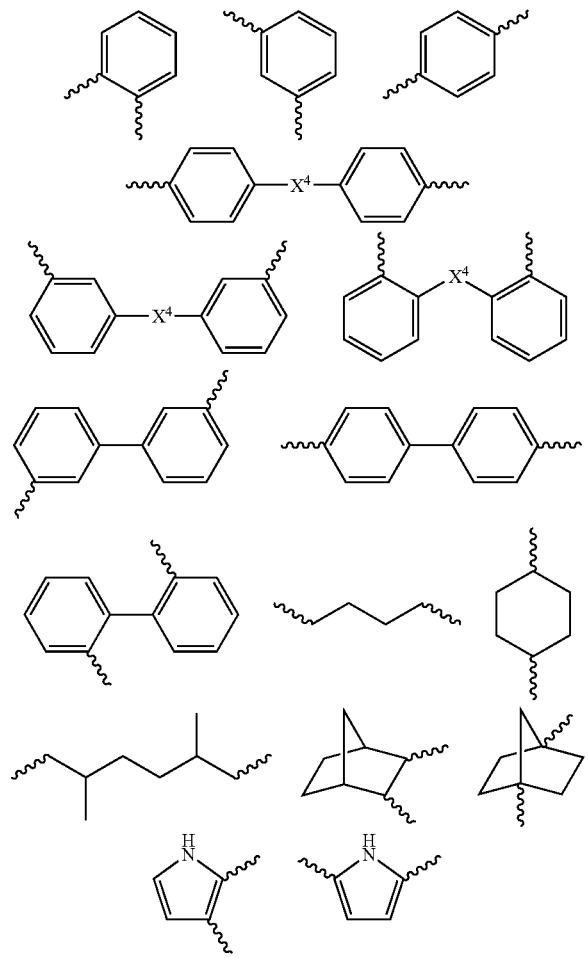

in which $X^4$ is —O—, —S—, —C(CF$_3$)$_2$—, —C(CH$_3$)$_2$—, —CH$_2$—, —SO$_2$—, or —NHCO—.

In Structure VI, W is typically C(O)Cl, COOH, C(O)OR$^{20}$, C(O)O(O)CR$^{20}$ or C(O)OSO2R$^{20}$ in which R$^{20}$ is a $C_1$-$C_7$ linear or branched alkyl group, a $C_5$-$C_8$ cycloalkyl group or a phenyl group optionally substituted with one or more $C_1$-$C_4$ alkyl, $C_1$-$C_4$ alkoxy, or halo groups. Examples of R$^{20}$ include, but are not limited to, —CH$_3$, —C$_2$H$_5$, n-C$_3$H$_7$, i-C$_3$H$_7$, n-C$_4$H$_9$, t-C$_4$H$_9$, phenyl, toluyl, dimethylphenyl, chlorophenyl, fluorophenyl, and cyclohexyl.

Monomers having the Structure VI are diacids, diacid dichlorides, diacid anhydrides and diesters. Examples of suitable dicarboxylic acids (W=COOH) include, but are not limited to, 4,4'-diphenyletherdicarboxylic acid, terephthalic acid, isophthalic acid, succinic acid and mixtures thereof. Examples of suitable diacid chlorides (W=COCl) include, but are not limited to, isophthaloyl dichloride, phthaloyl dichloride, terephthaloyl dichloride, 1,4-oxydibenzoyl chloride, adipoyl chloride, 1,4-cyclohexyldicarbonyl dichloride and mixtures thereof. Examples of suitable diacid dianhydrides include but not limited to isophthalic-acetic dianhydride, terphthalic-triflic dianhydride, isophthalic-methanesulfonic dianhydride, 1,4-oxydibenzoic-p-toluenesulfonic acid dianhydride and terphthalic-acetic dianhydride. Examples of suitable dicarboxylic esters (W=C(O)OR$^{20}$) include, but are not limited to, dimethyl isophthalate, dimethyl phthalate, dimethyl terephthalate, diethyl isophthalate, diethyl phthalate, diethyl terephthalate, diethyl succinate, dimethyl adipate and mixtures thereof.

Any conventional method for reacting a dicarboxylic acid or its dichloride, diester or dianhydride with at least one aromatic and/or heterocyclic dihydroxydiamine, and optionally, with at least one diamine, may be used. Generally, the reaction for diacid dichlorides (W=C(O)Cl) is carried out at about −10° C. to about 30° C. for about 6 to about 48 hours in the presence of an approximately stoichiometric amount of amine base. Examples of suitable amine bases include, but are not limited to, pyridine, triethylamine, 1,8-diazabicyclo[5.4.0]undec-7-ene (DBU), 1,5-diazabicyclo[4.3.0]non-5-ene (DBN), dimethylpyridine, and dimethylaniline. The polybenzoxazole precursor base polymer of Structure III may be isolated by precipitation into water, recovered by filtration and dried. Dianhydride synthesis may be carried out under similar conditions. Descriptions of suitable syntheses employing diesters or diacids may be found in U.S. Pat. No. 4,395,482, U.S. Pat. No. 4,622,285, and U.S. Pat. No. 5,096,999, herein incorporated by reference.

The preferred reaction solvents are N-methyl-2-pyrrolidone (NMP), N-ethyl-2-pyrrolidone (NEP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having Structure IV, V, and VI are employed such that the ratio of [IV+V]/VI is generally from about 1 to about 1.2. Preferably, the ratio of [IV+V]/VI is generally from about 1 to about 1.1. The monomer having the Structure IV is employed from about 50 to about 100 mole % of [IV+V] and the monomer having Structure V is employed from about 0 to about 50 mole % of [IV+V]. Distribution of the polymeric units resulting from monomers having the Structures IV and V in the polybenzoxazole precursor base polymer of Structure I may be random or in blocks.

In Structures I, II, II* and III, x is an integer from about 4 to about 1000, y is an integer from about 0 to about 500 and (x+y) is less than about 1000. A preferred range for x is from about 6 to about 300 and a preferred range for y is from about 0 to about 50. A more preferred range for x is from about 10 to about 100 and a more preferred range for y is from about 0 to about 10. The most preferred range for x is from about 10 to about 50 and a most preferred range for y is from about 0 to about 5.

Those skilled in the art understand that the amount of y is always less than x in order for the polymers of Structure II, VII, and VII* (vide infra) to be aqueous base soluble. A preferred range for the ratio of y/x is from 0 to 50/100. A more preferred range for the ratio of y/x is from 0 to 25/100. A most preferred range for the ratio of y/x is from 0 to 10/100.

For the purposes of this disclosure, aqueous base solubility is defined to mean the ability of a film to dissolve at a rate of at least 2 microns per minute in an aqueous base developer (vide infra) having a pH within the range of from about 9 to about 12.

The amount of (x+y) (also referred to as the degree of polymerization) can be calculated by dividing the numeric average molecular weight (Mn) of a polymer of Structure I by the average molecular weight of the repeat unit. The value of Mn can be determined by such standard methods as membrane osmometry or gel permeation chromatography as described, for example, in Jan Rabek, Experimental Methods in Polymer Chemistry, John Wiley & Sons, New York, 1983.

It should be noted that molecular weight and inherent viscosity of the polymers and therefore, x and y at a constant stoichiometry, can have a wide range depending on the reaction conditions chosen and considerations such as the purity of the solvent, the humidity, presence or absence of a blanket of nitrogen or argon gas, reaction temperature, reaction time, and other variables.

In the second synthesis step for preparation of II and II*, a PBO precursor base polymer having Structure III is reacted with G-M to produce a PBO precursor polymer of Structure VII (or Structure VII*).

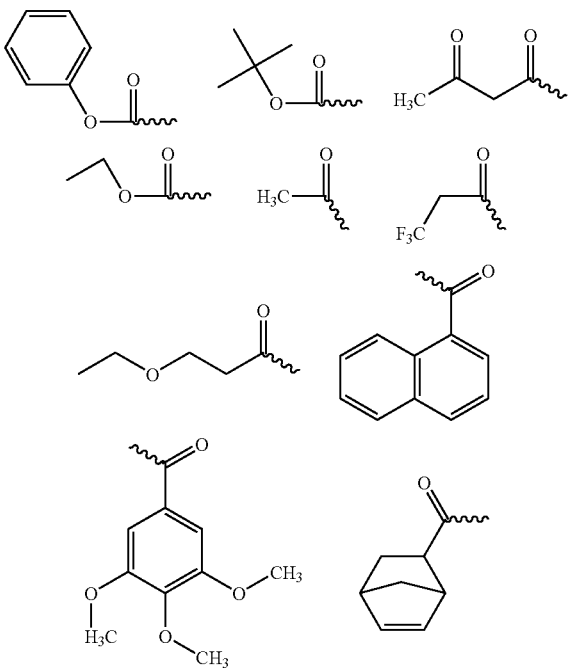

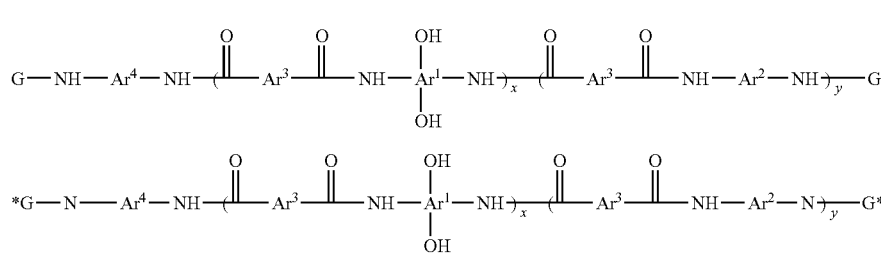

in which $Ar^1$, $Ar^2$, and $Ar^3$ are as defined previously and $Ar^4$ is $Ar^1(OH)_2$ or $Ar^2$; G is a monovalent organic group having a carbonyl, carbonyloxy or sulfonyl group attached directly to the terminal NH of the polymer, which may be further substituted by other functional groups such as vinyl, carbonyl, ether ester, or carboxylic acids, G* is a substituted or unsubstituted divalent organic group having at least one carbonyl or sulfonyl group attached directly to the terminal N of the polymer; and M is a reactive leaving group.

Examples of G include, but are not limited to, the following structures:

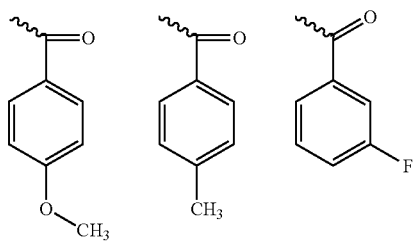

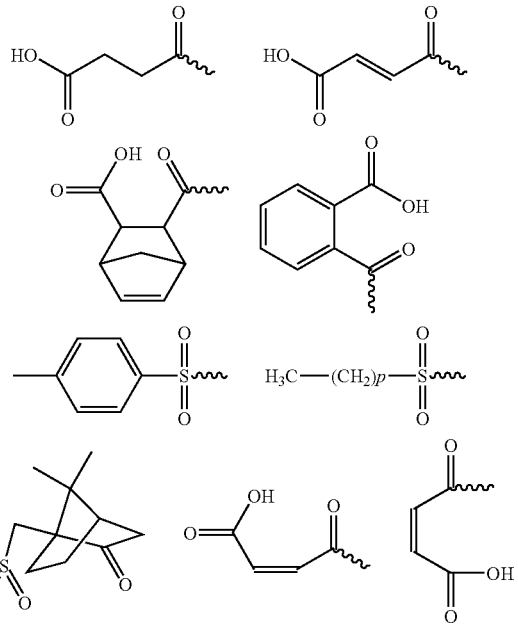

-continued

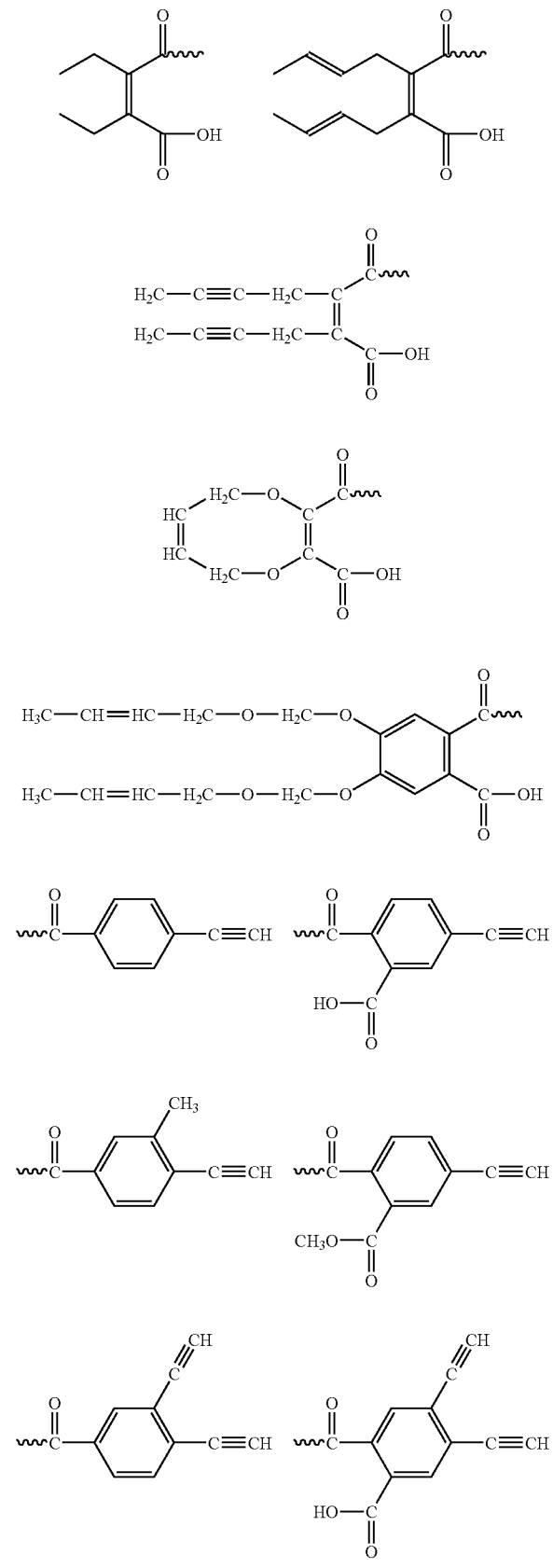

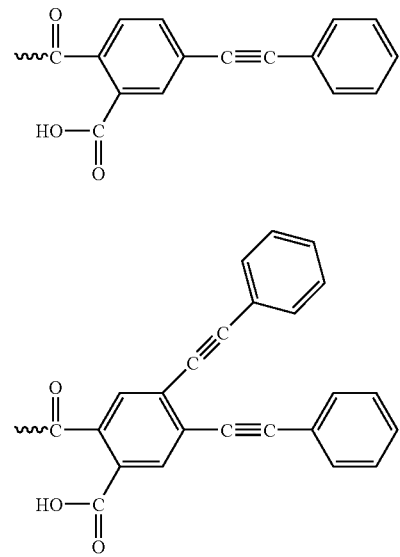

Examples of M groups include, but are not limited to Cl, Br, mesylate, triflate, substituted carbonyloxy groups, and substituted carbonate groups.

Examples of suitable classes of G-M compounds include but are not limited to, carboxylic and sulfonic acid chlorides, carbon and sulfonic acid bromides, linear and cyclic carbon and sulfonic acid anhydrides, and alkoxy or aryloxy substituted acid chlorides. Examples of suitable G-M compounds include maleic anhydride, succinic anhydride, acetic anhydride, propionic anhydride, norbornene anhydride, phthalic anhydride, camphor sulfonic acid anhydride, trifluoromethane sulfonic acid anhydride, methanesulfonic acid anhydride, p-toluenesulfonic acid anhydride, ethanesulfonic acid anhydride, butanesulfonic acid anhydride, perfluorobutanesulfonic acid anhydride, acetyl chloride, methanesulfonyl chloride, trifluoromethanesulfonyl chloride, benzoyl chloride, norbornene carboxylic acid chloride, di-t-butyl dicarbonate, dimethyl dicarbonate, diethyldicarbonate, dibutyldicarbonate, t-butyl chloroformate, ethyl chloroformate, n-butyl chloroformate, and methyl chloroformate. Further examples include compounds having the structures shown below.

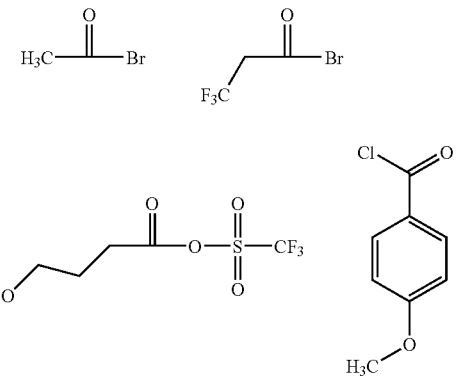

-continued

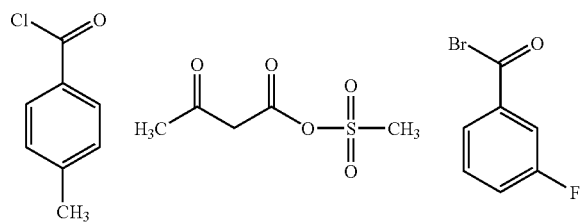
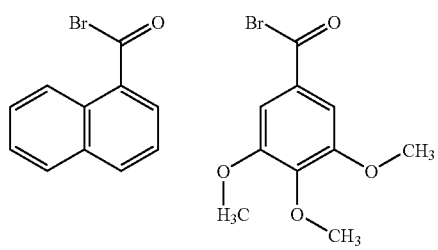
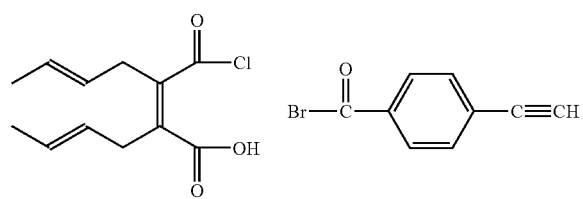
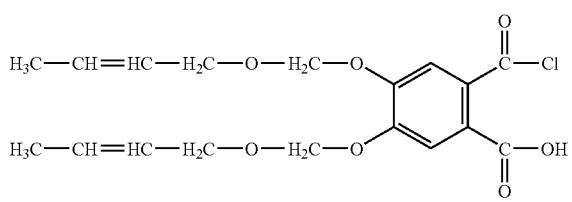
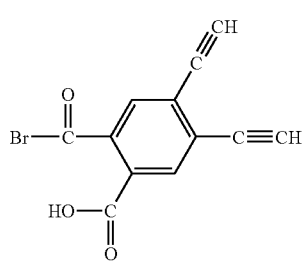

-continued

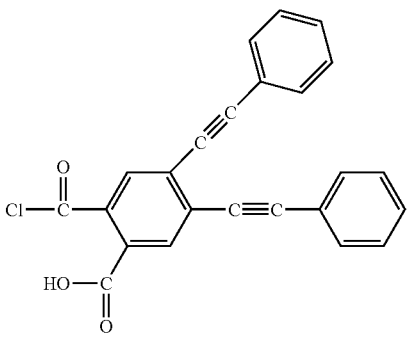 [SMILES: O=C(O)c1cc(C#Cc2ccccc2)c(C#Cc2ccccc2)cc1C(=O)Cl]

The reaction can be carried out in a suitable solvent by addition of G-M to a dry solution of the polybenzoxazole precursor base polymer of Structure I at a temperature from about −25° C. to about 70° C. The more preferred temperature is from about 0° C. to about 60° C. The most preferred temperature is from about 5° C. to about 55° C. The reaction time is from about 1 hour to about 24 hours. The molar amount of G-M employed is a slightly excess (3-6%) of the sum of the molar amounts of the monomer of Structures IV and V less the molar amount of monomer of Structure VI. Addition of organic or inorganic base may also be employed. Examples of suitable organic amine bases include, but are not limited to, pyridine, triethylamine, 1,8-diazabicyclo[5.4.0]undec-7-ene (DBU), 1,5-diazabicyclo[4.3.0]non-5-ene (DBN), dimethylpyridine, and dimethylaniline. Examples of other suitable bases include sodium hydroxide, sodium carbonate, and sodium silicate.

The preferred reaction solvents are propylene glycol methyl ether acetate (PGMEA), N-methyl-2-pyrrolidone (NMP), N-ethyl-2-pyrrolidone (NEP), gamma-butyrolactone (GBL), N,N-dimethylformamide (DMF), N,N-dimethylacetamide (DMAc), dimethyl-2-piperidone, dimethylsulfoxide (DMSO), tetrahydrofuran (THF), acetone, sulfolane, and diglyme. The most preferred solvents are diglyme and PGMEA.

In some cases, the endcapping reaction with certain endcapping reagents, such as cyclic anhydrides, may not stop after the endcapping reaction. A subsequent dehydration step may also occur to form a divalent endcap (G* in Structures II* and VII*).

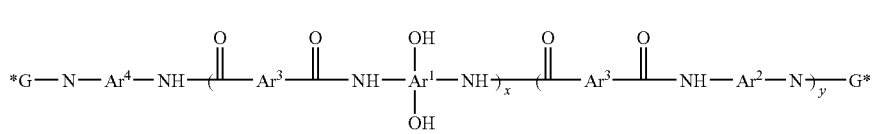

VII* in which Ar¹, Ar², and Ar³ are as defined previously and Ar⁴ is Ar¹(OH)₂ or Ar². A typical reaction between an amine end group and a cyclic anhydride endcapping reagent is shown below.

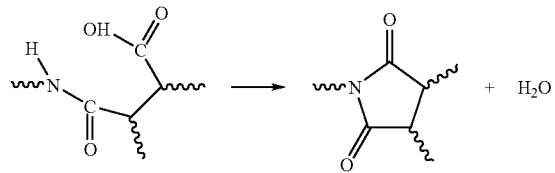

Examples of cyclic anhydrides which may undergo this additional reaction include, but are not limited to, maleic anhydride, succinic anhydride, norbornane anhydride, norbornene anhydride, itaconic anhydride, camphor anhydride, and the compounds shown below.

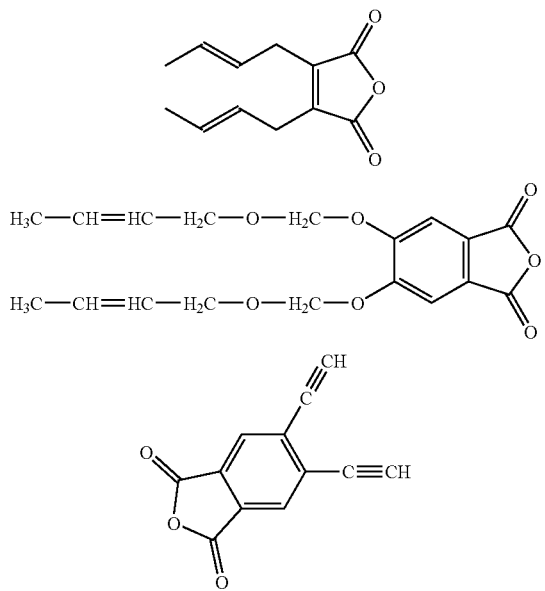

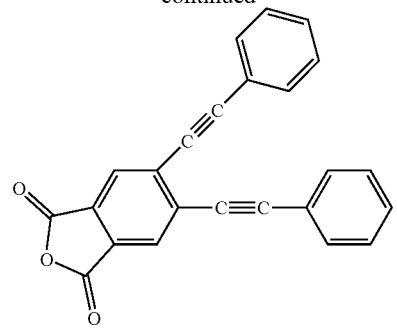

In the final synthesis step for I, II and II*, some of the hydroxyl groups in the PBO precursor polymers of Structures III, VII, and VII* are reacted to yield the acid sensitive PBO precursor polymers of Structures I, II and II*.

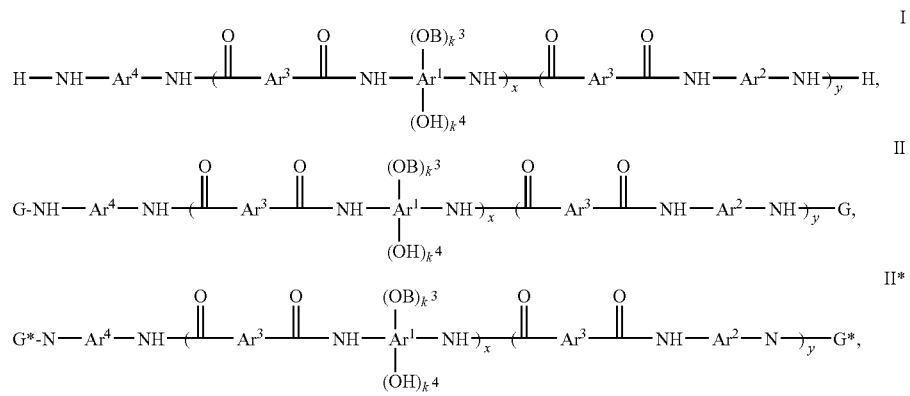

in which Ar¹, Ar², Ar³, x, y, k³, k⁴, G and G* are as defined as above; Ar⁴ is Ar¹(OB)$_k^3$(OH)$_k^4$ or Ar², B is an acid sensitive group R¹ or a moiety E-O—R² containing an acid sensitive group R².

As used herein, the term "acid sensitive group" refers to a group that is capable of reacting with an acid (e.g., to form an aqueous base solubilizing group) under a suitable condition (e.g., during heating in a lithographic process). Examples of suitable R¹ groups include, but are not limited to,

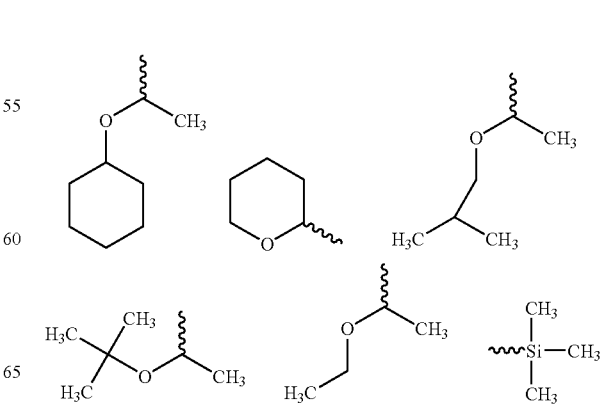

-continued

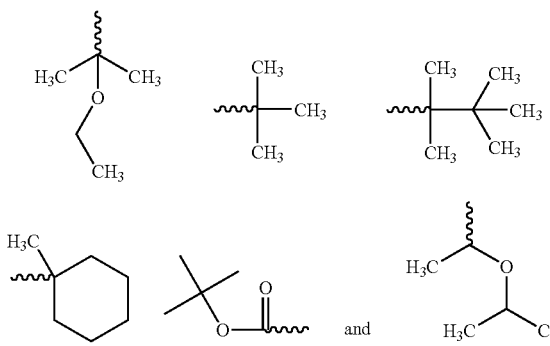

$R^1$ in combination with the O atom attached to the $Ar^1$ group forms groups such as acetal groups, ketal groups, ether groups, carbonate groups and silyl ethers groups. Mixtures of $R^1$ groups may be employed. PBO precursor polymers having a mixture of $R^1$ groups, $R^2$ groups, or $R^1$ and $EOR^2$ groups may be employed. The ratios of different $R^1$ groups, $R^2$ groups, or $R^1$ and $EOR^2$ groups may range from 9:1 to 1:9. Preferably, the ratios of different $R^1$ groups, $R^2$ groups, or $R^1$ and $EOR^2$ groups range from 8:2 to 2:8. More preferably, the ratios of different $R^1$ groups, $R^2$ groups, or $R^1$ and $EOR^2$ groups range from 7:3 to 3:7. Most preferably, the ratios of different $R^1$ groups, $R^2$ groups, or $R^1$ and $EOR^2$ groups range from 6:6 to 4:6.

Preferred $R^1$ groups are those groups which in combination with the O atom attached to $Ar^1$ form acetal groups. More preferred $R^1$ groups include, but are not limited to:

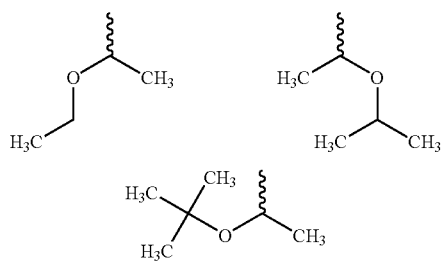

In E-O—$R^2$, E is any suitable divalent aromatic, aliphatic or heterocyclic group which is not acid labile (i.e., chemically inert to an acid) and makes an -E-OH moiety that is an aqueous base solubilizing moiety (i.e., a moiety that enables a compound having the moiety to be soluble in an aqueous base, e.g., an aqueous base commonly used in a lithographic process). $R^2$ is any acid labile group. Those skilled in the art will understand that after removal of $R^2$, the resultant -E-OH moiety should be aqueous base solubilizing in aqueous base. The preferred -E-OH are phenols or aromatic or aliphatic carboxylic acids. Examples of the E group include, but are not limited to, the following structures

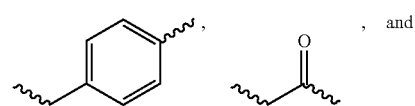

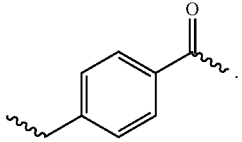

Specific examples of E-O—$R^2$ include but are not limited to, the following structures:

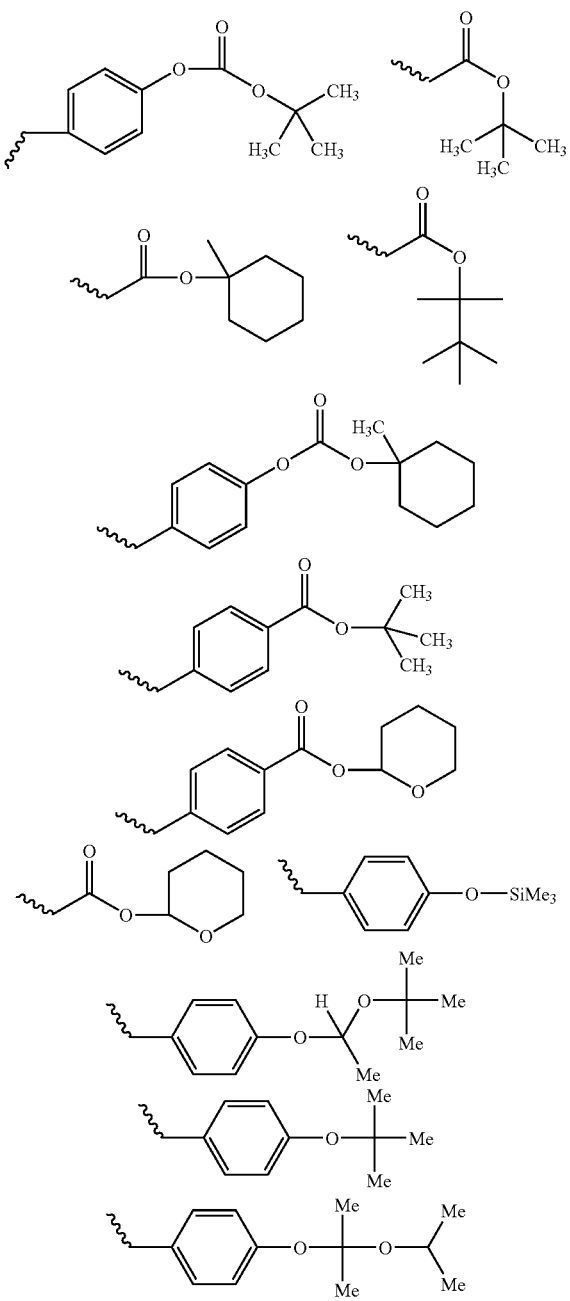

$R^2$, in combination with a portion of E, forms groups such as acetal groups, ketal groups, ether groups, silyl ethers groups, acid sensitive methylene ester groups (e.g. methylene t-butyl ester group), acid sensitive ester groups and carbonates. Mixtures of E and $R^2$ groups may be employed.

When $R^1$ and $R^2$ are low activation energy groups (e.g. acetals), it is preferred that G not be derived from cyclic anhydrides, although G* may be.

Preferred E-O—$R^2$ groups are those, containing acetals or acid sensitive esters. More preferred E-O—$R^2$ groups include, but are not limited to:

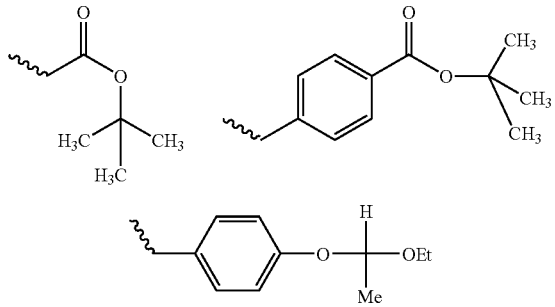

The reaction of the OH groups in monomeric units in the PBO precursor polymers of Structures III, VII and VII* (resulting from monomers of Structure IV) to generate acid sensitive groups B may be accomplished in different ways depending on which acid sensitive moiety is employed or if the spacer group E is employed. For example, the acid sensitive, end capped PBO precursor of Structure I may be prepared by an acid catalyzed addition reaction of vinyl ethers with Structure III in a process similar to the one described in U.S. Pat. No. 6,143,467 and U.S. Pat. No. 7,132,205. Any suitable acid catalyst may be used for the reaction, for example, hydrochloric acid, p-toluene sulfonic acid and pyridinium-p-toluene sulfonate. The acid catalyst may be added in amounts ranging from 0.001 wt % to about 3.0 wt %. Several vinyl ethers with a range of activation energies towards acid induced deprotection can be used in this reaction. The examples of such vinyl ethers include but are not limited to ethyl vinyl ether, t-butyl vinyl ether, vinyl cyclohexyl ether, 2-ethylhexyl vinyl ether, dihydrofuran, 2-methoxy-1-propene, and dihydropyran. Structures VII or VII* may be reacted similarly to produce II and II*. The preparation of PBO precursor polymers having a mixture of $R^1$ groups can be produced by using a mixture of vinyl ethers.

PBO precursors polymers of Structures I, II and II* useful in this disclosure may also be prepared using a process consisting of the acid catalyzed reaction of a PBO precursor polymer of Structures III, VII or VII*, t-butyl vinyl ether and an alkyl-, alkylene-, cycloalkyl-, cycloalkylalkyl or arylalkyl alcohol as described for polymers derived from hydroxystyrene in U.S. Pat. No. 6,133,412, herein incorporated by reference.

A typical synthetic scheme for production of an acetal protected PBO precursor described by Structure II is shown below:

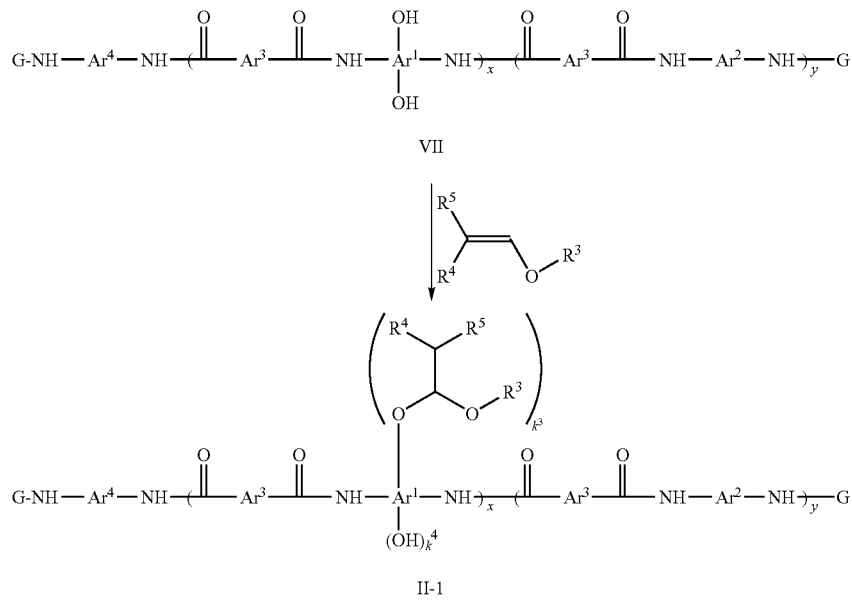

in which G, $Ar^1$, $Ar^2$, $Ar^3$, $k^3$, $k^4$, x and y are defined as before and $Ar^4$ is $Ar^1(OH)_2$ or $Ar^2$ in VII and $Ar^1(OB)_{k^3}$ $(OH)_{k^4}$ or $Ar^2$ in II. Examples of $R^3$ include, but are not limited to substituted or unsubstituted linear, branched or cyclic alkyl groups preferably having 1 to 18 carbon atoms, substituted or unsubstituted linear, branched or cyclic halogenated alkyl groups preferably having 1 to 18 carbon atoms, or arylalkyl groups. Examples of $R^4$ and $R^5$ groups include, but are not limited to, hydrogen, linear, branched, or cyclic alkyl groups, linear or branched alkylene group bearing a cycloalkyl substituent, substituted cycloalkyl, aryl, and substituted aryl groups, preferably having 1 to 10 carbon atoms.

Another suitable method of deriving the PBO precursor polymers of Structures I, II and II* bearing acid labile functional groups, is from the reaction of the PBO precursor of Structure III, VII, or VII* with t-butyl (or other tertiary acid sensitive group) bromoacetate in the presence of base as

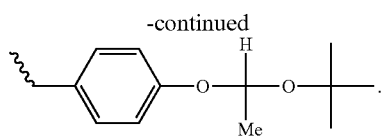

described for polymers containing hydroxystyrene units in U.S. Pat. No. 5,612,170. Benzyl bromides bearing acid sensitive substituents (e.g. t-butyl esters, carbonates, or alpha alkoxy esters) may be reacted in a similar fashion. Silyl group protected PBO precursor polymers of Structures I, II and II* may be prepared similarly by reacting the polymer with silyl halides under basic conditions. Ether (e.g. t-butyl) protected PBO precursor polymers of Structures I, II and II* may be prepared using standard synthetic procedures for the conversion of alcohol groups to ether groups.

The preparation of PBO precursor polymers having a mixture of $R^2$ groups can be produced by using a mixture of the corresponding reactants used for the corresponding $R^2$. The reactants may be used as a mixture, reacted sequentially in the same reaction pot, or reacted in consecutive reactions. The preparation of PBO precursor polymers having a mixture of $R^1$ and $EOR^2$ groups are preferably prepared using 2 consecutive reaction steps with the synthesis step attaching $R^1$ being carried out first.

PBO precursor polymers of this disclosure have a $k^3$ from about 0.1 to about 2. A preferred value for $k^3$ is from about 0.1 to about 1.5. A more preferred value for $k^3$ is from about 0.2 to about 1.2. The most preferred value for $k^3$ is from about 0.3 to about 0.8. The corresponding values for $k^4$ are $2-k^3$. $k^3$ is calculated by determining, using analytical methods, the percentage of OH groups attached to $Ar^1$ that have been reacted and then multiplying that percentage by 0.02.

Those skilled in the art will understand that reacted OH groups will be distributed throughout the polymer and polymer chains in a manner depending on the specific reaction conditions and the reactivity of the individual OH groups based on steric, electronic, and kinetic factors.

The positive-working formulation of the present disclosure uses one or more compounds which release acid upon exposure to radiation. Such materials are commonly called PhotoAcid Generators (PAGs). PAGs used in the present disclosure are preferably active to the radiation between about 300 nm to about 460 nm. They should form a homogeneous solution in the photosensitive composition and produce strong acid upon irradiation. Examples of such strong acids include hydrogen halides or a sulfonic acid. The classes of such PAGs include, but are not limited to, oxime sulfonates, triazines, diazoquinone sulfonates, aromatic sulfonyl imides or sulfonium or iodonium salts of sulfonic acids. Examples of suitable PAGs include but are not limited to:

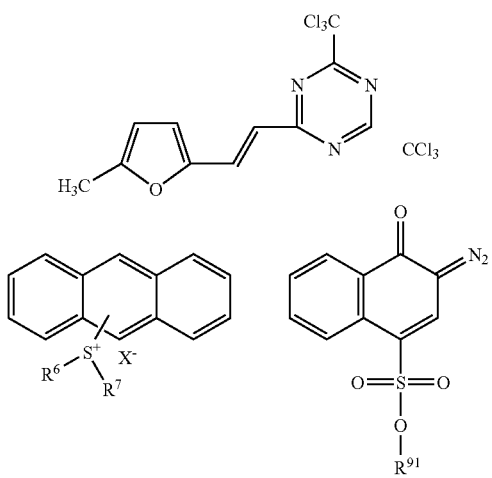

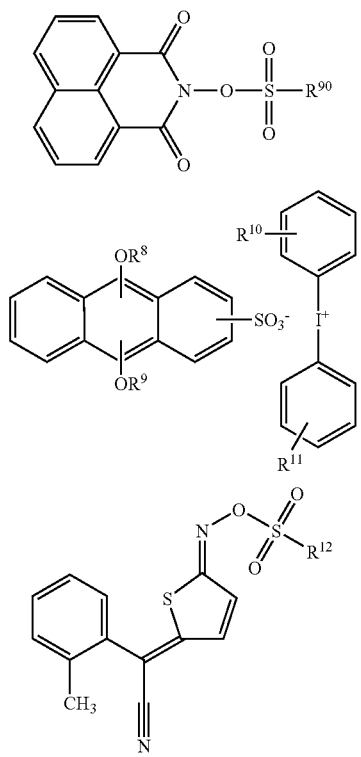

where $R^6$ and $R^7$ are each independently linear, branched or cyclic alkyl or aryl group containing 1 to 20 carbon atoms and $X^-$ is $R^{15}SO_3^-$ ($R^{15}$ is a substituted or unsubstituted, linear, branched or cyclic $C_1$-$C_{25}$ alkyl or a single or multinuclear aryl group having a total of from 6 to 25 carbons); $R^8$, $R^9$, $R^{10}$ and $R^{11}$ are independently linear, branched or cyclic alkyl groups and $R^{12}$ is a linear or branched $C_1$-$C_8$ alkyl, $C_5$-$C_8$ cycloalkyl, camphoroyl or toluyl; $R^{90}$ is $C_1$-$C_8$ a linear or branched alkyl that may contain F, or $C_5$-$C_8$ cycloalkyl and $R^{91}$ is an aromatic group. PAGs of the diazoquinone sulfonate class are generally prepared by condensation of the diazoquinone sulfonyl chloride with a wide variety of phenolic compounds known to those skilled in the art including, but not limited to phenol, trihydroxybenzophenone, and those described in U.S. Pat. Nos. 5,541,033, 4,992,596, 6,040,107, and 5,554,797 herein incorporated by reference. Specific examples of PAGs include but are not limited to:

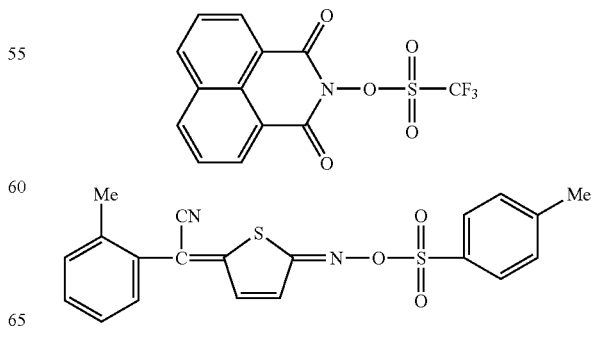

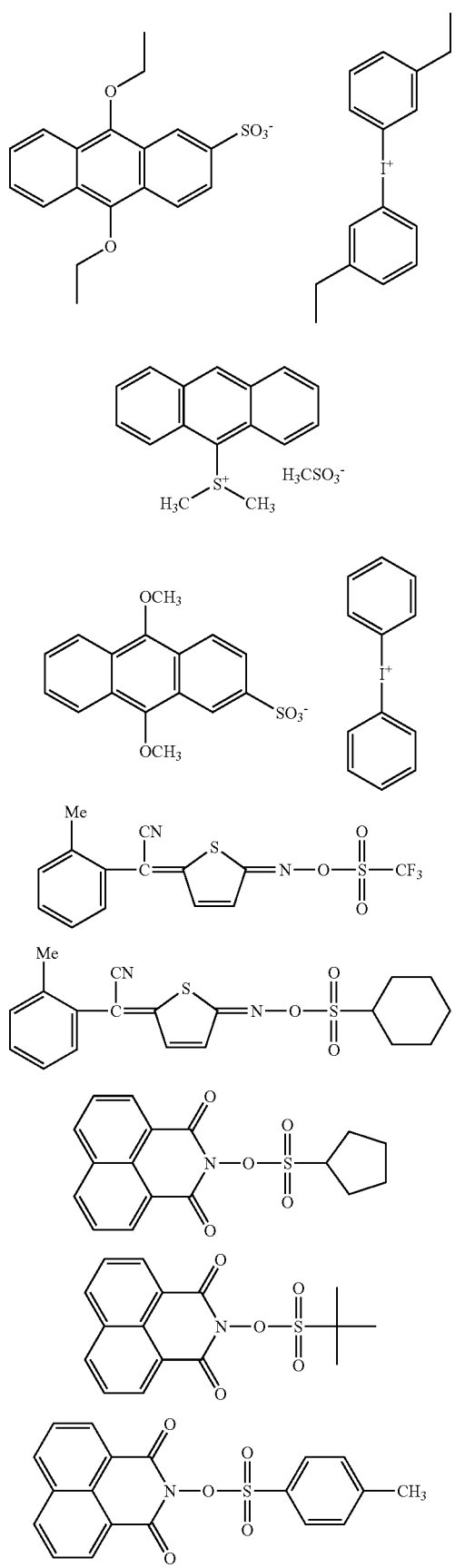

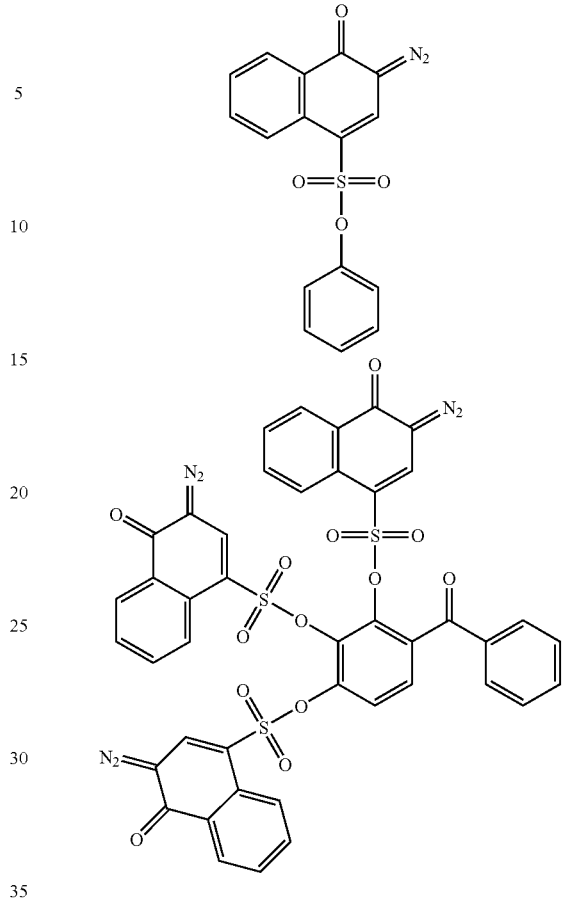

Alternatively, acid could be generated by a combination of PAG/sensitizer. In such systems energy of radiation is absorbed by the sensitizer and transmitted in some manner to the PAG. The transmitted energy causes PAG decomposition and generation of photoacid. Any suitable photoacid generator compound may be used. Suitable classes of photoacid generators generating sulfonic acids include, but are not limited to, sulfonium or iodonium salts, oximidosulfonates, bissulfonyidiazomethane compounds, and nitrobenzylsulfonate esters. Suitable photoacid generator compounds are disclosed, for example, in U.S. Pat. Nos. 5,558,978 and 5,468,589 which are incorporated herein by reference. Other suitable photoacid generators are perfluoroalkyl sulfonyl methides and perfluoroalkyl sulfonyl imides such as those disclosed in U.S. Pat. No. 5,554,664, which is incorporated herein by reference.

Still other suitable examples of photoacid generators include triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiophenium chloride, and 4-hydroxy-2-methylphenylhexahydrothiopyrylium chloride.

Additional examples of suitable photoacid generators for use in this disclosure include triphenylsulfonium perfluorooctanesulfonate, triphenylsulfonium perfluorobutanesulfonate, methylphenyldiphenylsulfonium perfluorooctanesulfonate, methylphenyldiphenysulfonium perfluorooctanesulfonate, 4-n-butoxyphenyl-diphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this disclosure include, but are not limited to, diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this disclosure are bis(p-toluenesulfonyl)diazomethane, methylsulfonyl p-toluenesulfonyl-diazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)-diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, and 2,4-dinitrobenzyl p-trifluoromethylbenzene-sulfonate.

Examples of sensitizers include but are not limited to: 9-methylanthracene, anthracenemethanol, acenaththalene, thioxanthone, methyl-2-naphthyl ketone, N-ethyl-3,6-bis(benzoyl)-carbazole, 9,9'-ethyl-3,3'-dicarbazolyl, 4-acetylbiphenyl, 1,2-benzofluorene, 9,10-dimethoxyanthracene, 9,10-dimethoxy-2-ethylanthracene and 9,10-dibutoxyanthracene.

The compositions of this disclosure in one embodiment further includes a basic compound selected from the group consisting of tertiary amines, hindered secondary amines, non-aromatic cyclic amines and quaternary ammonium provided that when the basic compound is a tertiary amine of Structure XIV, the number of carbon atoms in the basic compound is at least 6 and not all of $R^{30}$, $R^{31}$, and $R^{32}$ are a $C_6$-$C_{30}$ substituted or unsubstituted aryl. In the context of this disclosure a non-aromatic amine is defined as an amine in which the N is not part of an aromatic ring. A tertiary amine with less than 6 carbons is considered to be too volatile in the lithographic process to obtain reproducible results.

Suitable tertiary amines are defined by Structure XIV in which $R^{30}$, $R^{31}$, and $R^{32}$ are independently selected from the group consisting of a $C_1$-$C_{30}$ substituted or unsubstituted linear, branched, or cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, or a $C_1$-$C_{30}$ alkyl group containing at least one ether linkage, provided that when the basic compound is a tertiary amine of Structure XIV, the number of carbon atoms in the basic compound is at least 6 and not all of $R^{30}$, $R^{31}$, and $R^{32}$ are a $C_6$-$C_{30}$ unsubstituted aryl.

Structure XIV

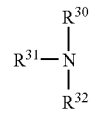

Examples of Structure XIV include, but are not limited to the following compounds.

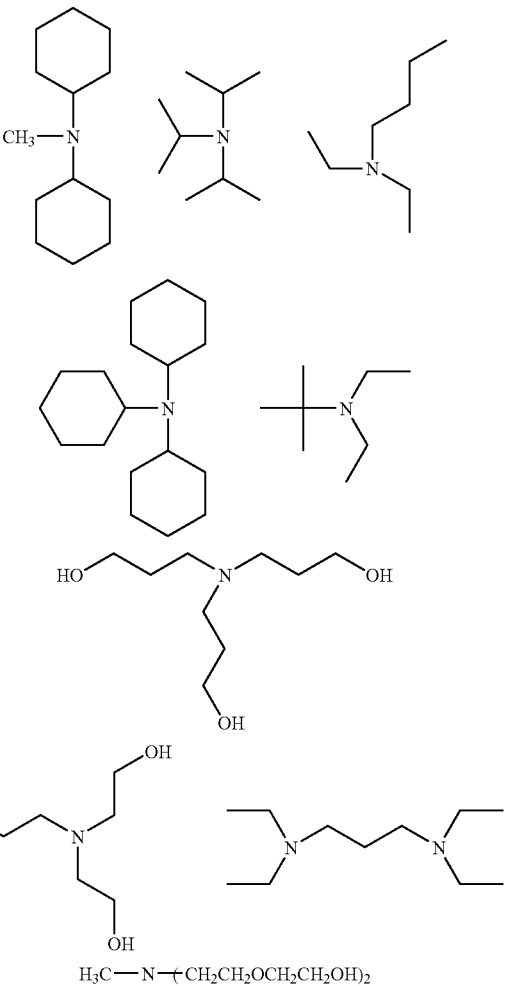

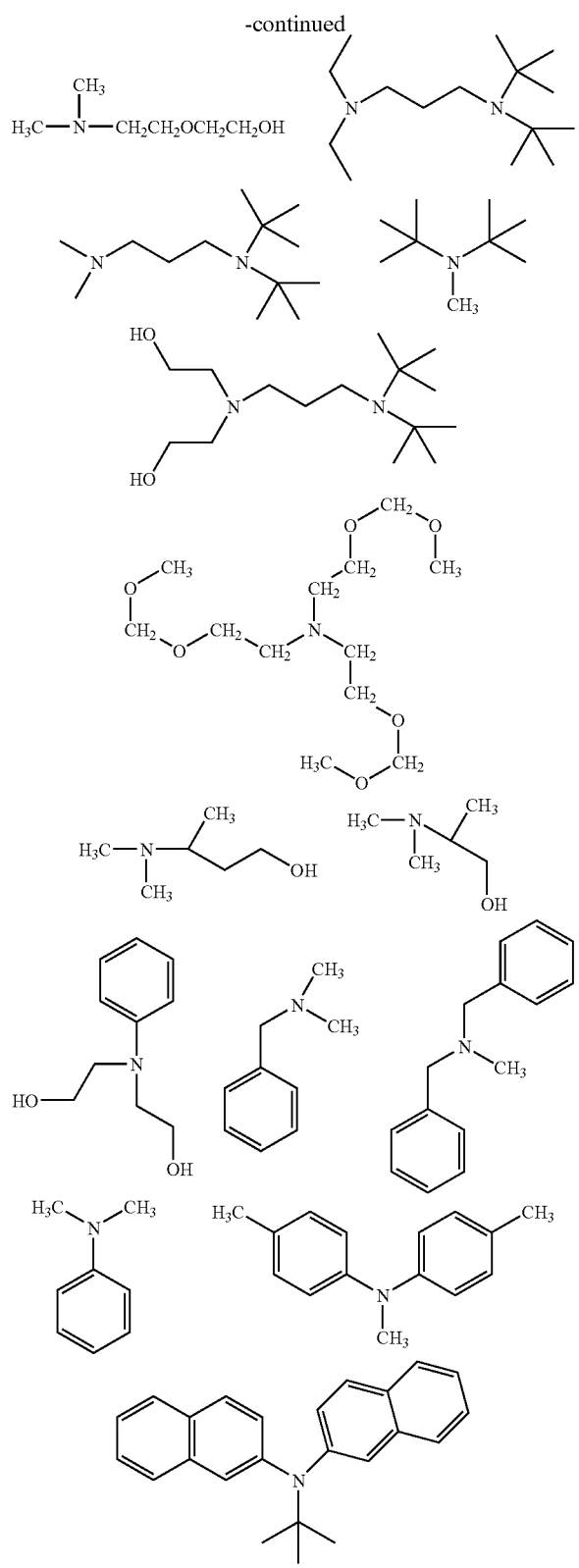

selected from the group consisting of a $C_3$-$C_{30}$ substituted or unsubstituted linear, branched, or cyclic alkyl, a $C_3$-$C_{15}$ tertiary aminoalkyl, a $C_3$-$C_{30}$ substituted or unsubstituted linear, branched, or cyclic hydroxyalkyl, and a $C_6$-$C_{30}$ substituted or unsubstituted aryl which are "hindered". Hindered tertiary amines are hereby defined as tertiary amines in which at least two of $R^{30}$, $R^{31}$, and $R^{32}$ have at least two substituents on the carbon bonded to the tertiary nitrogen as illustrated in Structure XV, in which $R^{44}$, $R^{45}$, and $R^{46}$ are independently selected from the group consisting of hydrogen, a $C_3$-$C_{30}$ substituted or unsubstituted linear, branched, or cyclic alkyl, a $C_3$-$C_{15}$ tertiary aminoalkyl, a $C_3$-$C_{30}$ substituted or unsubstituted linear, branched, or cyclic hydroxyalkyl and a $C_6$-$C_{30}$ substituted or unsubstituted aryl in which at least two of $R^{44}$, $R^{45}$, and $R^{46}$ are not hydrogen atoms. Two of $R^{44}$, $R^{45}$, and $R^{46}$ may be connected to form a ring.

Structure XV

Examples of hindered tertiary amines include, but are not limited to the following compounds.

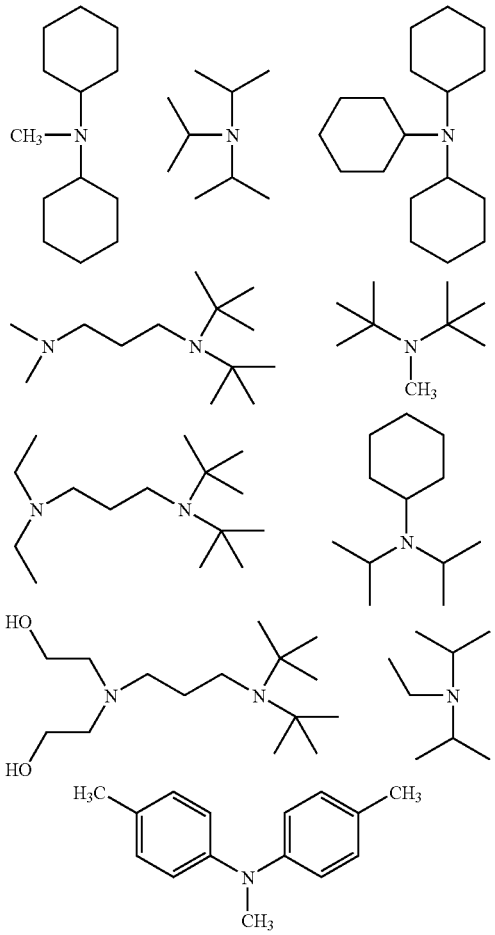

In one embodiment, preferred tertiary amines are those tertiary amines described by Structure XIV in which at least one of $R^{30}$, $R^{31}$, and $R^{32}$ are a $C_1$-$C_{30}$ alkyl group containing at least one ether linkage. In another embodiment, preferred tertiary amines are those tertiary amines described by Structure XIV in which $R^{30}$, $R^{31}$, and $R^{32}$ are independently

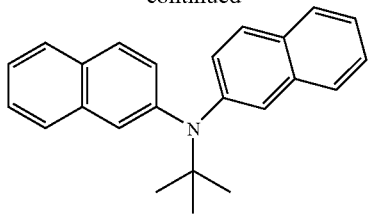

In one embodiment, the more preferred tertiary amines are those tertiary amines described by Structure XIV in which at least one of $R^{30}$, $R^{31}$, and $R^{32}$ are a $C_3$-$C_{15}$ alkyl group containing at least one ether linkage. In another embodiment, the more preferred tertiary amines are those hindered tertiary amines described by Structure XIV in which $R^{30}$, $R^{31}$, and $R^{32}$ are independently selected from the group consisting of a $C_3$-$C_{15}$ substituted or unsubstituted linear, branched, or cyclic alkyl, a $C_3$-$C_{10}$ tertiary aminoalkyl, a $C_3$-$C_{15}$ substituted or unsubstituted linear, branched, or cyclic hydroxyalkyl and a $C_6$-$C_{10}$ substituted or unsubstituted aryl.

In one embodiment, the most preferred tertiary amines are those tertiary amines described by Structure XIV in which at least two of $R^{30}$, $R^{31}$, and $R^{32}$ are a $C_3$-$C_{15}$ alkyl groups containing at least one ether linkage. In another embodiment, the most preferred tertiary amines are those hindered tertiary amines described by Structure XIV in which $R^{30}$, $R^{31}$, and $R^{32}$ are independently selected from the group consisting of a $C_3$-$C_{10}$ substituted or unsubstituted linear, branched, or cyclic alkyl, a $C_3$-$C_6$ tertiary aminoalkyl, or a $C_3$-$C_{10}$ substituted or unsubstituted linear, branched or cyclic hydroxyalkyl, and a substituted or unsubstituted phenyl group.

In an alternate embodiment, the compositions of this disclosure include as the basic compound a tertiary amine, defined by Structure XIV in which $R^{30}$, $R^{31}$, and $R^{32}$ are independently selected from the group consisting of a $C_1$-$C_{30}$ substituted or unsubstituted linear, branched, or cyclic alkyl, a $C_3$-$C_{30}$ tertiary aminoalkyl, a $C_2$-$C_{30}$ substituted or unsubstituted linear, branched, or cyclic hydroxyalkyl, or a $C_1$-$C_{30}$ alkyl group containing at least one ether linkage, with the proviso that the number of carbons contained in $R^{30}$, $R^{31}$, and $R^{32}$ is at least 6.

Structure XIV $$R^{31}-\underset{\underset{R^{32}}{|}}{\overset{\overset{R^{30}}{|}}{N}}$$

Examples of Structure XIV in this alternate embodiment include, but are not limited to the following compounds.

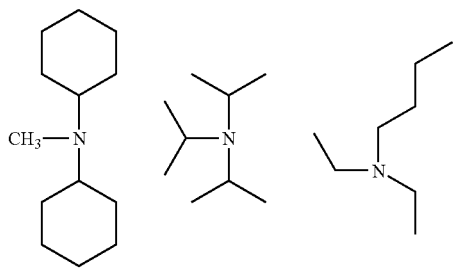

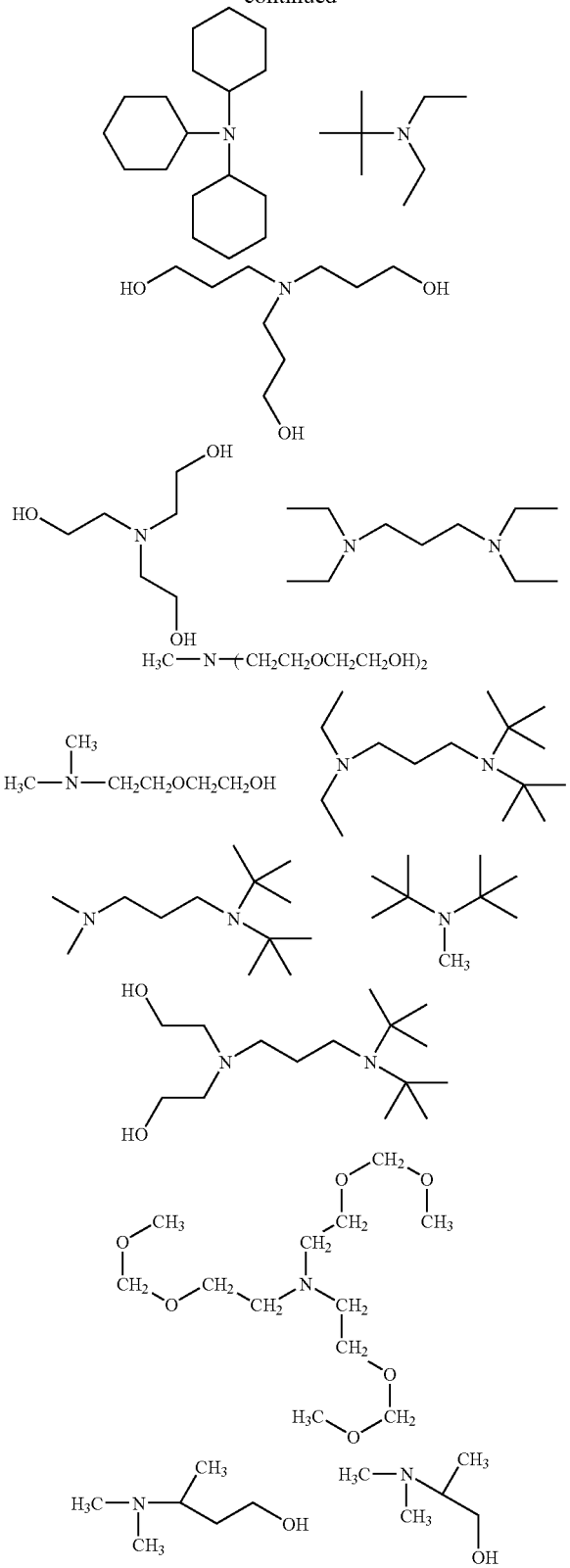

In this alternate embodiment, preferred tertiary amines are those tertiary amines described by Structure XIV in which at least one of $R^{30}$, $R^{31}$, and $R^{32}$ are a $C_1$-$C_{30}$ alkyl group containing at least one ether linkage. In another embodiment, preferred tertiary amines are those tertiary amines described by Structure XIV in which $R^{30}$, $R^{31}$, and $R^{32}$ are independently selected from the group consisting of a $C_3$-$C_{30}$ substituted or unsubstituted linear, branched, or cyclic alkyl, a $C_3$-$C_{15}$ tertiary aminoalkyl, a $C_3$-$C_{30}$ substituted or unsubstituted linear, branched, or cyclic hydroxyalkyl, and which are "hindered."

Examples of hindered tertiary amines in this alternate embodiment include, but are not limited to the following compounds.

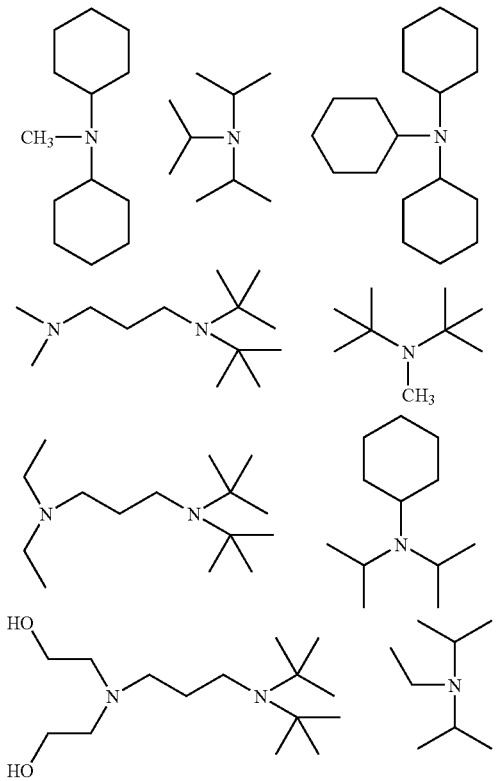

In this alternate embodiment, the more preferred tertiary amines are those tertiary amines described by Structure XIV in which at least one of $R^{30}$, $R^{31}$, and $R^{32}$ are a $C_3$-$C_{15}$ alkyl group containing at least one ether linkage. In another embodiment of this alternate embodiment, the more preferred tertiary amines are those hindered tertiary amines described by Structure XIV in which $R^{30}$, $R^{31}$, and $R^{32}$ are independently selected from the group consisting of a $C_3$-$C_{15}$ substituted or unsubstituted linear, branched, or cyclic alkyl, a $C_3$-$C_{10}$ tertiary aminoalkyl, and a $C_3$-$C_{15}$ substituted or unsubstituted linear, branched, or cyclic hydroxyalkyl.

In this alternate embodiment, the most preferred tertiary amines are those tertiary amines described by Structure XIV in which at least two of $R^{30}$, $R^{31}$, and $R^{32}$ are a $C_3$-$C_{15}$ alkyl groups containing at least one ether linkage. In another embodiment, the most preferred tertiary amines are those hindered tertiary amines described by Structure XIV in which $R^{30}$, $R^{31}$, and $R^{32}$ are independently selected from the group consisting of a $C_3$-$C_{10}$ substituted or unsubstituted linear, branched, or cyclic alkyl, a $C_3$-$C_6$ tertiary aminoalkyl, and a $C_3$-$C_{10}$ substituted or unsubstituted linear, branched or cyclic hydroxyalkyl.

Hindered secondary amines are amines defined by Structure XIV in which $R^{30}$ is a hydrogen atom and $R^{31}$ and $R^{32}$ are independently selected from the group consisting of a $C_3$-$C_{30}$ substituted or unsubstituted linear, branched, or cyclic alkyl, a $C_3$-$C_{30}$ tertiary aminoalkyl, a $C_3$-$C_{30}$ substituted or unsubstituted linear, branched, or cyclic hydroxyalkyl, a $C_6$-$C_{30}$ substituted or unsubstituted aryl, and a $C_3$-$C_{30}$ alkyl group containing at least one ether linkage and in which $R^{31}$ and $R^{32}$ have at least two substituents on the carbon bonded to the nitrogen as illustrated in Structure XV. Two of $R^{44}$, $R^{45}$, and $R^{46}$ in Structure XV may be connected to form a ring. Examples of hindered secondary amines include, but are not limited to, diphenylamine, dicyclohexylamine, di-t-butylamine, t-butyl-phenylamine, t-butyl-cyclohexylamine, diisopropylamine, di-t-amylamine, phenyl-cyclohexylamine, phenyl-napthylamine, dinaphthylamine, dianthracenylamine, and compounds represented by the following structures.

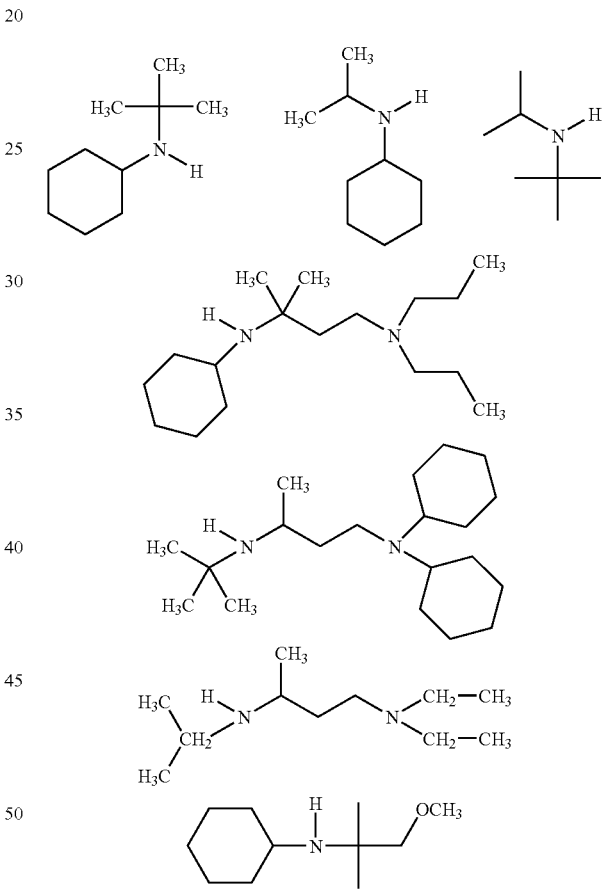

Preferred hindered secondary amines are amines defined by Structure XIV in which $R^{30}$ is a hydrogen atom and $R^{31}$ and $R^{32}$ are independently selected from the group consisting of a $C_3$-$C_{15}$ substituted or unsubstituted linear, branched, or cyclic alkyl, a $C_3$-$C_{20}$ tertiary aminoalkyl, a $C_3$-$C_{15}$ substituted or unsubstituted linear, branched, or cyclic hydroxyalkyl, a $C_6$-$C_{10}$ substituted or unsubstituted aryl, and a $C_3$-$C_{15}$ alkyl group containing at least one ether linkage and in which $R^{31}$ and $R^{32}$ have at least two substituents on the carbon bonded to the nitrogen as illustrated in Structure XV.

More preferred hindered secondary amines are amines defined by Structure XIV in which $R^{30}$ is a hydrogen atom and $R^{31}$ and $R^{32}$ are independently selected from the group consisting of a $C_3$-$C_{10}$ substituted or unsubstituted linear, branched, or cyclic alkyl, a $C_3$-$C_{10}$ tertiary aminoalkyl, a $C_3$-$C_{10}$ substituted or unsubstituted linear, branched, or cyclic hydroxyalkyl, a substituted or unsubstituted phenyl group, and a $C_3$-$C_{15}$ alkyl group containing at least one ether linkage and in which $R^{31}$ and $R^{32}$ have at least two substituents on the carbon bonded to the nitrogen as illustrated in Structure XV.

Most preferred hindered secondary amines are amines defined by Structure XIV in which $R^{30}$ is a hydrogen atom and $R^{31}$ and $R^{32}$ are independently selected from the group consisting of a $C_3$-$C_{10}$ substituted or unsubstituted linear, branched, or cyclic alkyl, a $C_3$-$C_{20}$ tertiary aminoalkyl, a $C_3$-$C_{10}$ substituted or unsubstituted linear, branched, or cyclic hydroxyalkyl, a substituted or unsubstituted phenyl group and a $C_3$-$C_{15}$ alkyl group containing at least one ether linkage and in which $R^{31}$ and $R^{32}$ have at least two substituents on the carbon bonded to the nitrogen as illustrated in Structure XV and at least one of $R^{31}$ and $R^{32}$ is selected from a substituted or unsubstituted cyclohexyl group, a substituted or unsubstituted phenyl group, and a group having three substituents on the carbon bonded to the nitrogen (i.e., none of $R^{44}$, $R^{45}$, and $R^{46}$ shown in Structure XV are hydrogen atoms).

Non-aromatic cyclic amines are amines in which the amine nitrogen is incorporated into a primarily carbocyclic ring structure which may contain additional heteroatoms such as oxygen, sulfur, or another nitrogen. The ring structure may be monocyclic, bicyclic, or tricyclic, and may contain double bonds. Examples of classes of non-aromatic cyclic amines, include, but are not limited to, amines described by Structures XVI, XVII, and tertiary alicyclic amines.

Structure XVI

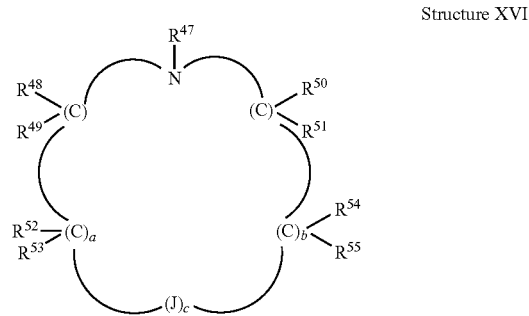

In Structure XVI, $R^{47}$ is a hydrogen atom, a $C_1$-$C_6$ substituted or unsubstituted linear, branched, or cyclic alkyl, or a $C_6$-$C_{10}$ substituted or unsubstituted aryl; $R^{48}$, $R^{49}$, $R^{50}$, $R^{51}$. $R^{52}$, $R^{53}$, $R^{54}$, and $R^{55}$ are independently a hydrogen atom, a $C_1$-$C_6$ substituted or unsubstituted linear, branched, or cyclic alkyl, or a $C_6$-$C_{10}$ substituted or unsubstituted aryl; J is an oxygen atom, a sulfur atom, or a $NR^{56}$ group where $R^{56}$ is a hydrogen atom, a $C_1$-$C_6$ substituted or unsubstituted linear, branched, or cyclic alkyl, or a $C_6$-$C_{10}$ substituted or unsubstituted aryl; a and b are independently 1, 2, or 3 and c is 0 or 1.

Examples of suitable non-aromatic cyclic amines of Structure XVI include, but are not limited to, morpholine, N-methylmorpholine, 2,6-dimethylmorpholine, 2,2,6,6-tetramethylmorpholine, N-hydroxyethyl morpholine, N-ethyl morpholine, thiomorpholine, N-methylthiomorpholine, 2,6-dimethylthiomorpholine, 2,2,6,6-tetramethylthiomorpholine, piperidine, N-hydroxyethylpiperidine, 2,6-dimethyl piperidine, 2,2,6,6-tetramethylpiperidine, pyrrolidine, N-methylpyrrolidine, N-ethyl pyrrolidine, 2,5-dimethylpyrrolidine 2,2,5,5-tetramethylpyrrolidine, piperazine, N,N'-dimethylpiperazine, and N,N'-diethylpiperazine.

Preferred non-aromatic cyclic amines of Structure XVI are those in which $R^{47}$ is a $C_1$-$C_6$ substituted or unsubstituted linear, branched, or cyclic alkyl, or a $C_6$-$C_{10}$ substituted or unsubstituted aryl and where $R^{47}$ is a hydrogen atom, at least two of $R^{48}$, $R^{49}$, $R^{50}$, and $R^{51}$ are independently a $C_1$-$C_6$ substituted or unsubstituted linear, branched, or cyclic alkyl. Preferred examples of non-aromatic cyclic amines include, but are not limited to, N-methylmorpholine, 2,6-dimethylmorpholine, 2,2,6,6-tetramethylmorpholine, N-hydroxyethyl morpholine, N-ethyl morpholine, N-hydroxyethylpiperidine, 2,6-dimethyl piperidine, 2,2,6,6-tetramethylpiperidine, N-methylpyrrolidine, N-ethyl pyrrolidine, 2,5,-dimethyl pyrrolidine 2,2,5,5-tetramethylpyrrolidine, N,N'-dimethylpiperazine, and N,N'-diethylpiperazine.

More preferred non-aromatic cyclic amines of Structure XVI are those in which $R^{47}$ is a $C_1$-$C_6$ substituted or unsubstituted linear, branched, or cyclic alkyl, or a $C_6$-$C_{10}$ substituted or unsubstituted aryl and where $R^{47}$ is a hydrogen atom, $R^{48}$, $R^{49}$, $R^{50}$, and $R^{51}$ are each independently a $C_1$-$C_6$ substituted or unsubstituted linear, branched, or cyclic alkyl. More preferred examples of non-aromatic cyclic amines include, but are not limited to, N-methylmorpholine, 2,2,6,6-tetramethylmorpholine, N-hydroxyethyl morpholine, N-ethyl morpholine, N-hydroxyethylpiperidine, 2,2,6,6-tetramethylpiperidine, N-methylpyrolidine, N-ethyl pyrrolidine, 2,2,5,5-tetramethylpyrrolidine, N,N'-dimethylpiperazine, and N,N'-diethylpiperazine.

Most preferred non-aromatic cyclic amines of Structure XVI are those in which $R^{47}$ is a $C_1$-$C_6$ substituted or unsubstituted linear, branched, or cyclic alkyl. Most preferred examples of non-aromatic cyclic amines of Structure XVI include, but are not limited to, N-methylmorpholine, N-hydroxyethyl morpholine, N-ethyl morpholine, N-hydroxyethylpiperidine, N-methylpyrrolidine, N-ethyl pyrrolidine, N,N'-dimethylpiperazine, and N,N'-diethylpiperazine.

Structure XVII

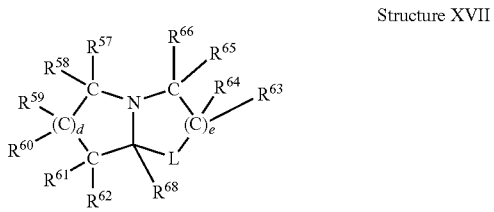

In Structure XVII, L is an oxygen atom, a sulfur atom, $NR^{67}$ or $CR^{69}R^{70}$; $R^{67}$ is a hydrogen atom, a $C_1$-$C_6$ substituted or unsubstituted linear, branched, or cyclic alkyl, a $C_6$-$C_{10}$ substituted or unsubstituted aryl, or together with $R^{68}$ forms a second bond between L and the C atom to which $R^{68}$ is attached; $R^{69}$ and $R^{70}$ are independently selected from a hydrogen atom, a $C_1$-$C_6$ substituted or unsubstituted linear, branched, or cyclic alkyl, or a $C_6$-$C_{10}$ substituted or unsubstituted aryl; $R^{57}$-$R^{66}$ are independently selected from a hydrogen atom, a $C_1$-$C_6$ substituted or unsubstituted linear, branched, or cyclic alkyl, or a $C_6$-$C_{10}$ substituted or unsubstituted aryl; d is 1, 2, or 3; e is 1, 2, or 3; $R^{68}$ is a hydrogen atom or together with $R^{67}$ forms a second bond between L and the C atom to which it is attached. Preferred non-aromatic cyclic amines of Structure XVII are include, but are not limited to, 1,5-diazabicyclo[4.3.0]non-5-ene, 1,8-diazabicyclo[5.4.0]undec-7-ene and the compound shown below.

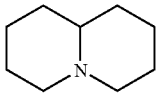

Examples of tertiary alicyclic amines include, but are not limited to the following compounds where $R^{72}$ is a $C_1$-$C_6$ substituted or unsubstituted linear, branched, or cyclic alkyl or a $C_6$-$C_{10}$ substituted or unsubstituted aryl.

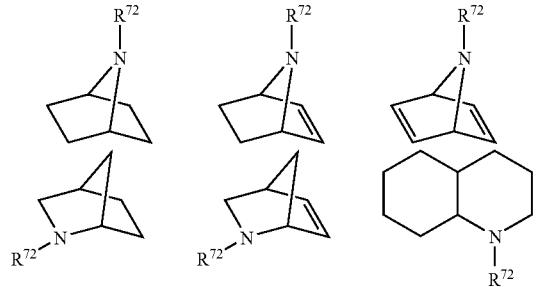

The quaternary ammonium hydroxides are ammonium hydroxides in which each of the four groups has a carbon atom attached to the positively charged nitrogen. The groups may be substituted or unsubstituted. Suitable quaternary ammonium hydroxides are described by Structure XVIII, in which $R^{36}$, $R^{37}$, $R^{38}$, and $R^{39}$ are independently substituted or unsubstituted linear, branched, or cyclic alkyl, substituted or unsubstituted linear, branched or cyclic hydroxyalkyl, or substituted or unsubstituted phenyl.

Structure XVIII

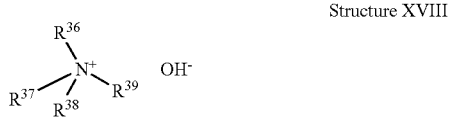

Examples of quaternary ammonium hydroxides of Structure XVIII include, but are not limited to, the following compounds.

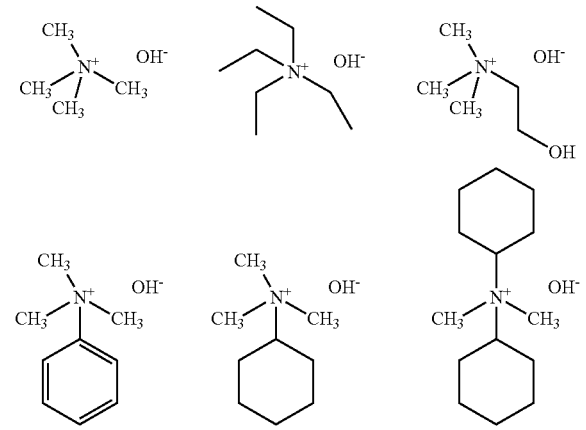

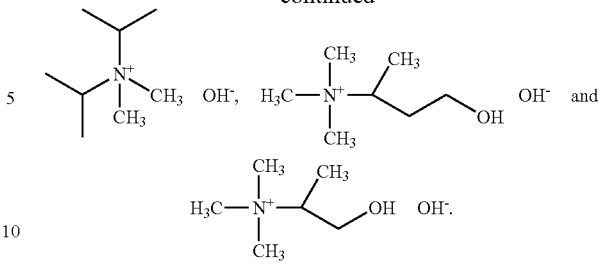

In the above formulas, $R^{43}$ is a hydrogen atom or a substituted or unsubstituted $C_1$-$C_{20}$ alkyl group and q is an integer of from 0 to 20. In a preferred embodiment, q is an integer of from 0 to 10. In a more preferred embodiment, q is an integer from 0 to 5. In a most preferred embodiment, q is an integer from 0 to 3.

Preferred quaternary ammonium hydroxides are those of Structure XVIII in which $R^{36}$, $R^{37}$, $R^{38}$, and $R^{39}$ are independently substituted or unsubstituted linear, branched, or cyclic alkyl, or substituted or unsubstituted linear, branched or cyclic hydroxyalkyl. More preferred quaternary ammonium hydroxides are those of Structure XVIII in which $R^{36}$, $R^{37}$, $R^{38}$, and $R^{39}$ are independently $C_1$-$C_{10}$ linear, branched, or cyclic substituted or unsubstituted alkyl, or $C_2$-$C_{20}$ substituted or unsubstituted, linear, branched or cyclic hydroxyalkyl. Most preferred quaternary ammonium hydroxides are those of Structure XVIII in which $R^{36}$, $R^{37}$, $R^{38}$, and $R^{39}$ are independently $C_1$-$C_4$ linear, branched, or cyclic substituted or unsubstituted alkyl, or $C_2$-$C_4$ substituted or unsubstituted, linear or branched hydroxyalkyl.

According to one embodiment of the present disclosure, a mixture of at least two basic compounds having different structures selected from the basic compounds described above, may be used as the basic compound of component (C). Specifically, for example, two basic compounds having different structures, three basic compounds having different structures or four or more basic compounds having different structures may be used. In case of using at least two basic compounds having different structures, it is preferred that an amount of the basic compound that is used in the least amount is not less than 10% by weight based on the total amount of the basic compounds used.

One advantage of using a basic compound described above in a photosensitive composition described in this disclosure is that the basic compound can slow down the photospeed of the composition. Indeed, the shutter of a non-laser based stepper (e.g., a typical I-line stepper) is typically not designed to operate reproducibly at a very high photospeed (e.g., at a very low energy dose). As a result, a photosensitive composition with a very high photospeed typically yields inconsistent exposure results. Addition of a basic compound described above in such a composition can decrease its photospeed and therefore reproducibly controls the exposure results of such a composition. For example, the photosensitive composition described in this disclosure can form 8 μm features at an exposure energy of at least about 125 mJ/cm² (e.g., at least about 175 mJ/cm²) and/or at most about 500 mJ/cm² (e.g., at most about 200 mJ/cm²) by using an i-line stepper. Other advantages of using a basic compound described above in a photosensitive include improving the shelf life of the composition, removing chemical undercut of a film made by these compositions (e.g., in the presence of an epoxy adhesion promoter), and reducing the thickness loss of an unexposed film made by the composition during a lithographic process.

In some embodiments, the inventors surprising discovered that certain basic compounds can increase the photospeed of a photosensitive compound (e.g., a PBO precursor) described in this disclosure. Examples of such basic compounds include tertiary amines of Structure XIV in which $R^{30}$, $R^{31}$, and $R^{32}$ are $C_6$-$C_{30}$ substituted or unsubstituted aryl (e.g., phenyl). Such basic compounds can be used in a photosensitive composition if the composition has a very slow photospeed. As an example, such basic compounds can be used in combination with other basic compounds described above to adjust the photospeed of a photosensitive compound described in this disclosure to an optimal value.

A chemically amplified positive working photosensitive polybenzoxazole precursor composition of the present disclosure can contain one or more polybenzoxazole precursors I, II, or II* at about 10 wt. % to about 50 wt. % of the composition. Preferably, about 20 wt. % to about 45 wt. %, more preferably, about 25 wt. % to 42.5 wt. % and most preferably, about 30 wt. % to 40 wt. % of the polybenzoxazole precursor I, II, or II* is present in the composition.

The PBO precursor polymer used in a chemically amplified positive working photosensitive polybenzoxazole precursor composition of the present disclosure may contain a mixture of $R^1$ groups, $R^2$ groups, or $R^1$ and $EOR^2$ groups. Alternatively, a mixture of polybenzoxazole precursor polymers may be employed which, between the polybenzoxazole precursor polymers, have different $R^1$ groups, $EOR^2$ groups, or the first polybenzoxazole precursor polymer having an $R^1$ group and the second polybenzoxazole precursor polymer having an $EOR^2$ group. Examples of these mixtures include, but are not limited to a mixture of a first polybenzoxazole precursor polymer having $R^1$=tetrahydropyranyl with a second polybenzoxazole precursor polymer having $R^1$=t-butoxyethyl, a first polybenzoxazole precursor polymer having $EOR^2$=$CH_2C(O)O$-tetrahydropyranyl with a second polybenzoxazole precursor polymer having $EOR^2$=$CH_2C(O)O$-t-butyl and a first polybenzoxazole precursor polymer having $R^1$=tetrahydropyranyl with a second polybenzoxazole precursor polymer having $EOR^2$=$CH_2C(O)O$-t-butyl.

Up to 25% of the amount of the polybenzoxazole precursor polymer of Structure I may be replaced by other organic solvent soluble, aqueous base soluble, aromatic or heterocyclic group polymers or copolymers.

Examples of organic solvent soluble, aqueous base soluble, aromatic or heterocyclic group polymers or copolymers may include polyimides, polyamic esters, polybenzoimidazoles, polybenzothiazoles, polytriazoles, polyquinazolones, polyquinazolindiones, polyquinacridones, polybenxazinones, polyanthrazolines, polyoxadiazoles, polyhydantoins, polyindophenazines, or polythiadiazoles. Polyamic acids may also be employed as a co-resin, but preferably is employed only when a high-energy activation acid sensitive group (e.g. a tertiary ester) is employed on the polybenzoxazole precursor I, II or II*.

The amount of PAG ranges from about 0.5 to about 20% (wt) based on amount of polybenzoxazole precursor. A preferred amount of PAG is from about 2 to about 15% (wt) based on the amount of polybenzoxazole precursor. A more preferred amount of PAG is from about 2 to about 10% (wt) based on the amount of polybenzoxazole precursor. The amount of optional sensitizer can be from about 0.1 to about 5% (wt) based on the amount of polybenzoxazole precursor. The photoacid generator may be used alone or in combination with one or more photoacid generators. The percentage of each photoacid generator in photoacid generator mixtures is between about 10% to about 90% of the total photoacid generator mixture. Preferred photoacid generator mixtures contain about 2 or 3 photoacid generators. Such mixtures may be of the same class or different classes.

The amount of basic compound ranges from about 0.001 wt % to about 3 wt % of the total photosensitive composition. A preferred amount of basic compound is from about 0.01 wt % to about 1.5 wt % of the total photosensitive composition. A more preferred amount of basic compound is from about 0.02 wt % to about 1 wt % of the total photosensitive composition. The most preferred amount of basic compound is from about 0.03 wt % to about 0.5 wt % of the total photosensitive composition.

A chemically amplified positive working photosensitive polybenzoxazole (PBO) precursor composition described in this disclosure can further include one or more solvents. The amount of solvent in the composition can be from about 40% (wt) to about 87% (wt). The preferred amount is from about 45% (wt) to about 70% (wt), more preferred amount is from about 47.5% (wt) to about 65% (wt), more preferred amount is from about 50% (wt) to about 60% (wt). The solvent should not interfere with the photoacid generation from PAG or with the acid-catalyzed de-blocking reaction, should dissolve all components and should cast a good film. Suitable solvents include, but are not limited to organic solvents, such as gamma-butyrolactone (GBL), propylene glycol methyl ether acetate (PGMEA), methoxy ethyl ether and mixtures thereof. The preferred solvents are propylene glycol methyl ether acetate (PGMEA) and gamma-butyrolactone. The most preferred solvent is propylene glycol methyl ether acetate (PGMEA) or a mixture of propylene glycol methyl ether acetate and gamma-butyrolactone.

A chemically amplified positive working photosensitive PBO precursor compositions of the present disclosure can optionally include at least one plasticizer. The plasticizer should have a lower volatility than the solvent employed at the typical bake temperatures of about 100° C. to about 150° C., so that it remains in the film after the softbake. This typically means that the plasticizer of this disclosure has a higher boiling point than the solvent employed, unless interaction of the functional groups of the plasticizer with other components of the chemically amplified positive working photosensitive PBO precursor composition decreases its volatility sufficiently. It is preferred that this boiling point differential is at least about 10° C. A more preferred boiling point differential is at least about 15° C.

The amount of optional plasticizer used in a chemically amplified positive working photosensitive PBO precursor composition of this disclosure is from about 0.1 wt % to about 20 wt % of the total weight of the composition, preferably, from about 1 wt % to about 10 wt %, more preferably, from about 1.25 wt % to about 7.5 wt % and most preferably, from about 1.5 wt % to about 5 wt %. The plasticizers may be blended together in any suitable ratio.

In one embodiment of the present disclosure concerning a chemically amplified positive working photosensitive PBO precursor composition, the optional plasticizer is at least one polyhydroxy compound with at least two OH groups and whose boiling point is higher than the boiling point of the chemically amplified positive working photosensitive PBO precursor composition solvent. Examples of polyhydroxy compounds with at least two OH groups are, but are not limited to, ethylene glycol, diethylene glycol, polyethylene glycol, propylene glycol, tripropylene glycol, polypropylene glycol, glycerol, butane diol, hexane diol, sorbitol, cyclohexanediol, 4,8-bis(hydroxymethyl)-tricyclo(5.2.1.0/2,6)decane and a 2-oxepanone co-polymer with 2-ethyl-2-(hydroxymethyl)-1,3-propanediol. Preferred polyhydroxy compound with at least two OH groups are diethylene glycol, tripropylene glycol, and a 2-oxepanone co-polymer with 2-ethyl-2-(hydroxymethyl)-1,3-propanediol. More preferred polyhydroxy compound with at least two OH groups are tripropylene glycol and a 2-oxepanone co-polymer with 2-ethyl-2-(hydroxymethyl)-1,3-propanediol.

In another embodiment of the present disclosure concerning a chemically amplified positive working photosensitive PBO precursor composition, the optional plasticizer is at least one saturated glycol mono ether whose boiling point is higher than the boiling point of the chemically amplified positive working photosensitive PBO precursor composition solvent. Examples of suitable saturated glycol mono ethers include, but are not limited to, saturated mono ethers of tripropylene glycol, tetrapropylene glycol, triethylene glycol, tetraethylene glycol and pentaethylene glycol. Preferred saturated glycol mono ethers are saturated mono ethers of tripropylene glycol, triethylene glycol and tetraethylene glycol. More preferred saturated glycol mono ethers are tri(propylene glycol)methyl ether, tri(propylene glycol)propyl ether and tri(propylene glycol)butyl ether.

In another embodiment of the present disclosure concerning a chemically amplified positive working photosensitive PBO precursor composition, the optional plasticizer is at least one carboxylic acid ester whose boiling point is higher than the boiling point of the chemically amplified positive working photosensitive PBO precursor composition solvent. Examples include, but are not limited to, ethyl cyclohexyl acetate, propyl benzoate, butyl benzoate, n-butyl cinnamate, ethyl-3,3'-diethoxypropionate, dimethyl succinate, diisopropyl succinate, dimethyl maleate, dimethyl malonate, diethyl adipate, diethyl acetamidomalonate, diethyl allylmalonate, and dimethyl cyclohexane-1,4-dicarboxylate, mixture of cis and trans isomers. Preferably the carboxylic acid ester is derived from a carboxylic acid containing at least two carboxylic acid groups. Examples include, but are not limited to, dimethyl succinate, diisopropyl succinate, dimethyl maleate, dimethyl malonate, diethyl adipate, diethyl acetamidomalonate, diethyl allylmalonate, and dimethyl cyclohexane-1,4-dicarboxylate, including mixtures of cis and trans isomers thereof.

Preferred embodiments of the present disclosures are chemically amplified positive working photosensitive PBO precursor compositions including at least one plasticizer selected from the group consisting of polyhydroxy compounds with at least two OH groups and glycol ethers.

More preferred embodiments of the present disclosures are chemically amplified positive working photosensitive PBO precursor compositions including at least one plasticizer selected from the group consisting of polyhydroxy compounds with at least two OH groups.

A positive chemically amplified resist formulation of the present disclosure can also contain other additives, such as, but not limited to, surfactants, dyes, profile enhancing additives, adhesion promoters, etc.

If employed, the amount of adhesion promoter may range from about 0.1 wt. % to about 5 wt. % based on the amount of polybenzoxazole precursor polymer. A preferred amount of adhesion promoter is from about 0.5 wt. % to about 5 wt. % based on the amount of polybenzoxazole precursor polymer. A more preferred amount of adhesion promoter is from about 1 wt. % to about 4 wt. % based on the amount of polybenzoxazole precursor polymer. Suitable adhesion promoters include, for example, alkoxysilanes, and mixtures or derivatives thereof.

Examples of suitable adhesion promoters which may be employed in the disclosure may be described by Structure XIII:

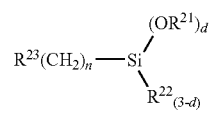

Structure XIII in which each $R^{21}$ is independently a $C_1$-$C_4$ alkyl group or a $C_5$-$C_7$ cycloalkyl group and each $R^{22}$ is independently a $C_1$-$C_4$ alkyl group, a $C_1$-$C_4$ alkoxy group, a $C_5$-$C_7$ cycloalkyl group or a $C_5$-$C_7$ cycloalkoxy group; d is an integer from 0 to 3 and n is an integer from 1 to about 6. $R^{23}$ is one of the following moieties:

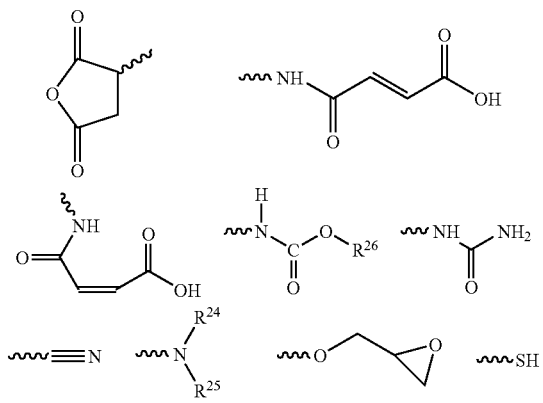

in which each $R^{24}$ and $R^{25}$ are independently a substituted or unsubstituted $C_1$-$C_4$ alkyl group or a $C_5$-$C_7$ cycloalkyl group, and $R^{26}$ is a $C_1$-$C_4$ alkyl group and a $C_5$-$C_7$ cycloalkyl group. Preferred adhesion promoters are those in which $R^{23}$ is selected from the group consisting of

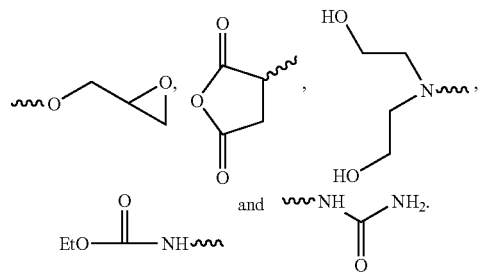

Examples of preferred adhesion promoters include, but are not limited to the following compounds.

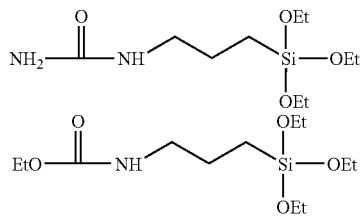

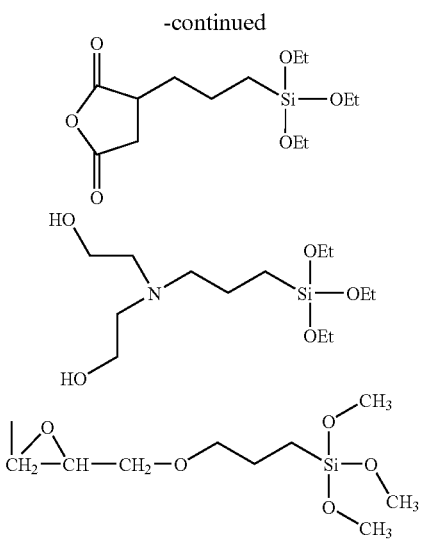

In addition, the present disclosure includes a process for forming a relief pattern. The process includes the steps of: (a) providing a substrate, (b) coating on said substrate, a positive-working photosensitive composition including at least one polybenzoxazole precursor polymer having Structure I or II or II*; at least one photoacid generator which releases acid upon irradiation; at least one basic compound; and at least one solvent (all as described above), thereby forming a coated substrate; (c) exposing the coated substrate to actinic radiation; (d) post exposure baking the coated substrate at an elevated temperature of about 70° C. to about 150° C.; (e) developing the coated substrate with an aqueous base developer, thereby forming a developed relief pattern; and (f) baking the substrate at an elevated temperature sufficient to cure the composition to produce a polybenzoxazole relief image. The curing temperature can range from about 250° C. to about 400° C.

In an alternate process, the tertiary amine of Structure XIV in which $R^{30}$, $R^{31}$, and $R^{32}$ are independently selected from the group consisting of a $C_1$-$C_{30}$ substituted or unsubstituted linear, branched, or cyclic alkyl, a $C_3$-$C_{30}$ tertiary aminoalkyl, a $C_2$-$C_{30}$ substituted or unsubstituted linear, branched, or cyclic hydroxyalkyl, and a $C_1$-$C_{30}$ alkyl group containing at least one ether linkage, provided that the number of carbon atoms in the tertiary amine of Structure XIV is at least 6, may be employed.

The positive working photosensitive PBO precursor composition of this disclosure is coated on a suitable substrate. The coating can have a thickness of at least about 4 μm. In a preferred embodiment the coating thickness is at least 6 μm. In a more preferred embodiment the coating thickness is at least 8 μm. The substrate may be, for example, semiconductor materials such as a silicon wafer, compound semiconductor (Groups III-V) or (Groups II-VI) wafer, a ceramic, glass or quartz substrate. The substrates may also contain films or structures used for electronic circuit fabrication such as organic or inorganic dielectrics, copper or other wiring metals.

To ensure proper adhesion of the photosensitive composition to the substrate, the substrate may be optionally treated before coating with an adhesion promoter or adhesion promoter composition before the first coating step or the photosensitive composition may employ an internal adhesion promoter. Any suitable method of treatment of the substrate with adhesion promoter known to those skilled in the art may be employed. Examples include treatment of the substrate with adhesion promoter vapors, solutions or at 100% concentration. The time and temperature of treatment will depend on the particular substrate, adhesion promoter, and method, which may employ elevated temperatures. Any suitable adhesion promoter may be employed. Classes of suitable adhesion promoters include, but are not limited to, vinylalkoxysilanes, methacryloxalkoxysilanes, mercaptoalkoxysilanes, epoxyalkoxysilanes and glycidoxyalkoxysilanes. Examples of suitable adhesion promoters include, but are not limited to, gamma-glycidoxypropylmethyldimethoxysilane, gamma-glycidoxypropyl-methyldiethoxysilane, gamma-mercaptopropylmethyldimethoxysilane, 3-methacryl-oxypropyldimethoxymethylsilane, and 3-methacryloxypropyltrimethoxysilane. gamma-glycidoxypropylmethyldimethoxysilane, is more preferred. Additional suitable adhesion promoters are described in "Silane Coupling Agent" Edwin P. Plueddemann, 1982 Plenum Press, New York, which is incorporated herein by reference.

Coating methods include, but are not limited to, spray coating, spin coating, offset printing, roller coating, screen printing, extrusion coating, meniscus coating, curtain coating, and immersion coating. The resulting film is prebaked at an elevated temperature.

The bake may be carried out at one or more temperatures within the temperature range of about 70° C. to about 150° C. Preferably the temperature range is about 80° C. to about 130° C., more preferably the temperature range is about 90° C. to about 120° C. and most preferably the coatings are baked from about 100° C. to about 120° C.

The duration of the bake is for several minutes to half an hour, depending on the method used to evaporate the remaining solvent. Any suitable baking means may be employed. Examples of suitable baking means include, but are not limited to, hot plates and convection ovens. The resulting dry film has a thickness of from about 3 to about 50 microns or more preferably from about 4 to about 20 microns or most preferably from about 5 to about 15 microns.

After the bake step, the resulting dry film is exposed to actinic rays in a preferred pattern through a mask. X-rays, electron beam, ultraviolet rays, visible light, and the like can be used as actinic rays. The most preferred rays are those with wavelength of 436 nm (g-line) and 365 nm (i-line).

Following exposure to actinic radiation, it may be advantageous to heat the exposed and chemically amplified positive working photosensitive PBO precursor composition coated substrate to a temperature between about 70° C. to about 150° C. Preferably the temperature range is about 80° C. to about 140° C. More preferably the temperature range is about 90° C. to about 130° C. Most preferably the temperature range is about 100° C. to about 130° C.

The exposed and coated substrate is heated in this temperature range for a short period of time, typically several seconds to several minutes and may be carried out using any suitable heating means. Preferred means include baking on a hot plate or in a convection oven. This process step is commonly referred to in the art as post-exposure baking Next, the film is developed using an aqueous developer and a relief pattern is formed. The aqueous developer contains a water soluble base. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddle, or other similar developing methods at temperatures from about 10° C. to about 40° C. for about 30 seconds to about 5 minutes. After development, the relief pattern may be optionally rinsed using deionized water and dried by spinning, baking on a hot plate, in an oven, or other suitable means.

Following development, in an optional step it may be advantageous to heat the exposed, coated and developed substrate to a temperature between about 70° C. to about 220° C. Preferably the temperature range is about 80° C. to about 210° C. More preferably the temperature range is about 80° C. to about 200° C. The most preferred temperature range is about 90° C. to about 180° C. The exposed, coated and developed substrate is heated in this temperature range for a short period of time, typically several seconds to several minutes and may be carried out using any suitable heating means. Preferred means include baking on a hot plate or in a convection oven. This process step is commonly referred to in the art as post-develop baking.

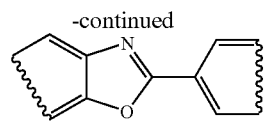
-continued

Formation of polybenzoxazole ring are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably, under a blanket of nitrogen and may be carried by any suitable heating means. Preferred means include baking on a hot plate, a convection oven, tube furnace, vertical tube furnace, or rapid thermal processor. Alternatively, curing may be effected by the action of microwave or infrared radiation.

To illustrate the present disclosure, the following examples are provided. It should be understood that the present disclosure is not limited to the examples described.

Synthesis Example 1

Preparation of Polybenzoxazole Precursor Polymer

An Example of Structure III

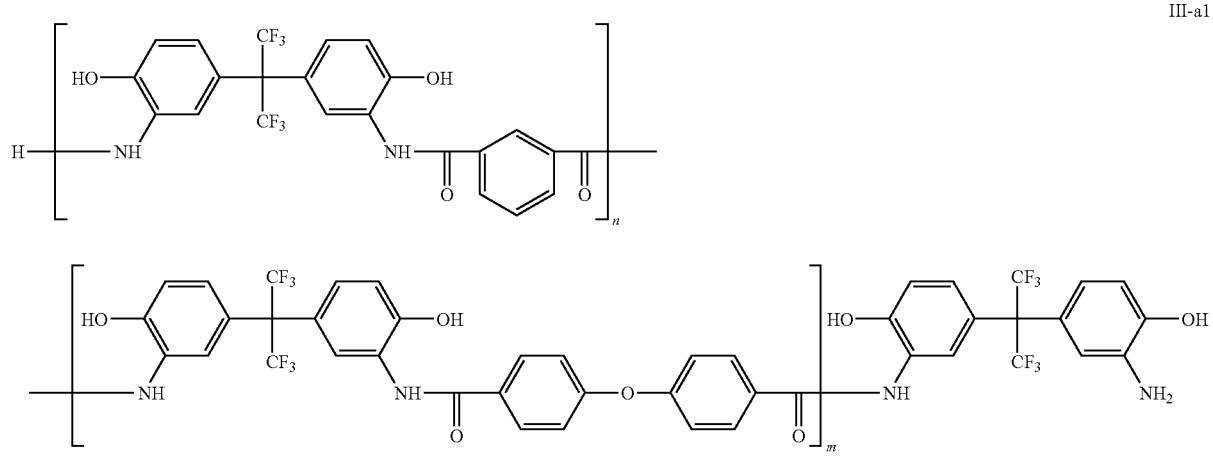

The benzoxazole ring is then formed by curing of the uncured relief pattern to obtain the final high heat resistant pattern. Curing is performed by baking the developed, uncured relief pattern at or above the glass transition temperature $T_g$ of the positive working photosensitive PBO precursor composition to obtain the benzoxazole ring that provides high heat resistance. Typically, temperatures above about 200° C. are used. Preferably, temperatures from about 250° C. to about 400° C.

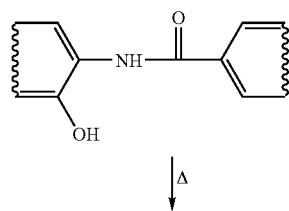

To a 2 liter, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane, 64.3 g (794.9 mmol) of pyridine, and 637.5 g of N-methylpyrrolidone (NMP) were added. The solution was stirred at room temperature until all solids dissolved, and then cooled in an ice water bath at 0-5° C. To this solution, 38.7.3 g (191 mmol) of isophthaloyl chloride, and 56.0 g (191 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred deionized water. The polymer was collected by filtration and washed with deionized water and a water/methanol (50/50) mixture. The polymer was dried under vacuum conditions at 40° C. for 24 hours.

The yield was almost quantitative and the inherent viscosity (iv) of the polymer was 0.175 dl/g measured in NMP at a concentration of 0.5 g/dl at 25° C.

Synthesis Example 2

Preparation of a PBO Precursor Polymer End Capped with an Imide Endcap

An Example of Structure VII*

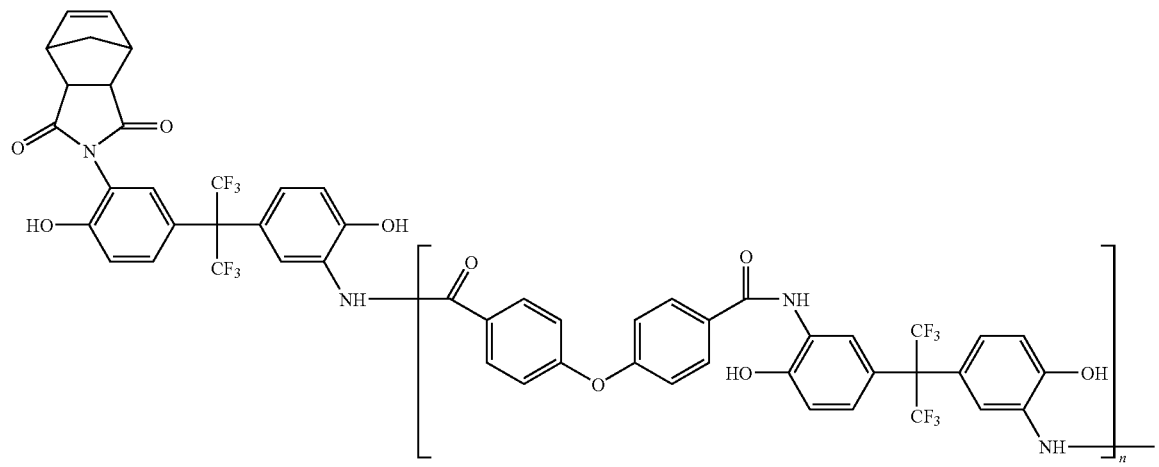

(VII*-a1)

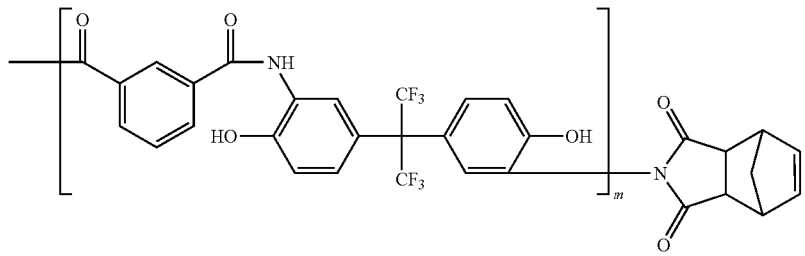

A PBO precursor polymer prepared in the same way as in Synthesis Example 1 (200 g) was dissolved in a mixture of 600 g of diglyme and 300 g of propylene glycol methyl ether acetate (PGMEA). Residual water was removed as an azeotrope with PGMEA and diglyme using a rotary evaporator at 65° C. (10-12 torr). About 550 g of solvent was removed during the azeotropic distillation. The reaction solution was placed under a $N_2$ blanket and equipped with a magnetic stirrer. Nadic anhydride (7 g) was added to the solution and followed by the addition of 10 g of pyridine. The reaction was stirred overnight at 50° C. Then the reaction mixture was diluted with 500 g of tetrahydrofuran (THF) and precipitated into 8 liters of a 50:50 methanol:water mixture. The polymer was collected by filtration and vacuum dried at 80° C.

The yield was almost quantitative and the inherent viscosity (iv) of the polymer was 0.20 dl/g measured in NMP at a concentration of 0.5 g/dl at 25° C.

Synthesis Example 3

Alternative Method for Preparation of a PBO Precursor Polymer End Capped with an Imide Endcap An Example of Structure VII*

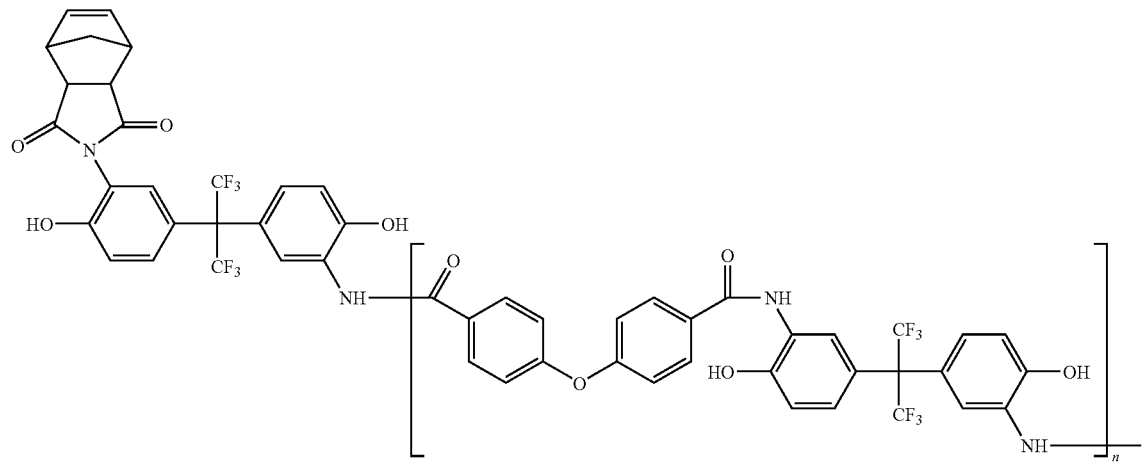

(VII*-a1)

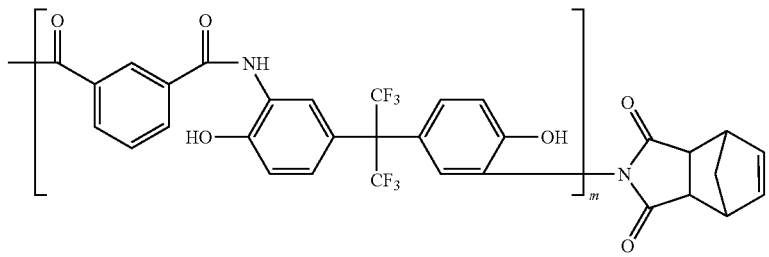

To a 2 liter, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane, 64.3 g (794.9 mmol) of pyridine, and 637.5 g of N-methylpyrrolidone (NMP) were added. The solution was stirred at room temperature until all solids dissolved, and then cooled in an ice water bath at 0-5° C. To this solution, 38.7.3 g (191 mmol) of isophthaloyl chloride, and 56.0 g (191 mmol) of 1,4-oxydibenzoyl chloride dissolved in 427.5 g of NMP, were added drop-wise. After the addition was completed, the resulting mixture was stirred at room temperature for 18 hours. Nadic anhydride (37 g) was added to the solution and followed by the addition of 52.8 g of pyridine. The reaction was stirred overnight at 50° C.

The viscous solution was precipitated in 10 liters of vigorously stirred deionized water. The polymer was collected by filtration and washed with deionized water and a water/methanol (50/50) mixture. The polymer was dried under vacuum conditions at 40° C. for 24 hours.

The yield was almost quantitative and the inherent viscosity (iv) of the polymer was 0.20 dl/g measured in NMP at a concentration of 0.5 g/dl at 25° C.

Synthesis Example 4

Preparation of a PBO Precursor Blocked with Ethyl Vinyl Ether

An Example of II*

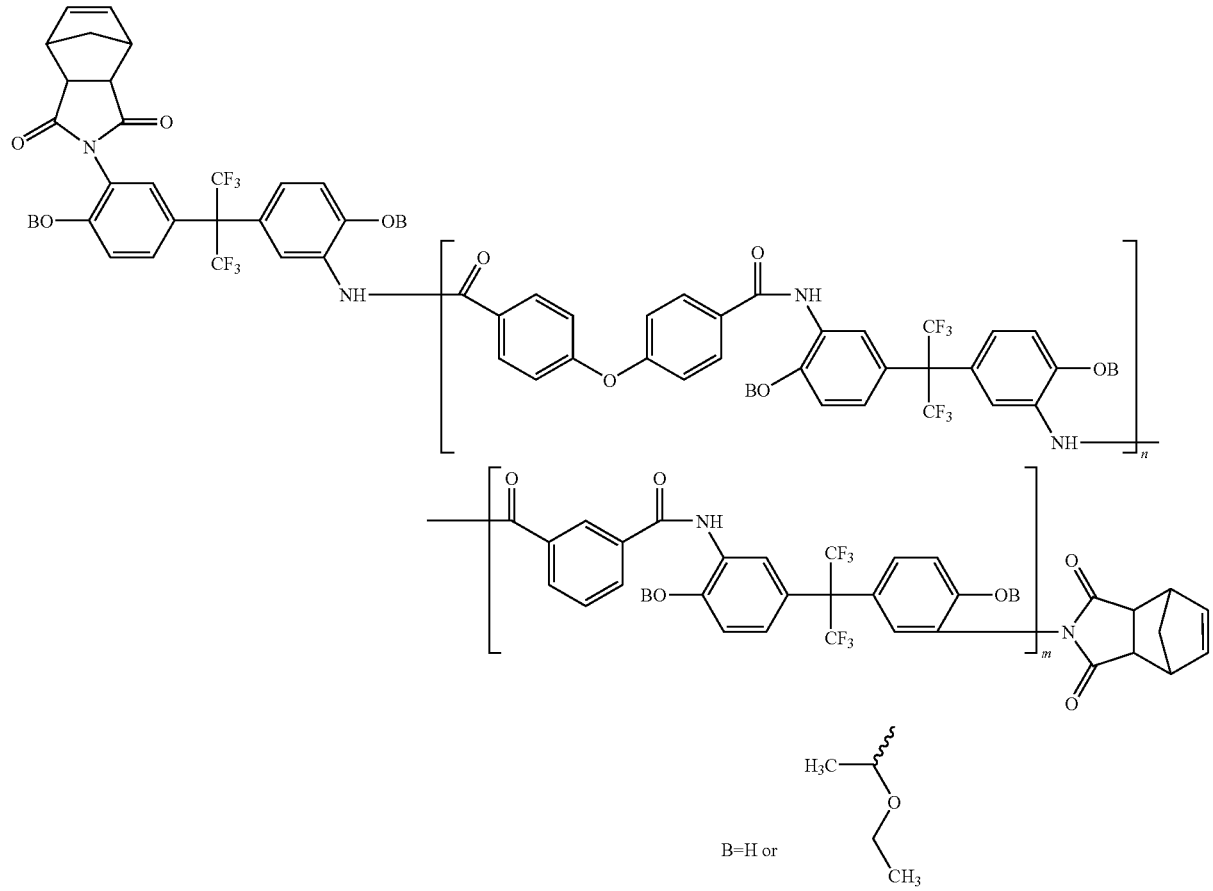

(II*-a2)

A polymer prepared in the same way as in Synthesis Example 2 (or alternatively Synthesis Example 3) (95.76 g) was dissolved in 543 g of propylene glycol methyl ether acetate (PGMEA). Residual water was removed as an azeotrope with propylene glycol methyl ether acetate (PGMEA) using a rotary evaporator at 65° C. (10-12 torr). About 262.5 g of solvent was removed during the azeotropic distillation. The reaction solution was placed under a $N_2$ blanket and equipped with a magnetic stirrer. Ethyl vinyl ether (7.46 g) was added via syringe. 5.41 g of 2 wt % solution of p-toluene sulfonic acid in PGMEA was then added drop-wise. The reaction mixture was stirred for 2 hrs at 25° C. NMR analysis indicated that 16% of the OH groups were blocked. Additional ethyl vinyl ether (2.98 g) was added. The reaction mixture was stirred for another two hours and NMR analysis showed that 28.3% of OH groups were blocked. Triethylamine (8.64 g of 2% solution in PGMEA) was added. 146.8 g acetone, 78.5 g hexane and 116.9 g deionized water were then added consecutively. The solution was stirred for a few minutes. Then, by using a separatory funnel, the organic phase was separated from the aqueous phase. To the organic phase was added 78.6 g of acetone and 63.0 g of deionized water and the mixture was shaken for a few minutes. The organic phase was again separated from the aqueous phase. This process was repeated two more times each with 78.6 g of acetone and 63.0 g of deionized water. The resulting solution was then concentrated to 50% solids by using a rotary evaporator at 65° C. (10-12 torr).

Example 1

A positive acting photosensitive composition was prepared by mixing 200 parts by weight of a polymer solution prepared by the method described in Synthesis Example 4, 3 parts by weight of triethoxysilylpropyl ethoxycarbamate, 0.102 parts by weight of 1,8-diazabicyclo[5.4.0]undec-7-ene (DBU), 5 parts by weight of (5-propylsulfonyloxyimino-5H-thiophen-2-ylidene)-2-methylphenyl-acetonitrile, 10 parts by weight tripropylene glycol, 20 parts by weight of additional PGMEA, and 30 parts by weight GBL and filtered through a 0.2 μm Teflon filter.

A silicon wafer was then coated with the photosensitive composition from above and hotplate baked for 3 minutes at 125° C., resulting in a film thickness of 9.04 μm. The film was exposed utilizing an i-line stepper with a patterned exposure array. Segments of the film on the wafer were exposed at various levels of exposure energy using a Canon 4000 IE i-line stepper. The wafer was post exposure baked at 130° C. for 90 seconds. The wafer was developed with 2.38% aqueous TMAH solution using two 30 second puddle development steps with spin steps to remove spent developer in between applications of developer. The developed film was rinsed with deionized water and dried by spinning for 10 seconds at 5000 rpm to provide a relief pattern. No unexposed film thickness loss was observed. 2 μm and 8 μm features were resolved at exposure energies of 200 mJ/cm² and 175 mJ/cm² respectively.

Examples 2-4 and Comparative Example 1

In Examples 2-4 and Comparative Example 1, all the formulations were exactly as that of Example 1 except the amount of 1,8-diazabicyclo[5.4.0]undec-7-ene (DBU) was different. The formulations were tested lithographically employing the process described in Example 1. The amount of DBU in the formulation and the exposure required to clear 2 and 8 μm via pads are summarized in Table 1.

TABLE 1

Results of photospeed measurements for Examples 2-4 and Comparative Example 1

| Example Number | Amount of DBU (parts by weight) | Photospeed (mJ/cm²) 2 μm via | Photospeed (mJ/cm²) 8 μm via |
|---|---|---|---|
| 2 | 0.205 | 300 | 275 |
| 3 | 0.307 | 450 | 425 |
| 4 | 0.41 | 600 | 525 |
| Comparative 1 | 0 | 125 | 100 |

In every case full film thickness retention on unexposed areas were achieved. The addition of the basic compound decreased the photospeed (raised the amount of exposure required). Variations of the photospeed caused by batch to batch variation in the polymer can be overcome by adjusting the basic compound concentration. Comparison Example 1 also showed that the photospeed of the composition was too fast to be practical for large scale manufacturing of semiconductor devices. The shutters of I-line steppers were not designed to operate with such fast photospeeds and thus yield inconsistent exposure doses at such photospeeds. Addition of the DBU basic compound decreased the photospeed to an exposure dose that can be reproducibly controlled.

Synthesis Example 5

Preparation of PBO Precursor Blocked with Ethyl Vinyl Ether (18% Blocking Level) (An Example of II*)

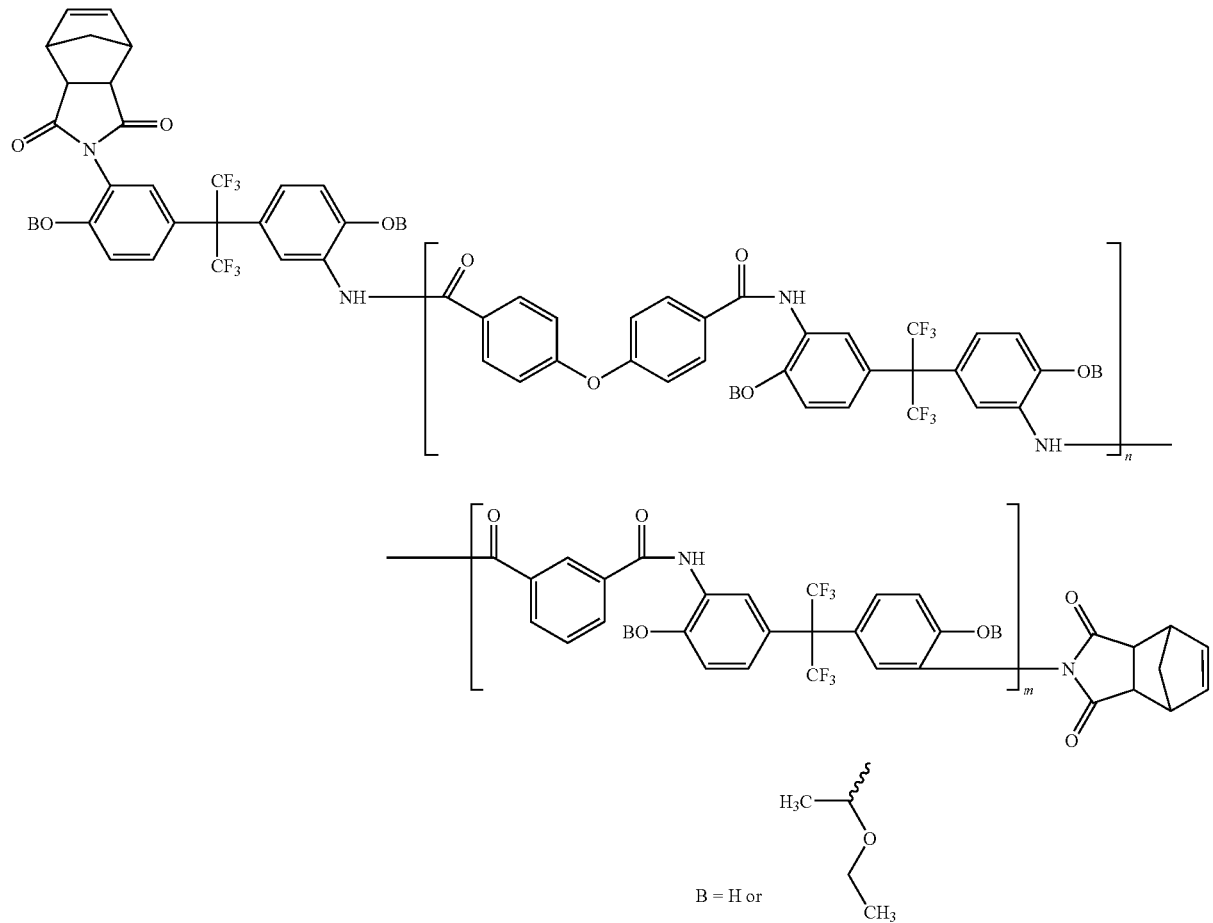

(II*-a2)

Synthesis Example 4 was repeated except that a lower amount of ethyl vinyl ether (4.90 g) was used. $^1$H NMR showed that ~18.3% of the OH groups in the PBO precursor were blocked with ethyl vinyl ether.

Example 5

A positive acting photosensitive composition was prepared by mixing 200 parts by weight of a polymer solution prepared by the method described in Synthesis Example 5, 3 parts by weight of triethoxysilylpropyl ethoxycarbamate, 0.1 parts by weight of 1,8-diazabicyclo[5.4.0]undec-7-ene (DBU), 5 parts by weight of (5-propylsulfonyloxyimino-5H-thiophen-2-ylidene)-2-methylphenyl-acetonitrile, 10 parts by weight tripropylene glycol, 20 parts by weight of additional PGMEA, and 30 parts by weight GBL and filtered through a 0.2 μm Teflon filter.

The formulation described above was tested using the lithographic process described in Example 1. The film thickness obtained was 9 μm. The photospeed was 209 mJ/cm$^2$ for 8 μm features and the unexposed film thickness loss was 1.70%.

Examples 6-9 and Comparative Example 2

In Examples 6-9 and Comparative Example 2 all the formulations were exactly as the formulation of Example 5 except the amount of 1,8-diazabicyclo[5.4.0]undec-7-ene (DBU) was different. The formulations were tested lithographically using the procedure described in Example 1. The amount of DBU and the exposure required to open 8 μm vias are listed in Table 2. Addition of a base surprisingly helped to decrease unexposed film thickness loss.

TABLE 2

Results of photospeed measurements for Examples 6-9 and Comparative Example 2.

| Example Number | Amount of DBU (parts by weight) | Photospeed (mJ/cm$^2$) | Film Thickness Loss (FTL, %) |
|---|---|---|---|
| 6 | 0.2 | 282 | 2.00 |
| 7 | 0.3 | 383 | 0.98 |
| 8 | 0.4 | 559 | 1.65 |
| 9 | 0.5 | 667 | 1.85 |
| Comparative 2 | 0 | 123 | 2.46 |

Examples 10-15

In Examples 10-15 all the formulations were exactly the same as the formulation of Example 1 except the identity of the basic compound and the concentration of it were varied. The lithographic process for Examples 10-15 was the same as Example 1. The basic compound, its concentration, and the exposure required to clear a 8 μm via pad are summarized in Table 3. The molar amount of basic compound in Examples 11-15 is equal to that of Example 10.

TABLE 3

| Example # | Name | Amount of basic compound (parts by wt) | Structure | Photospeed (mJ/cm$^2$) |
|---|---|---|---|---|
| 10 | 1,8-diazabicyclo-[5.4.0]-undec-7-ene | 0.15 | | 217.5 |
| 11 | triethanolamine | 0.15 | | 305 |
| 12 | N,N-dicyclohexyl-methylamine | 0.19 | | 365 |
| 13 | N-methyl-morpholine | 0.10 | | 150 |

TABLE 3-continued

| Example # | Name | Amount of basic compound (parts by wt) | Structure | Photospeed (mJ/cm$^2$) |
|---|---|---|---|---|
| 14 | tris[2-(2-methoxyethoxy)-ethyl]amine | 0.32 | | 260 |
| 15 | N,-dibutylaniline | 0.20 | | 137.5 |

The results showed all of the basic compounds in Examples 11-15 decreased the photospeeds of the formulations.

Examples 16-18

In Examples 16-18, all the formulations were exactly the same as the formulation of Example 1 except the identity of the basic compound and the concentration of it were varied. The lithographic process for Examples 16-18 was the same as Example 1. The basic compound, its concentration, and the exposure required to clear a 8 μm via pad are summarized in Table 4.

TABLE 4

| Example # | Name | Amount of basic compound (parts by wt) | Structure | Photospeed (mJ/cm$^2$) |
|---|---|---|---|---|
| 16 | 1,8-diazabicyclo-[5.4.0]-undec-7-ene | 0.15 | | 217.5 |
| 17 | N-phenyl diethanolamine | 0.166 | | 125 |
| 18 | N-phenyl diethanolamine | 0.238 | | 125 |

The results showed all of the basic compounds in Examples 16-18 decreased the photospeeds of the formulations Example 19

A positive acting photosensitive composition was prepared by mixing 200 parts by weight of a polymer solution prepared by the method described in Synthesis Example 3 except that the amount of blocked OH groups was 27.8% instead of 28.3%, 3 parts by weight of triethoxysilylpropyl ethoxycarbamate, 0.217 parts by weight of 1,8-diazabicyclo[5.4.0]undec-7-ene (DBU), 5 parts by weight of the additive shown below (TRISP-PA), available from Honshu Chemicals, 5 parts by weight of (5-propylsulfonyloxyimino-5H-thiophen-2-ylidene)-2-methylphenyl-acetonitrile, 10 parts by weight tripropylene glycol, 26 parts by weight of additional PGMEA, and 30 parts by weight GBL and filtered through a 0.2 µm Teflon filter.

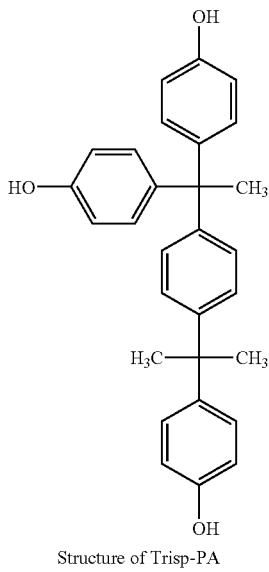 [SMILES: CC(C)(c1ccc(O)cc1)c1ccc(C(C)(c2ccc(O)cc2)c2ccc(O)cc2)cc1]

Structure of Trisp-PA

A 500 g sample of this composition was kept at 25° C. Each week a 40 g aged sample was frozen. All lithographic samples were tested on the same day using the lithographic procedure described in Example 1. The results of lithographic evaluation are shown in Table 5.

TABLE 5

Results of lithographic evaluation for composition of Example 19 at 25° C.

| Formulation # | Time (Days) | Photospeed ($E_0$, mJ/cm$^2$) | Film Thickness Loss (FTL, %) |
|---|---|---|---|
| Example 19-1 | 0 | 169 | −0.93 |
| Example 19-2 | 7 | 170 | −0.85 |
| Example 19-3 | 14 | 164 | −0.66 |
| Example 19-4 | 21 | 166 | −0.54 |
| Example 19-5 | 28 | 160 | −0.31 |
| Example 19-6 | 35 | 158 | −0.55 |
| Example 19-7 | 42 | 157 | −0.15 |
| Example 19-8 | 49 | 158 | −0.47 |
| Example 19-9 | 56 | 162 | −1.19 |
| Example 19-10 | 63 | 161 | −1.25 |

From these results one can conclude that composition of Example 19 was surprisingly stable relatively to compositions without the basic compound for photospeed.

Comparative Example 3

A composition similar to Example 19 was prepared except no DBU was used. The results of lithographic evaluation are shown in Table 6.

TABLE 6

Results of lithographic evaluation on various aged samples of Comparative Example 3

| Formulation # | Time (Days) | $E_0$ (mJ/cm$^2$) | FTL (%) |
|---|---|---|---|
| Comparative Example 3-1 | 0 | 84.5 | −1.41 |
| Comparative Example 3-2 | 7 | 80.7 | −1.91 |
| Comparative Example 3-3 | 13 | 79.8 | −1.51 |
| Comparative Example 3-4 | 22 | 77.6 | −1.58 |
| Comparative Example 3-5 | 28 | 74.6 | −1.72 |
| Comparative Example 3-6 | 35 | 74.1 | −1.28 |
| Comparative Example 3-7 | 49 | 72.6 | −1.29 |
| Comparative Example 3-8 | 63 | 69.7 | −1.43 |

The presence of the base improved the lithographic stability of the composition by a factor of more than 3.5. These results clearly prove that presence of base is highly advantageous for shelf life stability of these compositions.

Example 20

A positive acting photosensitive composition was prepared by mixing 200 parts by weight of a polymer solution prepared by the method described in Synthesis Example 4, 3 parts by weight of triethoxysilylpropyl ethoxycarbamate, 0.13 parts by weight of 1,8-diazabicyclo[5.4.0]undec-7-ene (DBU), 5 parts by weight of N-hydroxynaphtalimide trifluoromethanesulfonate (NIT), 10 parts by weight of Tris-PA, 10 parts by weight tripropylene glycol, 20 parts by weight of additional PGMEA, and 30 parts by weight GBL and filtered through a 0.2 µm Teflon filter.

A silicon wafer was then coated with the photosensitive composition from above and hotplate baked for 2 minutes at 120° C., resulting in a film thickness of 8.97 µm. The film was exposed utilizing an i-line stepper with a patterned exposure array. Segments of the film on the wafer were exposed at various levels of exposure energy using a Canon 4000 IE i-line stepper. The wafer was post exposure baked at 120° C. for 90 seconds. The wafer was developed with 2.38% aqueous TMAH solution in a 60 second puddle development steps. The developed film was rinsed with deionized water and dried by spinning for 10 seconds at 5000 rpm to provide a relief pattern. Unexposed film thickness loss was 5.28%. 8 µm features were resolved at an exposure energy of 100 mJ/cm$^2$.

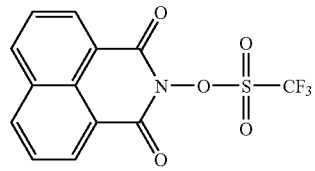 [SMILES: O=C1c2cccc3cccc(c23)C(=O)N1OS(=O)(=O)C(F)(F)F]

Structure of N-hydroxynaphthalimide trifluoromethanesulfonate (NIT)

A higher base concentration will be necessary to slow the photospeed of compositions containing PAGs which generate strong acids such as perfluoromethanesulfonic acids after exposure.

Synthesis Example 6

Preparation of a PBO Precursor Polymer

An Example of Structure III*, n/m=4/1

(III*-a1, n/m = 4/1)

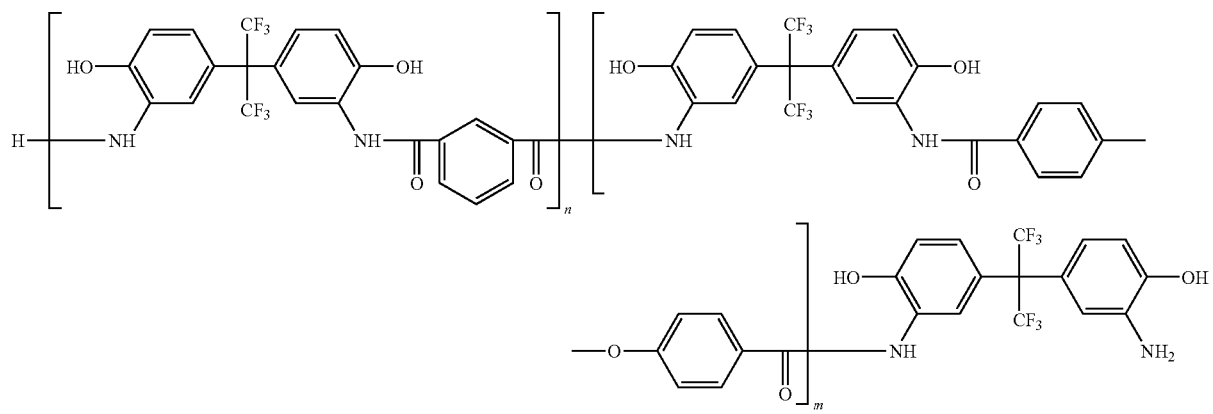

The procedure was the same as described in Synthesis Example 1, except that molar ratio of 1,4-oxydibenzoyl chloride to isophthaloyl chloride was changed from 1/1 to 4/1.

The yield was almost quantitative and the inherent viscosity (iv) of the polymer was 0.179 dl/g measured in NMP at a concentration of 0.5 g/dl at 25° C.

Synthesis Example 7

Preparation of a PBO Precursor Polymer End Capped with an Imide Endcap

An Example of Structure VII* n/m=4/1

(VII*-a1, n/m = 4/1)

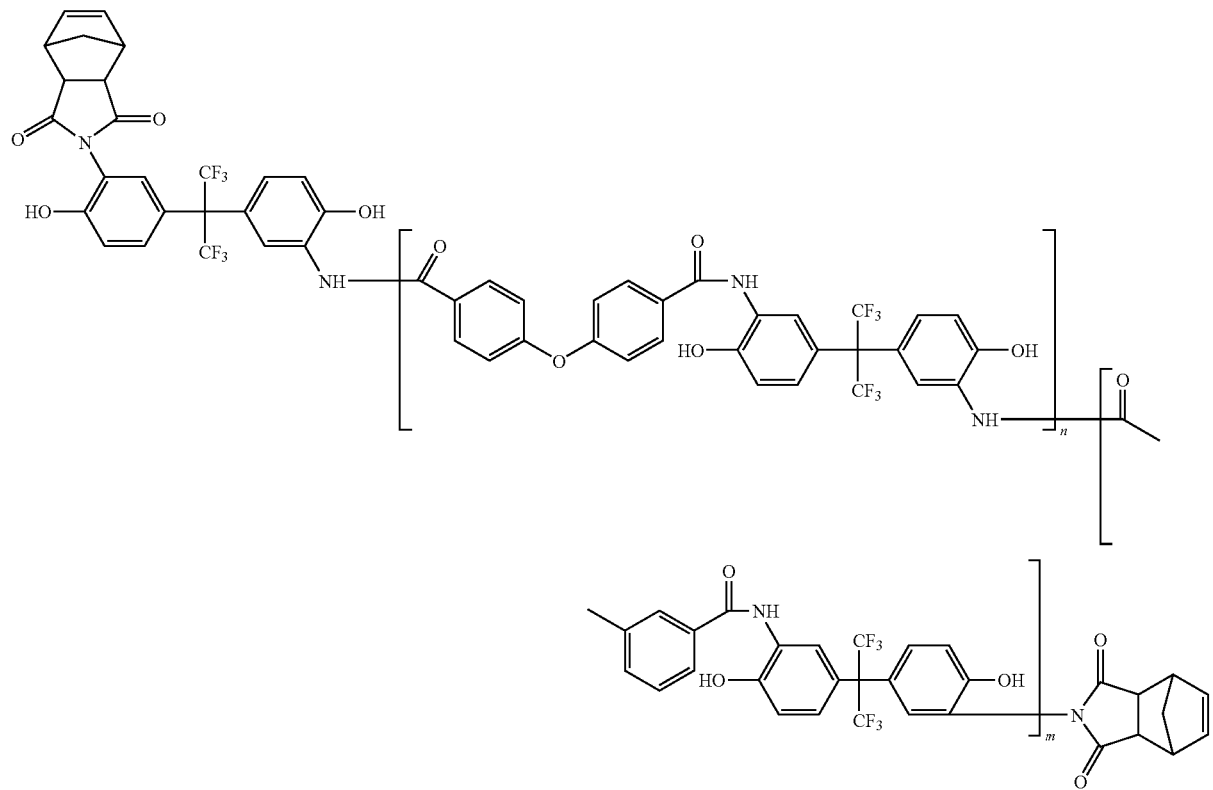

The same procedure was used as Synthesis Example 2 except the polymer obtained in Synthesis Example 6 was used.

The yield was almost quantitative and the inherent viscosity (iv) of the polymer was 0.177 dl/g measured in NMP at a concentration of 0.5 g/dl at 25° C.

Synthesis Example 8

Preparation of a PBO Precursor Blocked with Ethyl Vinyl Ether

An Example of II*

(DBU), 5 parts by weight of (5-propylsulfonyloxyimino-5H-thiophen-2-ylidene)-2-methylphenyl-acetonitrile, 10 parts by weight tripropylene glycol, 10 parts by weight of propylene carbonate, 35 parts by weight of additional PGMEA, and 30.7 parts by weight GBL and filtered through a 0.2 µm Teflon filter.

A silicon wafer was then coated with the photosensitive composition from above and hotplate baked for 3 minutes at 80° C., resulting in a film thickness of 8.56 µm. The film was exposed utilizing an i-line stepper with a patterned exposure array. Segments of the film on the wafer were exposed at various levels of exposure energy using a Canon 4000 IE i-line stepper. The wafer was post exposure baked at 100° C.

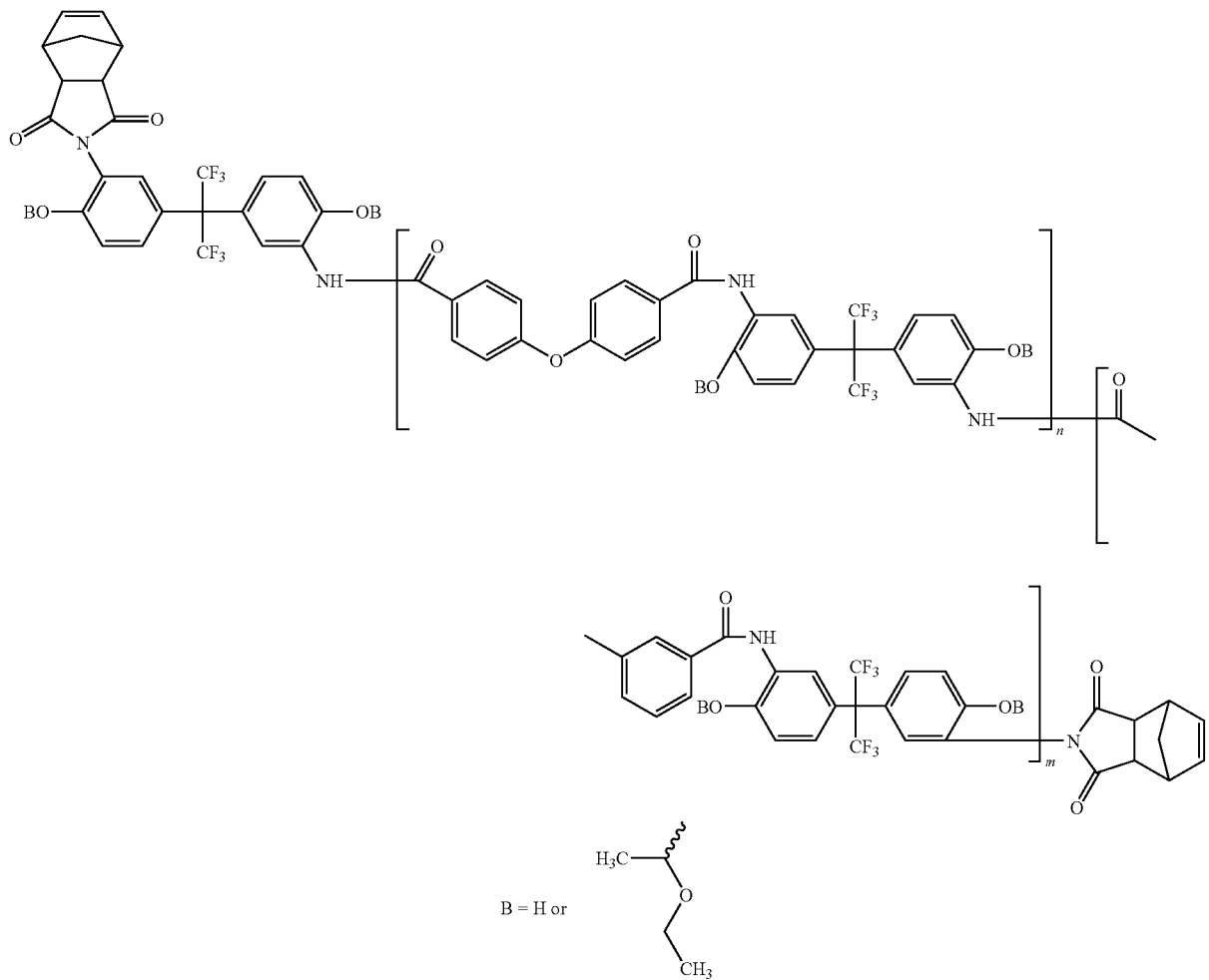

(II*-a1, n/m = 4/'1)

The same procedure was used as Synthesis Example 4 except the polymer obtained in Synthesis Example 7 was used. The solid contend of the polymer solution was 51%.

Example 21

A positive acting photosensitive composition was prepared by mixing 200 parts by weight of a polymer solution prepared by the method described in Synthesis Example 8, 7 parts by weight of triethoxysilylpropyl ethoxycarbamate, 7 parts by weight (3-glycidoxypropyl)trimethoxysilane, 0.105 parts by weight of 1,8-diazabicyclo[5.4.0]undec-7-ene for 90 seconds. The wafer was developed with 2.38% aqueous TMAH solution using two 60 second puddle development steps with spin steps to remove spent developer in between applications of developer. The developed film was rinsed with deionized water and dried by spinning for 10 seconds at 5000 rpm to provide a relief pattern. The film thickness after development was 8.30 µm. Unexposed film thickness loss was 3.06%. 8 µm features were resolved at exposure energy of 350 mJ/cm². These features were carefully investigated by SEM and no chemical undercut was observed.

Comparative Example 4

The same positive acting photosensitive composition was prepared as in Example 21 except no 1,8-diazabicyclo[5.4.0] undec-7-ene (DBU) was used.

A silicon wafer was then coated with the photosensitive composition from above and hotplate baked for 3 minutes at 80° C., resulting in a film thickness of 8.40 μm. The film was exposed utilizing an i-line stepper with a patterned exposure array. Segments of the film on the wafer were exposed at various levels of exposure energy using a Canon 4000 IE i-line stepper. The wafer was post exposure baked at 100° C. for 90 seconds. The wafer was developed with a fresh 2.38% aqueous TMAH solution using two standing 60 second puddle development steps with spin steps to remove spent developer in between applications of developer. The developed film was rinsed with deionized water and dried by spinning for 10 seconds at 5000 rpm to provide a relief pattern. The film thickness after development was 8.06 μm. Unexposed film thickness loss was 3.42%. 8 μm features were resolved at exposure energy of 300 mJ/cm². These features were carefully investigated by SEM and some chemical undercut was observed.

The results of Example 21 and Comparative Example 4 unexpectedly and surprisingly showed that presence of a base can remove chemical undercut of a film made by this composition.

Example 22

A positive acting photosensitive composition was prepared by mixing 200 parts by weight of a polymer solution prepared by the method described in Synthesis Example 4, 2 parts by weight of 2-(3,4-epoxycyclohexyl)ethyltrimethoxysilane, 0.2 parts by weight of 1,4-dimethylpiperazine, 6 parts by weight of (5-propylsulfonyloxyimino-5H-thiophen-2-ylidene)-2-methylphenyl-acetonitrile, 6 parts by weight of propylene carbonate, 4 parts by weight of 4,4'-sulfonyl diphenol, and 57.9 parts by weight GBL and filtered through a 0.2 μm Teflon filter.

A silicon wafer was then coated with the photosensitive composition from above and hotplate baked for 3 minutes at 115° C., resulting in a film thickness of 8.54 μm. The film was exposed utilizing an i-line stepper with a patterned exposure array. Segments of the film on the wafer were exposed at various levels of exposure energy using a Canon 4000 IE i-line stepper. The wafer was post exposure baked at 135° C. for 90 seconds. The wafer was developed with 2.38% aqueous TMAH solution using one standing 60 second puddle development step. The developed film was rinsed with deionized water and dried by spinning for 10 seconds at 5000 rpm to provide a relief pattern. The film thickness after development was 8.38 μm. Unexposed film thickness loss was 1.84%. 8 μm features were resolved at an exposure energy of 520 mJ/cm².

Examples 23-27 and Comparative Examples 5 AND 6

In Examples 23-27 and Comparative Examples 5 and 6 all the formulations were exactly the same as the formulation of Example 21 except the identity of the basic compound and the concentration of it were varied. The lithographical process for Examples 23-27 and Comparative Examples 5 and 6 were the same as Example 22. The basic compound, its concentration, and the exposure required to clear a 8 μm via pad are summarized in Table 7. The molar amount of basic compound in Examples 23-27 and Comparative Example 5 is equal to that of Example 22.

TABLE 7

| Example # | Name | Amount of basic compound (parts by wt) | Structure | Photospeed (mJ/cm²) |
|---|---|---|---|---|
| 23 | Morpholine | 0.15 | 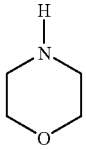 | 365 |
| 24 | 2,2,6,6-tetramethylpiperidine | 0.25 | 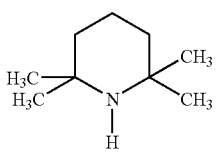 | 460 |
| 25 | N-butylhexamethyleneimine | 0.27 | 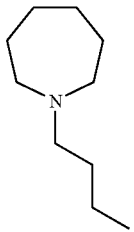 | 450 |

TABLE 7-continued

| Example # | Name | Amount of basic compound (parts by wt) | Structure | Photospeed (mJ/cm²) |
|---|---|---|---|---|
| 26 | 2,6-dimethylmorpholine | 0.20 | 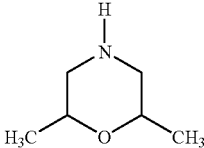 | 400 |
| 27 | N-tert-butyl isopropylamine | 0.20 | 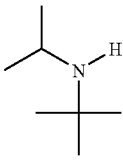 | 544 |
| Comparative Example 5 | Triphenylamine | 0.44 | 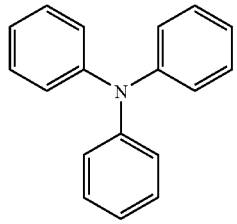 [SMILES: c1ccc(N(c2ccccc2)c2ccccc2)cc1] | 175 |
| Comparative Example 6 | None | 0 | | 190 |

In all these experiments the unexposed film thickness losses were negligible. The results of Examples 23-27 and Comparative Example 5 show that the nature of the base plays a major role in the photospeed obtained from these compositions. Surprisingly, in Comparative Example 5, the photospeed was increased rather than decreased by the addition of triphenylamine. In other words, triphenylamine can be used to increase the photospeed of a photosensitive composition described in this disclosure when the photospeed of the composition is too slow for practical purposes. For example, triphenylamine can be used in combination with a basic compound that decreases the photospeed (e.g., DBU) in a composition described in this disclosure to provide a composition having a desirable photospeed.

Synthesis Example 9

Preparation of a PBO Precursor Polymer of Structure Type VII with a p-Toluene Sulfonic Endcap

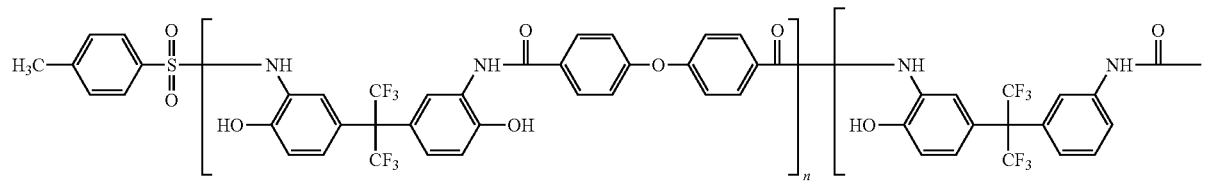

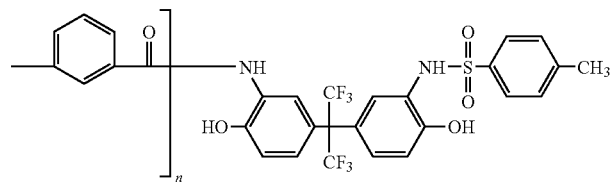

The PBO precursor polymer obtained in Synthesis Example 1 (100 g) was dissolved in a mixture of 500 g of diglyme and 300 g of propylene glycol methyl ether acetate (PGMEA). Residual water was removed as an azeotrope with PGMEA and diglyme using vacuum distillation at 65° C. (10-12 torr). About 400 g of solvents was removed during the azeotropic distillation. The reaction solution was placed under a $N_2$ blanket. The reaction mixture was cooled on an ice bath down to 5° C. and 3.2 g of pyridine was added at once followed by 8.5 g of p-toluene sulfonic acid chloride. The reaction mixture was allowed to warmed up to room temperature and stirred overnight.

The reaction mixture was precipitated into 6 liters of water while stirring. The precipitated polymer was collected by filtration and air dried overnight. Then the polymer was dissolved in 500-600 g of acetone and precipitated into 6 liters of a water/methanol (70/30) mixture. The polymer was again collected by filtration and air-dried for several hours. The still damp polymer cake was dissolved in a mixture of 700 g of THF and 70 ml of water. An ion exchange resin UP604 (40 g), available from Rohm and Haas, was added and the solution was rolled for 1 hour. The final product was precipitated in 7 liters of water, filtered, air-dried overnight followed by 24 hour drying in vacuum oven at 90° C.

$^1$H NMR analysis showed the absence of any amine peaks at ~4.5 ppm as well as the absence of aromatic peaks due to the uncapped BisAPAF unit at 6.4-6.7 ppm. This indicates that end capping was complete. The yield was 77 g.

Synthesis Example 10

Preparation of PBO Precursor Polymer of Structure Type VII Endcapped with p-Toluene Sulfonyl and Blocked with Ethyl Vinyl Ether A polymer prepared with the procedure from Synthesis Example 9 (30 g) is dissolved in 150 g of diglyme. Residual water is removed as an azeotrope with diglyme using vacuum distillation at 65° C. (10-12 torr). About 50 g of solvents is removed during the azeotrope distillation. Water content in reaction mixture ranges from 60-150 ppm. The reaction solution is placed under a $N_2$ blanket and equipped with a magnetic stirrer and cooled down to 25° C. Ethyl vinyl ether (4 ml) is added via syringe, followed by 1 ml of a 1.5 wt % solution of p-toluene sulfonic acid in PGMEA. The reaction mixture is stirred for 2 hours at 25° C. and triethyl amine (0.3 ml) is added.

The reaction mixture is precipitated into 2 liters of a water/methanol mixture (50/50) mixture. The polymer is separated by filtration, air dried for 2 hours and dissolved in 200 ml of THF. The polymer is precipitated two more times into 2 liters of a water/methanol mixture (50/50), filtered and air-dried. Then the polymer is vacuum-dried at 45° C. overnight.

$^1$H NMR shows that approximately 25-27 mol % of OH groups in the PBO precursor polymer is blocked with ethyl vinyl ether. This can be determined by integration of the acetal peak at 5.6 ppm and the phenol peak at 10.4 ppm.

Example 28

A positive acting photosensitive composition is prepared by mixing 100 parts by weight of a polymer prepared by the method described in Synthesis Example 10, 4 parts by weight of (3-glycidoxypropyl)methyldimethoxysilane, 0.5 parts by weight of a 25% solution of tetraethylammonium hydroxide in methanol, 4 parts by weight of photoacid generator shown below, 15 parts of di(propylene)glycol, 8 parts by weight of 2,2-bis(4-hydroxyphenyl)propane, and 15 parts by weight ethyl lactate and 100 parts by weight GBL and is filtered through a 0.2 μm Teflon filter.

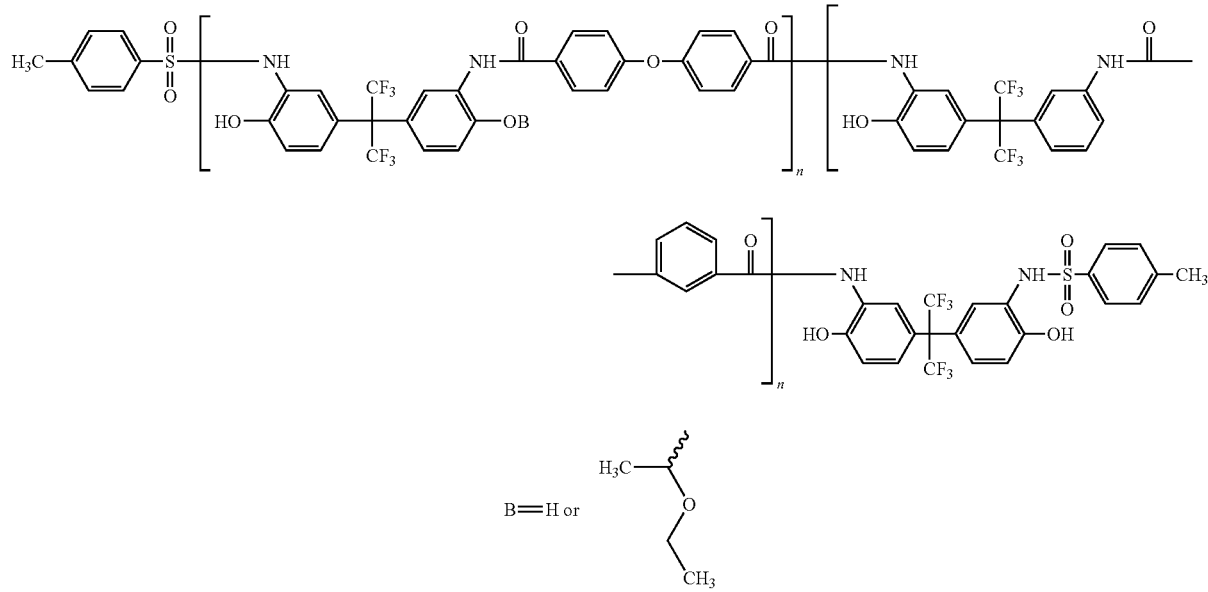

(XVI-a)

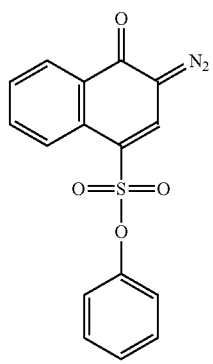

Photo Acid Generator of Example 28

A silicon wafer is then coated with the photosensitive composition from above and hotplate baked for 2 minutes at 110° C., resulting in a film thickness of 8.50 μm. The film is exposed utilizing an i-line stepper with a patterned exposure array. Segments of the film on the wafer are exposed at various levels of exposure energy using a Canon 4000 IE i-line stepper. The wafer is post exposure baked at 130° C. for 60 seconds. The wafer is developed with 2.38% aqueous TMAH solution using one 45 second puddle development step. The developed film is rinsed with deionized water and dried by spinning for 10 seconds at 5000 rpm to provide a relief pattern. 8 μm features are resolved.

Synthesis Example 11

Preparation of PBO Precursor of Structure Type II* Blocked with t-Butoxy Carbonyl Methyl (II*a BCM)

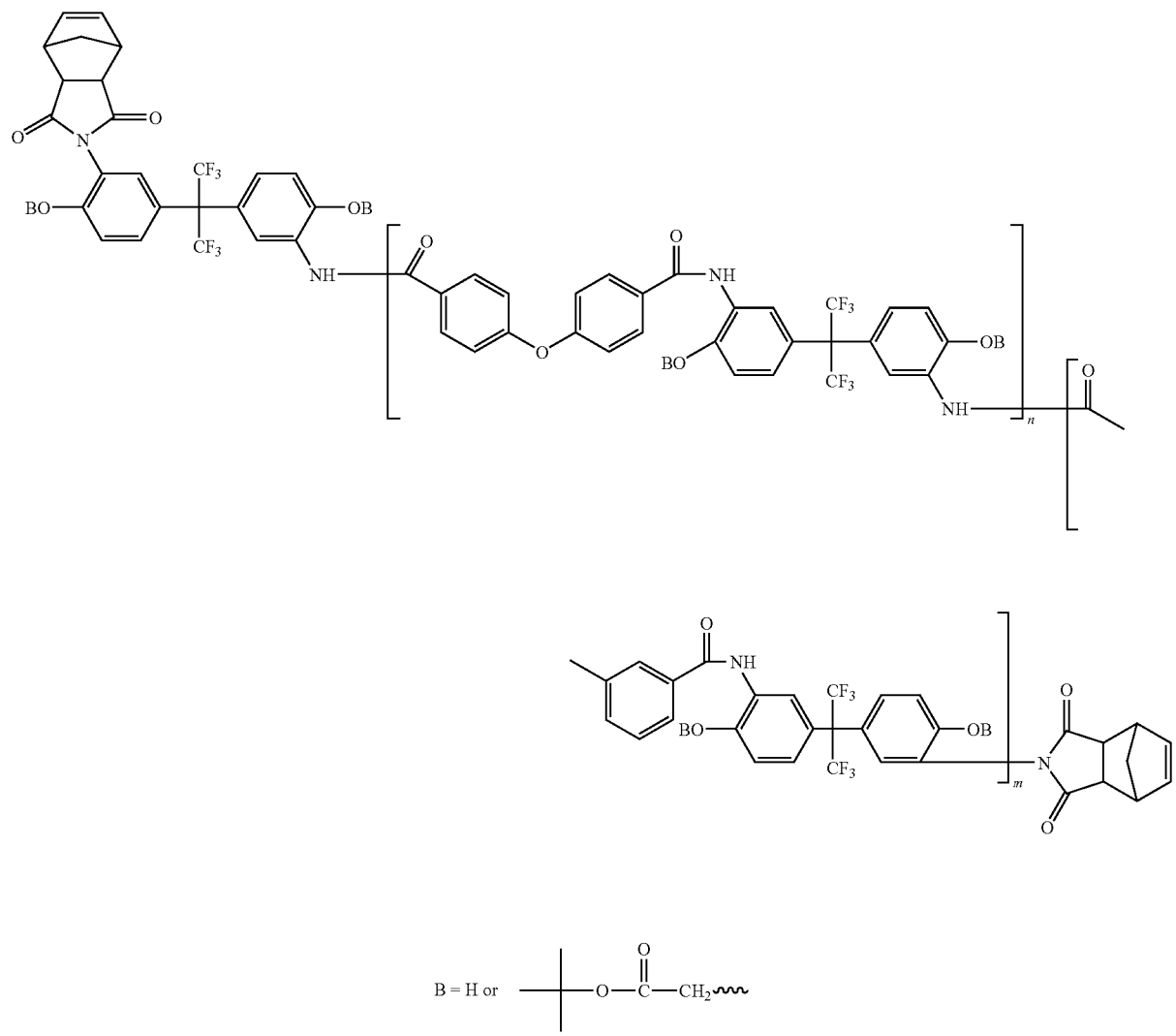

A polymer prepared in the same way as in Synthesis Example 6 (100 g) is dissolved in 1,000 g of diglyme. Residual water is removed as an azeotrope with diglyme using a rotary evaporator at 65° C. (10-12 torr). About 500 g of the solvent is removed during the azeotrope distillation. The reaction solution is placed under a $N_2$ blanket and equipped with a magnetic stirrer. t-butyl bromoacetate, (21.2 g, 107 mmol) is added, followed by 9.3 g, 117.6 mmol of pyridine. The reaction mixture is stirred for 5 hours at 40° C. The resulting mixture is added dropwise to 10 liters of water, yielding a white precipitate. The precipitate is washed 5 times with water, filtered, and dried in vacuum below 40° C. to give 101 g of t-butoxycarbonylmethyloxy-bearing polymer. The product is analyzed by proton-NMR. From a peak of phenyl at 6 to 7 ppm and peaks of t-butyl and methylene at 1 to 2 ppm, the t-butoxycarbonylmethyloxy introduction rate is calculated to be approximately 30 mole % of available OH groups.

Example 29

A positive acting photosensitive composition is prepared by mixing 100 parts by weight of a polymer prepared by the method described in Synthesis Example 11, 2.5 parts by weight of 3-cyanoypropyltrimethoxysilane, 0.2 parts by weight of N-tert-butyl isopropylamine, 3 parts by weight of photoacid generator shown below, 7.5 parts of dimethyl succinate, 6 parts by weight of Bisphenol F, 25 parts by weight ethyl lactate, 25 parts by weight of PGMEA and 65 parts by weight GBL and is filtered through a 0.2 μm Teflon filter.

Photo Acid Generator of Example 29

A silicon wafer is then coated with the photosensitive composition from above and hotplate baked for 150 seconds at 95° C., resulting in a film thickness of 8.50 μm. The film is exposed utilizing an i-line stepper with a patterned exposure array. Segments of the film on the wafer are exposed at various levels of exposure energy using a Canon 4000 IE i-line stepper. The wafer is post exposure baked at 132.5° C. for 50 seconds. The wafer is developed with 2.38% aqueous TMAH solution using one 55 second puddle development step. The developed film is rinsed with deionized water and dried by spinning for 12 seconds at 4500 rpm to provide a relief pattern. 8 μm features are resolved.

Synthesis Example 12

Preparation of Polybenzoxazole Precursor Polymer

An Example of Structure III

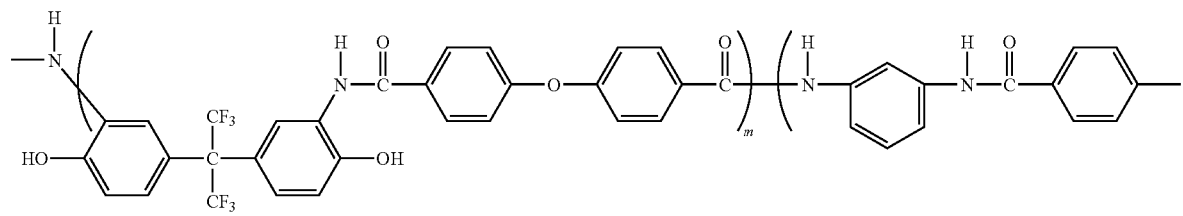

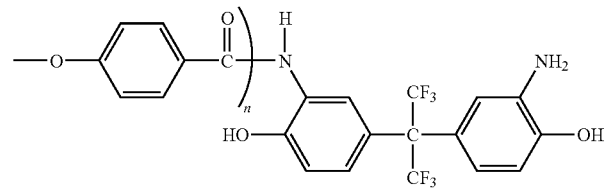

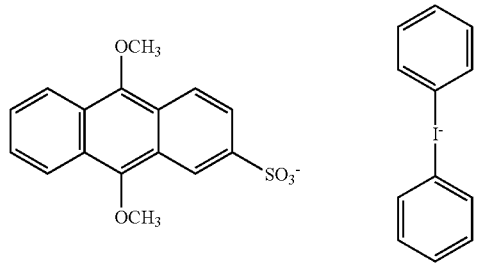

To a 2 liter, three-necked, round bottom flask equipped with a mechanical stirrer, nitrogen inlet and addition funnel, 140.31 g (383.4 mmol) of hexafluoro-2,2-bis(3-amino-4-hydroxyphenyl)propane, 4.15 g (38.34 mmol) of 1,3-phenyldiamine, 64.3 g (794.9 mmol) of pyridine, and 637.5 g of N-methylpyrrolidone (NMP) are added. The solution is stirred at room temperature until all solids dissolved, and then cooled in an ice water bath at 0-5° C. To this solution, 38.7.3 g (191 mmol) of 1,4-oxydibenzoyl chloride dissolved in 427.5 g of NMP, are added drop-wise. After the addition is completed, the resulting mixture is stirred at room temperature for 24 hours. The viscous solution is precipitated in 12 liters of vigorously stirred deionized water. The polymer is collected by filtration and washed with deionized water and a water/methanol (50/50) mixture. The polymer is dried under vacuum conditions at 40° C. for 24 hours. The yield is almost quantitative.

Synthesis Example 13
Preparation of a PBO Precursor Polymer End Capped with an Imide Endcap
An Example of Structure VII*
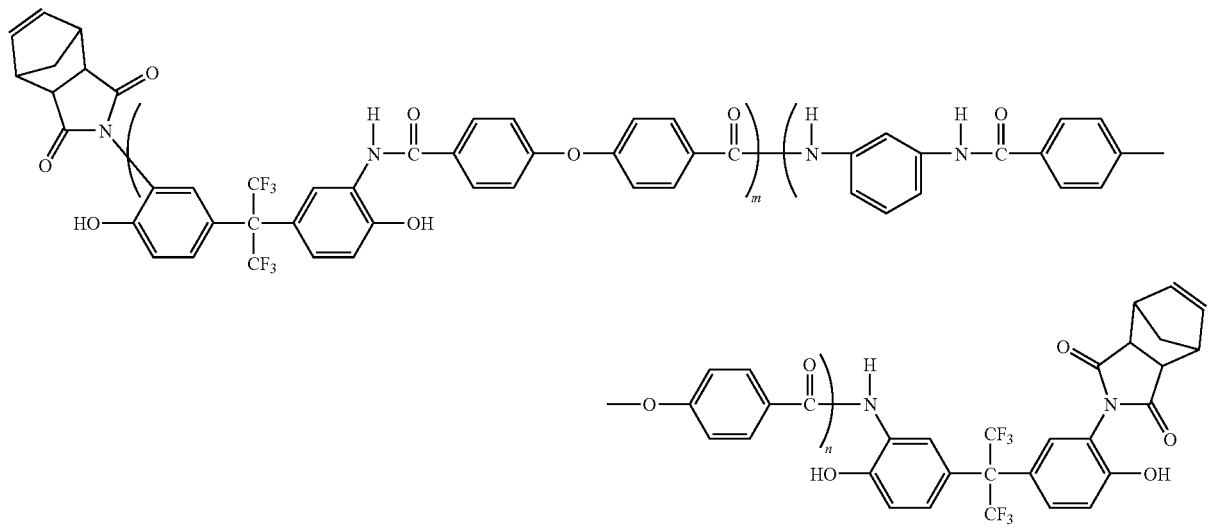
This polymer is prepared according to Synthesis Example 2 except the starting polymer is the one prepared by Synthesis Example 12.
Synthesis Example 14
Preparation of a PBO Precursor Blocked with Ethyl Vinyl Ether
An Example of II*
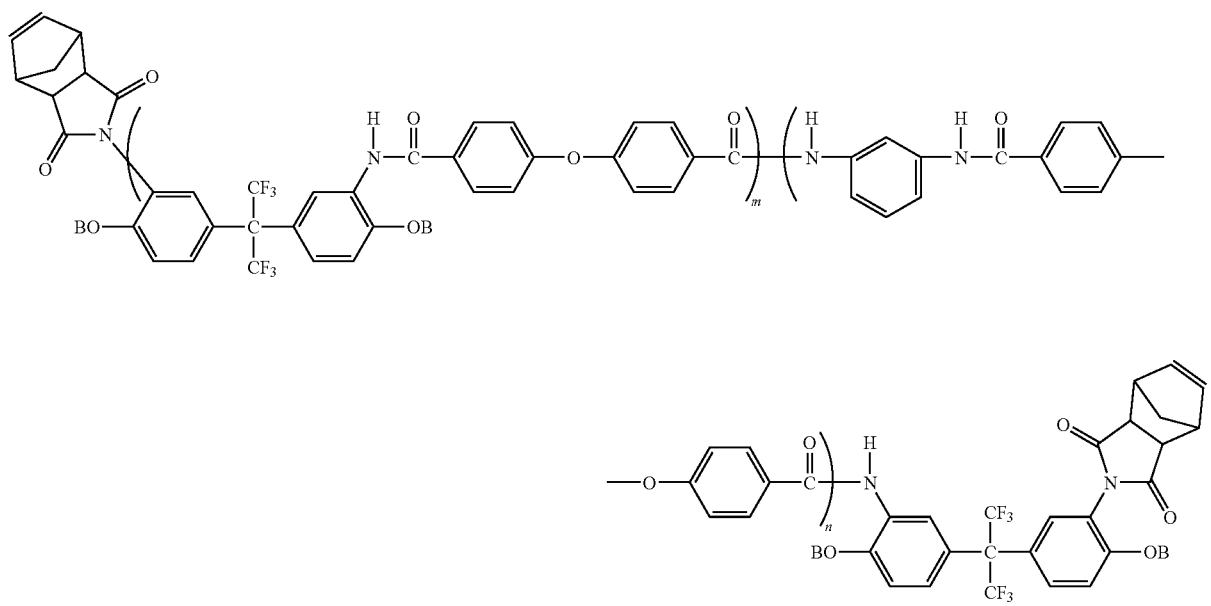

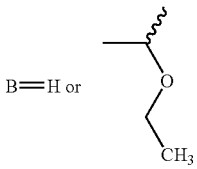

B=H or

This polymer is prepared according to Synthesis Example 4 except the starting polymer is the one prepared by Synthesis Example 13.

Example 30

A positive acting photosensitive composition is prepared by mixing 80 parts by weight of a polymer prepared by the method described in Synthesis Example 14, 120 parts by weight of a polymer prepared by the method described in Synthesis Example 4, 4 part by weight of (3-glycidoxypropyl)methyldiethoxysilane, 0.1 parts by weight of N-tert-butyl isopropylamine, 0.1 parts by weight of dicyclohexylamine, 6.5 parts by weight of photoacid generator shown below, 8 parts of 2-oxepanone co-polymer with 2-ethyl-2-(hydroxymethyl)-1,3-propanediol, 10 parts by weight of 3,3-Bis(4-hydroxyphenyl)-1,3-dihydroindol-2-one, 8 parts by weight ethyl lactate, 8 parts by weight of PGMEA and 8 parts by weight GBL and is filtered through a 0.2 µm Teflon filter.

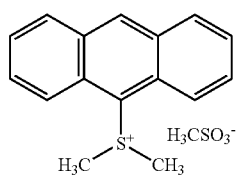

Photo Acid Generator of Example 30

A silicon wafer is then coated with the photosensitive composition from above and hotplate baked for 210 seconds at 100° C., resulting in a film thickness of 8.70 µm. The film is exposed utilizing an i-line stepper with a patterned exposure array. Segments of the film on the wafer are exposed at various levels of exposure energy using a Canon 4000 IE i-line stepper. The wafer is post exposure baked at 135° C. for 75 seconds. The wafer is developed with 2.38% aqueous TMAH solution using one 75 second puddle development step. The developed film is rinsed with deionized water and dried by spinning for 15 seconds at 4800 rpm to provide a relief pattern. 8 µm features are resolved.

Synthesis Example 15

Preparation of a Polybenzoxazole Precursor Polymer

An Example of Structure III

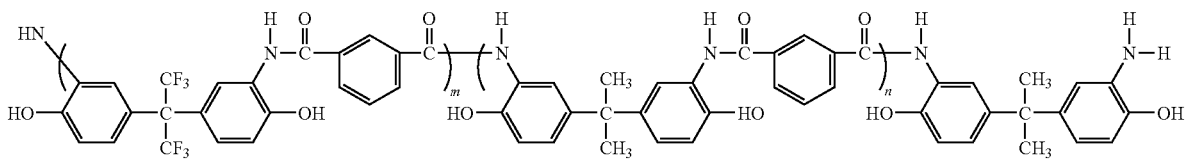

To a 2 liter, three-necked, round bottom flask equipped with a mechanical stirrer, nitrogen inlet and addition funnel, 77.94 g (213 mmol) of hexafluoro-2,2-bis(3-amino-4-hydroxyphenyl)propane, 55.02 g (213 mmol) of 2,2-bis(3-amino-4-hydroxyphenyl)propane, 64.3 g (794.9 mmol) of pyridine, and 637.5 g of N-methylpyrrolidone (NMP) are added. The solution is stirred at room temperature until all solids dissolved, and then cooled in an ice water bath at 0-5° C. To this solution, 77.4 g (382 mmol) of isophthaloyl chloride dissolved in 427.5 g of NMP, are added drop-wise. After the addition is completed, the resulting mixture is stirred at room temperature for 24 hours. The viscous solution is precipitated in 12 liters of vigorously stirred deionized water. The polymer is collected by filtration and washed with deionized water and a water/methanol (50/50) mixture. The polymer is dried under vacuum conditions at 40° C. for 24 hours. The yield is almost quantitative.

Synthesis Example 16

Preparation of a PBO Precursor Polymer End Capped with an Imide Endcap

An Example of Structure VII*

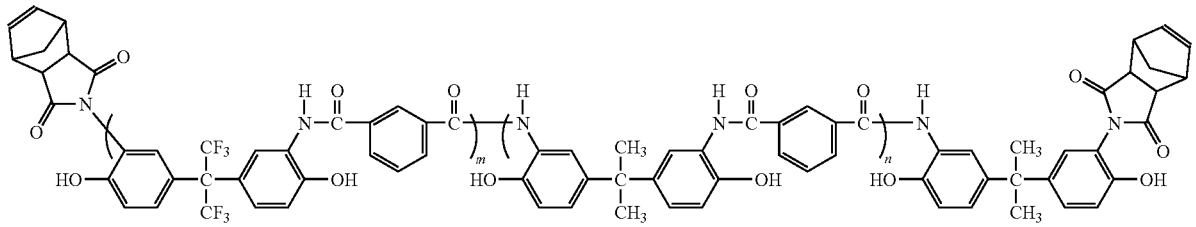

This polymer is prepared according to Synthesis Example 2 except the starting polymer is the one prepared by Synthesis Example 15.

Synthesis Example 17

Preparation of a PBO Precursor Blocked with Ethyl Vinyl Ether

An Example of II*

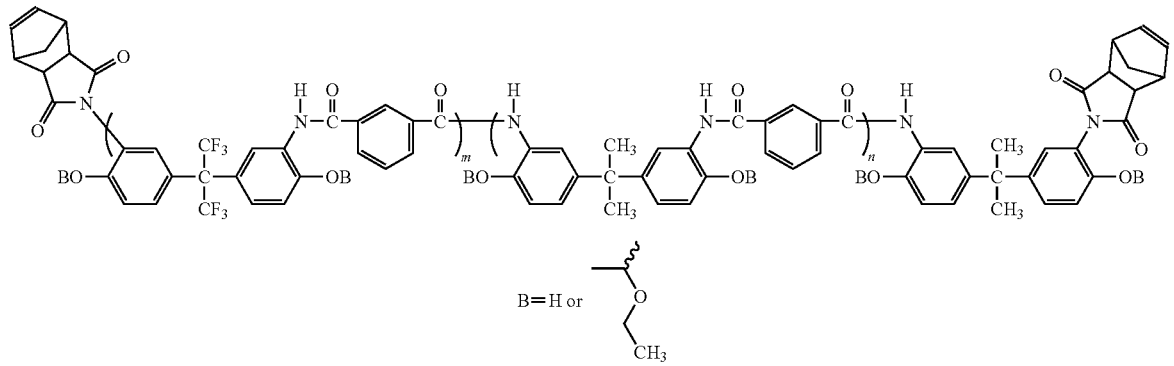

This polymer is prepared according to Synthesis Example 4 except the starting polymer is the one prepared by Synthesis Example 16.

Example 31

A positive acting photosensitive composition is prepared by mixing 150 parts by weight of a polymer prepared by the method described in Synthesis Example 17, 50 parts by weight of a polymer prepared by the method described in Synthesis Example 14, 4 part by weight of S-(octanoyl) mercaptopropyltriethoxy-silane, 0.1 parts by weight of N-methylpyrolidine, 0.1 parts by weight of N,N'-diethylpiperazine, 2 parts by weight of photoacid generator shown below, 2 parts by weight of (5-propylsulfonyloxyimino-5H-thiophen-2-ylidene)-2-methylphenyl-acetonitrile, 12 parts of tri(propylene glycol)butyl ether, 6 parts by weight of 3,4-dihydroxy benzophenone, 8 parts by weight N,N-dimethylformamide (DMF), and 10 parts by weight of propylene glycol methyl ether (PGME) and is filtered through a 0.2 µm Teflon filter.

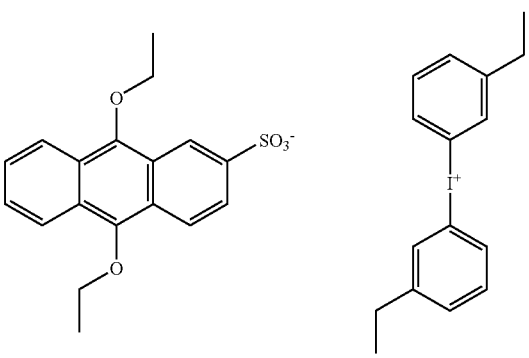

Photo Acid Generator of Example 31

A silicon wafer is then coated with the photosensitive composition from above and hotplate baked for 4 minutes at 110° C., resulting in a film thickness of 9.0 μm. The film is exposed utilizing an i-line stepper with a patterned exposure array. Segments of the film on the wafer are exposed at various levels of exposure energy using a Canon 4000 IE i-line stepper. The wafer is post exposure baked at 130° C. for 120 seconds. The wafer is developed with 2.38% aqueous TMAH solution using two 40 second puddle development step. The developed film is rinsed with deionized water and dried by spinning for 20 seconds at 4900 rpm to provide a relief pattern. 8 μm features are resolved.

Example 32

A positive acting photosensitive composition is prepared by mixing 50 parts by weight of a polymer prepared by the method described in Synthesis Example 17, 50 parts by weight of a polymer prepared by the method described in Synthesis Example 14, 100 parts by weight of a polymer prepared by the method described in Synthesis Example 4, 3.75 part by weight of (3-triethoxysilylpropyl)-t-butylcarbamate, 0.12 parts by weight of a tertiary base shown below, 3.5 parts by weight of tris(-t-butylphenyl)sulfonium benzenesulfonate, 1 parts by weight of 9,10-dibutoxyanthracene, 8 parts of di(propylene glycol)methyl ether, 7 parts by weight of di(propylene glycol)dimethyl ether), and 15 parts by weight of propylene glycol methyl ether (PGME) and is filtered through a 0.2 μm Teflon filter.

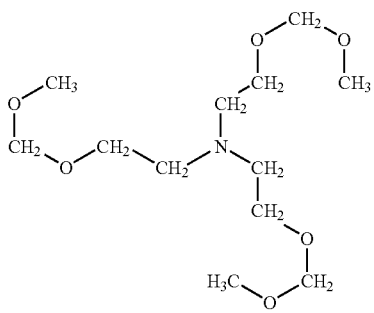 [SMILES: COCOCCN(CCOCOC)CCOCOC]

Base of Example 32

A silicon wafer is then coated with the photosensitive composition from above and hotplate baked for 3.5 minutes at 112.5° C., resulting in a film thickness of 9.0 μm. The film is exposed utilizing an i-line stepper with a patterned exposure array. Segments of the film on the wafer are exposed at various levels of exposure energy using a Canon 4000 IE i-line stepper. The wafer is post exposure baked at 127.5° C. for 95 seconds. The wafer is developed with 2.38% aqueous TMAH solution using two 45 second puddle development step. The developed film is rinsed with deionized water and dried by spinning for 20 seconds at 4900 rpm to provide a relief pattern. 8 μm features are resolved.

Comparative Example 7

A positive acting photosensitive composition was prepared by mixing 200 parts by weight of a polymer solution prepared by the method described in Synthesis Example 4, 7 parts by weight of (3-glycidoxypropyl)trimethoxysilane, 7 parts by weight of triethoxysilylpropyl ethoxycarbamate, 5 parts by weight of (5-propylsulfonyloxyimino-5H-thiophen-2-ylidene)-2-methylphenyl-acetonitrile, 10 parts by weight of propylene carbonate, 10 parts by weight of tripropylene glycol, 24 parts by weight of PGMEA and 31 parts by weight GBL and filtered through a 0.2 μm Teflon filter.

A silicon wafer was then coated with the photosensitive composition from above and hotplate baked for 3 minutes at 115° C., resulting in a film thickness of 8.50 μm. The film was exposed utilizing an i-line stepper with a patterned exposure array. Segments of the film on the wafer were exposed at various levels of exposure energy using a Canon 4000 IE i-line stepper. The wafer was post exposure baked at 135° C. for 90 seconds. The wafer was developed with 2.38% aqueous TMAH solution using one standing 60 second puddle development step. The developed film was rinsed with deionized water and dried by spinning for 10 seconds at 5000 rpm to provide a relief pattern. The film thickness after development was 8.42 μm. Unexposed film thickness loss was 0.8%. 8 μm features were resolved at an exposure energy of 155 mJ/cm$^2$. These features were carefully investigated by SEM and some chemical undercut was observed.

Comparative Example 8

A positive acting photosensitive composition was prepared by mixing 200 parts by weight of a polymer solution prepared by the method described in Synthesis Example 4, 7 parts by weight of (3-glycidoxypropyl)trimethoxysilane, 7 parts by weight of triethoxysilylpropyl ethoxycarbamate, 0.4 parts by weight of triphenyl amine, 5 parts by weight of (5-propylsulfonyloxyimino-5H-thiophen-2-ylidene)-2-methylphenyl-acetonitrile, 10 parts by weight of propylene carbonate, 10 parts by weight of tripropylene glycol, 24 parts by weight of PGMEA and 31 parts by weight GBL and filtered through a 0.2 μm Teflon filter.

A silicon wafer was then coated with the photosensitive composition from above and hotplate baked for 3 minutes at 115° C., resulting in a film thickness of 8.54 μm. The film was exposed utilizing an i-line stepper with a patterned exposure array. Segments of the film on the wafer were exposed at various levels of exposure energy using a Canon 4000 IE i-line stepper. The wafer was post exposure baked at 135° C. for 90 seconds. The wafer was developed with 2.38% aqueous TMAH solution using one standing 60 second puddle development step. The developed film was rinsed with deionized water and dried by spinning for 10 seconds at 5000 rpm to provide a relief pattern. The film thickness after development was 8.46 μm. Unexposed film thickness loss was 0.99%. 8 μm features were resolved at an exposure energy of 105 mJ/cm$^2$. These features were carefully investigated by SEM and some chemical undercut was observed.

Comparative Example 9

A positive acting photosensitive composition was prepared by mixing 200 parts by weight of a polymer solution prepared by the method described in Synthesis Example 4, 7 parts by weight of (3-glycidoxypropyl)trimethoxysilane, 7 parts by weight of triethoxysilylpropyl ethoxycarbamate, 0.79 parts by weight of triphenyl amine, 5 parts by weight of (5-propylsulfonyloxyimino-5H-thiophen-2-ylidene)-2-methylphenyl-acetonitrile, 10 parts by weight of propylene carbonate, 10 parts by weight of tripropylene glycol, 24 parts by weight of PGMEA and 31 parts by weight GBL and filtered through a 0.2 μm Teflon filter.

A silicon wafer was then coated with the photosensitive composition from above and hotplate baked for 3 minutes at 115° C., resulting in a film thickness of 8.54 µm. The film was exposed utilizing an i-line stepper with a patterned exposure array. Segments of the film on the wafer were exposed at various levels of exposure energy using a Canon 4000 IE i-line stepper. The wafer was post exposure baked at 135° C. for 90 seconds. The wafer was developed with 2.38% aqueous TMAH solution using one standing 60 second puddle development step. The developed film was rinsed with deionized water and dried by spinning for 10 seconds at 5000 rpm to provide a relief pattern. The film thickness after development was 8.46 µm. Unexposed film thickness loss was 0.99%. 8 µm features were resolved at an exposure energy of 100 mJ/cm². These features were carefully investigated by SEM and some chemical undercut was observed.

Example 33

A positive acting photosensitive composition was prepared by mixing 200 parts by weight of a polymer solution prepared by the method described in Synthesis Example 4, 7 parts by weight of (3-glycidoxypropyl)trimethoxysilane, 7 parts by weight of triethoxysilylpropyl ethoxycarbamate, 0.3 parts by weight of N-phenyl diethanolamine, 5 parts by weight of (5-propylsulfonyloxyimino-5H-thiophen-2-ylidene)-2-methylphenyl-acetonitrile, 10 parts by weight of propylene carbonate, 10 parts by weight of tripropylene glycol, 24 parts by weight of PGMEA and 31 parts by weight GBL and filtered through a 0.2 µm Teflon filter.

A silicon wafer was then coated with the photosensitive composition from above and hotplate baked for 3 minutes at 115° C., resulting in a film thickness of 8.55 µm. The film was exposed utilizing an i-line stepper with a patterned exposure array. Segments of the film on the wafer were exposed at various levels of exposure energy using a Canon 4000 IE i-line stepper. The wafer was post exposure baked at 135° C. for 90 seconds. The wafer was developed with 2.38% aqueous TMAH solution using one standing 60 second puddle development step. The developed film was rinsed with deionized water and dried by spinning for 10 seconds at 5000 rpm to provide a relief pattern. The film thickness after development was 8.46 µm. Unexposed film thickness loss was 1.04%. 8 µm features were resolved at an exposure energy of 235 mJ/cm². These features were carefully investigated by SEM and no chemical undercut was observed.

Example 34

A positive acting photosensitive composition was prepared by mixing 200 parts by weight of a polymer solution prepared by the method described in Synthesis Example 4, 7 parts by weight of (3-glycidoxypropyl)trimethoxysilane, 7 parts by weight of triethoxysilylpropyl ethoxycarbamate, 0.59 parts by weight of N-phenyl diethanolamine, 5 parts by weight of (5-propylsulfonyloxyimino-5H-thiophen-2-ylidene)-2-methylphenyl-acetonitrile, 10 parts by weight of propylene carbonate, 10 parts by weight of tripropylene glycol, 24 parts by weight of PGMEA and 31 parts by weight GBL and filtered through a 0.2 µm Teflon filter.

A silicon wafer was then coated with the photosensitive composition from above and hotplate baked for 3 minutes at 115° C., resulting in a film thickness of 8.64 µm. The film was exposed utilizing an i-line stepper with a patterned exposure array. Segments of the film on the wafer were exposed at various levels of exposure energy using a Canon 4000 IE i-line stepper. The wafer was post exposure baked at 135° C. for 90 seconds. The wafer was developed with 2.38% aqueous TMAH solution using one standing 60 second puddle development step. The developed film was rinsed with deionized water and dried by spinning for 10 seconds at 5000 rpm to provide a relief pattern. The film thickness after development was 8.49 µm. Unexposed film thickness loss was 1.70%. 8 µm features were resolved at an exposure energy of 335 mJ/cm². These features were carefully investigated by SEM and no chemical undercut was observed.

Example 35

A positive acting photosensitive composition was prepared by mixing 200 parts by weight of a polymer solution prepared by the method described in Synthesis Example 4, 7 parts by weight of (3-glycidoxypropyl)trimethoxysilane, 7 parts by weight of triethoxypropyl ethyl carbamate, 0.59 parts by weight of N-phenyl diethanolamine, 1.58 parts by weight of triphenylamine, 5 parts by weight of (5-propylsulfonyloxyimino-5H-thiophen-2-ylidene)-2-methylphenyl-acetonitrile, 10 parts by weight of propylene carbonate, 10 parts by weight of tripropylene glycol, 20 parts by weight of PGMEA, and 26 parts by weight GBL and filtered through a 0.2 µm Teflon filter.

A silicon wafer was then coated with the photosensitive composition from above and hotplate baked for 3 minutes at 115° C., resulting in a film thickness of 8.49 µm. The film was exposed utilizing an i-line stepper with a patterned exposure array. Segments of the film on the wafer were exposed at various levels of exposure energy using a Canon 4000 IE i-line stepper. The wafer was post exposure baked at 135° C. for 90 seconds. The wafer was developed with a 2.38% aqueous TMAH solution using one standing 60 second puddle development step. The developed film was rinsed with deionized water and dried by spinning for 10 seconds at 5,000 rpm to provide a relief pattern. The film thickness after development was 8.40 µm. Unexposed film thickness loss was 1.02%. 8 µm features were resolved at an exposure energy of 200 mJ/cm². These features were carefully investigated by SEM and no chemical undercut was observed.

Comparison between the results in Example 34 and 35 indicated that addition of triphenylamine increased the photospeed of the photosensitive composition without incurring any chemical undercut. It is therefore believed that triphenylamine can be used to increase the photospeed of a photosensitive composition if the photospeed of the composition is too slow for practical purposes.

While the disclosure has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

What is claimed is:
1. A composition, comprising:
(a) at least one polybenzoxazole precursor polymer, the polybenzoxazole precursor polymer has Structure I, II, or II*:

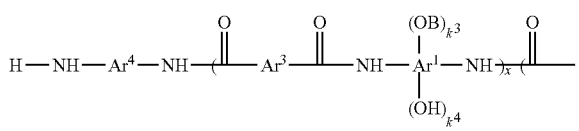

Structure I

-continued

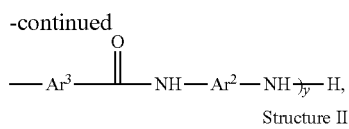
Structure II

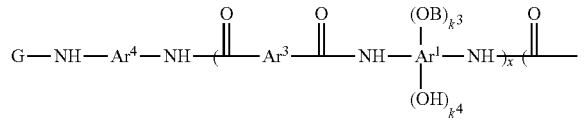

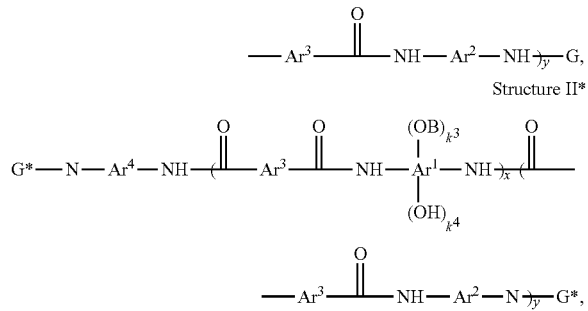

in which $Ar^1$ is a tetravalent aromatic group, a tetravalent heterocyclic group, or mixtures thereof; $Ar^2$ is a divalent aromatic or a divalent heterocyclic; $Ar^3$ is a divalent aromatic group, a divalent heterocyclic group, or mixtures thereof; $Ar^4$ is $Ar^1(OB)_{k}{}^3(OH)_{k}{}^4$ or $Ar^2$; x is an integer from about 4 to about 1000, y is an integer from 0 to about 500, provided that $(x+y) \leq 1000$; B is an acid sensitive group $R^1$ or a moiety $E-O-R^2$ containing an acid sensitive group $R^2$, E is a divalent group which is not acid labile and makes an -E-OH moiety an aqueous base solubilizing group, E being selected from the group consisting of an aromatic group, and a heterocyclic group, provided that $R^1$, in combination with the O atom attached to the $Ar^1$ group, is not a carbonate group; $k^3$ is a fractional number between 0.1 and 2, $k^4$ is a fractional number between 0 and 1.9 provided that $(k^3+k^4)= 2$; G is a substituted or unsubstituted monovalent organic group having a carbonyl, carbonyloxy or sulfonyl group attached directly to the terminal NH of the polymer, and G* is a substituted or unsubstituted divalent organic group having at least one carbonyl or sulfonyl group attached directly to the terminal N of the polymer;

(b) at least one photoacid generator; and
(c) at least a first basic compound selected from the group consisting of
tertiary amines of Structure XIV:

Structure XIV in which $R^{30}$, $R^{31}$, and $R^{32}$ are independently selected from the group consisting of a $C_1$-$C_{30}$ substituted or unsubstituted linear, branched, or cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ substituted or unsubstituted alkyl group containing at least one ether linkage, in which at least one of $R^{30}$, $R^{31}$, and $R^{32}$ is selected from the group consisting of a $C_1$-$C_{30}$ substituted or unsubstituted cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ substituted or unsubstituted alkyl group containing at least one ether linkage, and not all of $R^{30}$, $R^{31}$, and $R^{32}$ are a $C_6$-$C_{30}$ substituted or unsubstituted aryl;

wherein the acid sensitive group $R^1$ or $R^2$ is a group capable of reacting with an acid to form an aqueous base solubilizing group and the first basic compound is from about 0.001 wt % to about 3 wt % of the composition.

2. The composition of claim 1, wherein the first basic compound is selected from the group consisting of
tertiary amines of Structure XIV, in which $R^{30}$, $R^{31}$, and $R^{32}$ are independently selected from the group consisting of a $C_1$-$C_{30}$ substituted or unsubstituted linear, branched, or cyclic alkyl, a $C_3$-$C_{30}$ tertiary aminoalkyl, a $C_2$-$C_{30}$ substituted or unsubstituted linear, branched, or cyclic hydroxyalkyl, and a $C_1$-$C_{30}$ substituted or unsubstituted alkyl group containing at least one ether linkage, in which at least one of $R^{30}$, $R^{31}$, and $R^{32}$ is selected from the group consisting of a $C_1$-$C_{30}$ substituted or unsubstituted cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ substituted or unsubstituted alkyl group containing at least one ether linkage, and not all of $R^{30}$, $R^{31}$, and $R^{32}$ are a $C_6$-$C_{30}$ substituted or unsubstituted aryl.

3. The composition of claim 2, wherein the first basic compound comprises a tertiary amine of Structure XIV, in which $R^{30}$, $R^{31}$, and $R^{32}$ are independently selected from the group consisting of a $C_3$-$C_{30}$ substituted or unsubstituted linear, branched, or cyclic alkyl, a $C_3$-$C_{15}$ tertiary aminoalkyl, a $C_3$-$C_{30}$ substituted or unsubstituted linear, branched, or cyclic hydroxyalkyl, and a $C_1$-$C_{30}$ substituted or unsubstituted alkyl group containing at least one ether linkage, in which at least two of $R^{30}$, $R^{31}$, and $R^{32}$ have at least two substituents on the carbon atom bonded to the tertiary nitrogen atom or at least one of $R^{30}$, $R^{31}$, and $R^{32}$ has a $C_1$-$C_{30}$ substituted or unsubstituted alkyl group containing at least one ether linkage.

4. The composition of claim 3, wherein the first basic compound comprises a tertiary amine of Structure XIV, in which $R^{30}$, $R^{31}$, and $R^{32}$ are independently selected from the group consisting of a $C_3$-$C_{15}$ substituted or unsubstituted linear, branched, or cyclic alkyl, a $C_3$-$C_{10}$ tertiary aminoalkyl, a $C_3$-$C_{15}$ substituted or unsubstituted linear, branched, or cyclic hydroxyalkyl, and a $C_3$-$C_{15}$ substituted or unsubstituted alkyl group containing at least one ether linkage, in which at least two of $R^{30}$, $R^{31}$, and $R^{32}$ have at least two substituents on the carbon atom bonded to the tertiary nitrogen atom or at least one of $R^{30}$, $R^{31}$, and $R^{32}$ has a $C_3$-$C_{15}$ substituted or unsubstituted alkyl group containing at least one ether linkage.

5. The composition of claim 2, further comprising an adhesion promoter.

6. The composition of claim 5, wherein the adhesion promoter comprises a compound selected from the group consisting of vinylalkoxysilanes, methacryloxalkoxysilanes, mercaptoalkoxysilanes, epoxyalkoxysilanes and glycidoxyalkoxysilanes.

7. The composition of claim 6, wherein the adhesion promoter comprises a compound selected from the group consisting of epoxyalkoxysilanes and glycidoxyalkoxysilanes.

8. The composition of claim 2, further comprising a solvent.

9. The composition of claim 2, wherein the first basic compound is from about 0.01 wt % to about 1.5 wt % of the composition.

10. The composition of claim 1, further comprising an adhesion promoter.

11. The composition of claim 10, wherein the adhesion promoter comprises a compound selected from the group consisting of vinylalkoxysilanes, methacryloxalkoxysilanes, mercaptoalkoxysilanes, epoxyalkoxysilanes and glycidoxyalkoxysilanes.

12. The composition of claim 11, wherein the adhesion promoter comprises a compound selected from the group consisting of epoxyalkoxysilanes and glycidoxyalkoxysilanes.

13. The composition of claim 1, further comprising a solvent.

14. The composition of claim 1, wherein the first basic compound is from about 0.01 wt % to about 1.5 wt % of the composition.

15. The composition of claim 1, further comprising a second basic compound different from the first basic compound, the second basic compound being a tertiary amine of Structure XIV, in which $R^{30}$, $R^{31}$, and $R^{32}$ are $C_6$-$C_{30}$ substituted or unsubstituted aryl.

16. The composition of claim 15, wherein $R^{30}$, $R^{31}$, and $R^{32}$ in the second basic compound are substituted or unsubstituted phenyl.

17. A film comprising a composition of claim 1.

18. The film of claim 17, wherein the film has a thickness of at least about 5 μm.

19. The film of claim 17, wherein the film has a thickness of at least about 8 μm.

20. The film of claim 17, wherein the film has a thickness of at least about 10 μm.

21. An article, comprising:
a substrate; and
a film of claim 17 supported by the substrate.

22. The article of claim 21, wherein the substrate comprises a wafer.

23. The article of claim 22, wherein the wafer is a silicon wafer, a ceramic wafer, a glass wafer, a metal wafer, or a plastic wafer.

24. The article of claim 22, wherein the wafer is a copper coated wafer.

25. A method, comprising treating a composition of claim 1 on a substrate to form a relief pattern on the substrate.

26. The method of claim 25, further comprising applying the composition to the substrate prior to treating the composition.

27. The method of claim 26, wherein treating the composition comprises baking the composition to form a baked composition.

28. The method of claim 27, wherein treating the composition further comprises exposing the baked composition to actinic radiation to form an exposed composition.

29. The method of claim 28, wherein treating the composition further comprises developing the exposed composition with an aqueous developer, thereby forming an uncured relief image on the substrate.

30. The method of claim 29, wherein treating composition further comprises curing the relief image.

31. An article prepared by the method of claim 25.

32. The composition of claim 1, wherein $R^1$, in combination with the O atom attached to the $Ar^1$ group, is an acetal group, a ketal group, an ether group, or a silyl ether group.

33. The composition of claim 1, wherein $R^1$ is

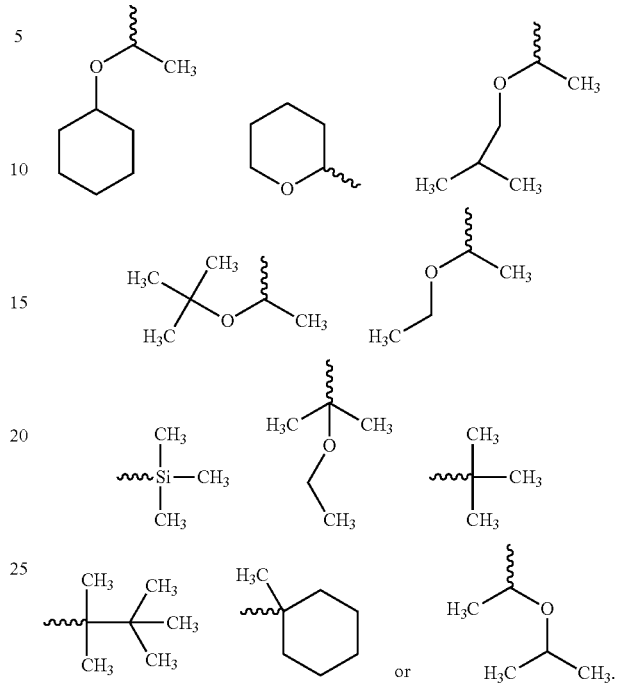

34. The composition of claim 1, wherein $R^1$ is

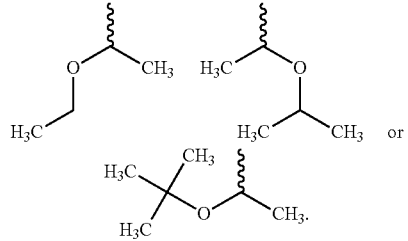

35. The composition of claim 1, wherein $R^2$, in combination with E-O, comprises an acetal group, a ketal group, an ether group, a silyl ether group, an acid sensitive methylene ester groups, an acid sensitive ester group, or a carbonate.

36. The composition of claim 1, wherein E-O—$R^2$ is

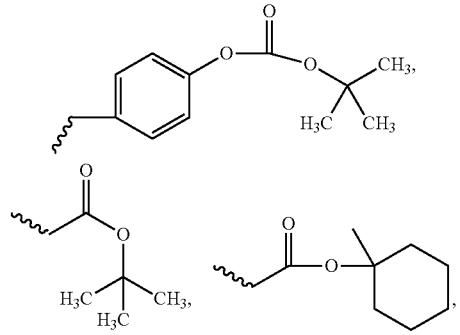

-continued
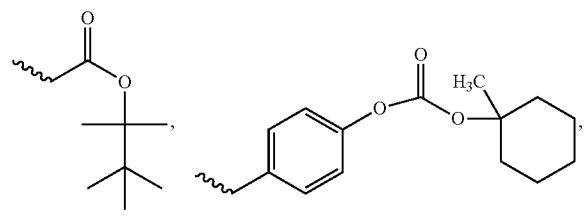
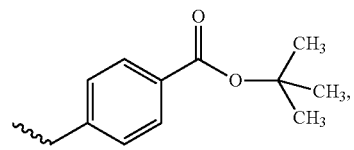
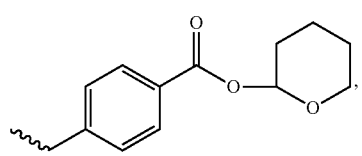
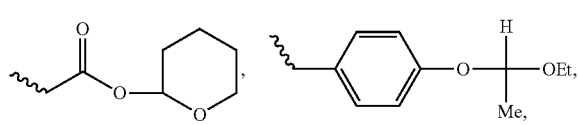
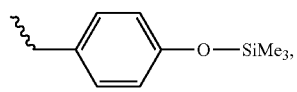
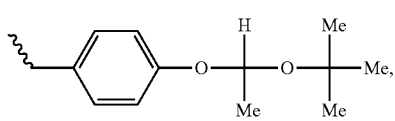
-continued
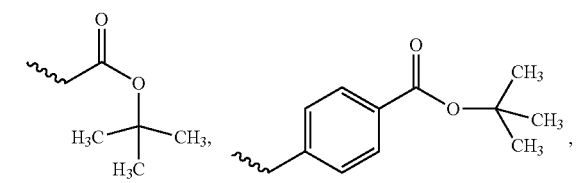
37. The composition of claim 1, wherein E-O—$R^2$ is
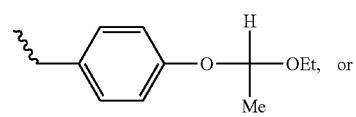
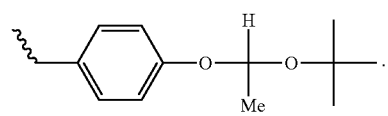
38. A composition, comprising:
(a) at least one polybenzoxazole precursor polymer, the polybenzoxazole precursor polymer has Structure I, II, or II*:
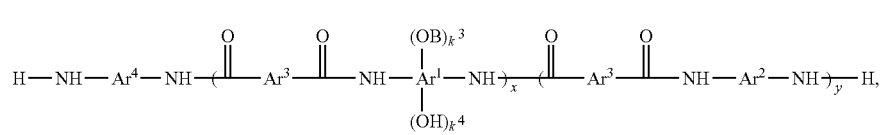
Structure I
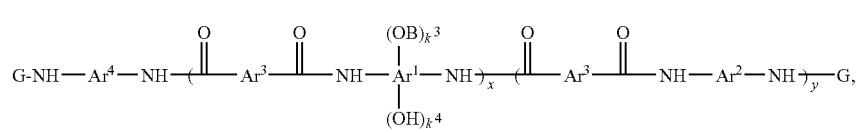
Structure II
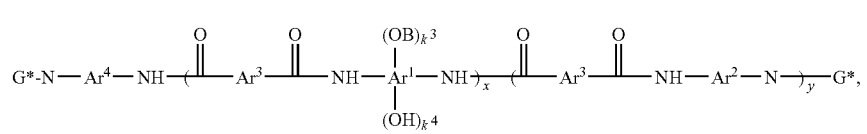
Structure II* in which $Ar^1$ is a tetravalent aromatic group, a tetravalent heterocyclic group, or mixtures thereof; $Ar^2$ is a divalent aromatic or a divalent heterocyclic; $Ar^3$ is a divalent aromatic group, a divalent heterocyclic group, or mixtures thereof; $Ar^4$ is $Ar^1(OB)_k{}^3(OH)_k{}^4$ or $Ar^2$; x is an integer from about 4 to about 1000, y is an integer from 0 to about 500, provided that $(x+y) \leq 1000$; B is an acid sensitive group $R^1$ or a moiety E-O—$R^2$ containing an acid sensitive group $R^2$, E is a divalent group which is not acid labile and makes an -E-OH moiety an aqueous base solubilizing group, E being selected from the group consisting of

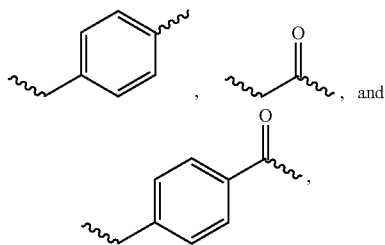

, and linear, branched, or cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ substituted or unsubstituted alkyl group containing at least one ether linkage, in which at least one of $R^{30}$, $R^{31}$, and $R^{32}$ is selected from the group consisting of a $C_1$-$C_{30}$ substituted or unsubstituted cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ substituted or unsubstituted alkyl group containing at least one ether linkage, and not all of $R^{30}$, $R^{31}$, and $R^{32}$ are a $C_6$-$C_{30}$ substituted or unsubstituted aryl;

wherein the acid sensitive group $R^1$ or $R^2$ is a group capable of reacting with an acid to form an aqueous base solubilizing group and the first basic compound is from about 0.001 wt % to about 3 wt % of the composition.

39. A composition, comprising:
(a) at least one polybenzoxazole precursor polymer, the polybenzoxazole precursor polymer has Structure I, II, or II*:

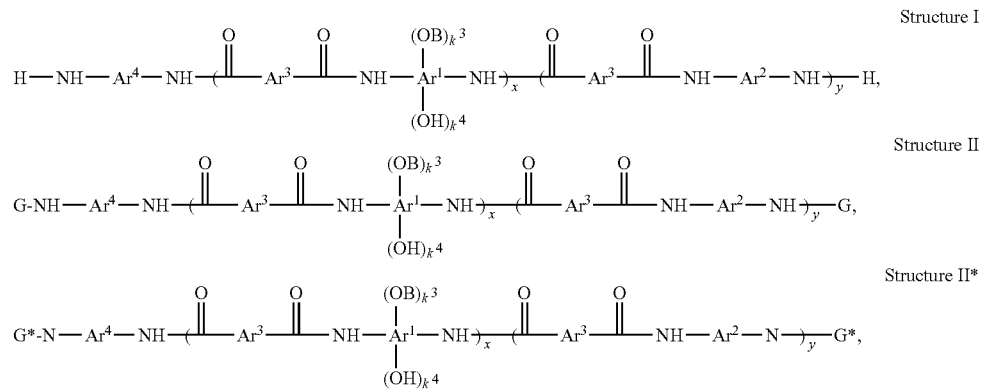

provided that $R^1$, in combination with the O atom attached to the $Ar^1$ group, is not a carbonate group; $k^3$ is a fractional number between 0.1 and 2, $k^4$ is a fractional number between 0 and 1.9 provided that $(k^3+k^4)=2$; G is a substituted or unsubstituted monovalent organic group having a carbonyl, carbonyloxy or sulfonyl group attached directly to the terminal NH of the polymer, and G* is a substituted or unsubstituted divalent organic group having at least one carbonyl or sulfonyl group attached directly to the terminal N of the polymer;

(b) at least one photoacid generator; and
(c) at least a first basic compound selected from the group consisting of tertiary amines of Structure XIV:

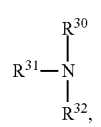

Structure XIV in which $R^{30}$, $R^{31}$, and $R^{32}$ are independently selected from the group consisting of a $C_1$-$C_{30}$ substituted or unsubstituted in which $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that optionally contains silicon; $Ar^3$ is a divalent aromatic group, a divalent aliphatic group, a divalent heterocyclic group, or mixtures thereof; $Ar^4$ is $Ar^1(OB)_k{}^3(OH)_k{}^4$ or $Ar^2$; x is an integer from about 10 to about 1000, y is an integer from 0 to about 500, provided that $(x+y) \leq 1000$; B is an acid sensitive group $R^1$ or a moiety E-O—$R^2$ containing an acid sensitive group $R^2$, E is a divalent group which is not acid labile and makes an -E-OH moiety an aqueous base solubilizing group, E being selected from the group consisting of an aromatic group, an aliphatic group, and a heterocyclic group, provided that $R^1$, in combination with the O atom attached to the $Ar^1$ group, is not a carbonate group; $k^3$ is a fractional number between 0.1 and 2, $k^4$ is a fractional number between 0 and 1.9 provided that $(k^3+k^4)=2$; G is a substituted or unsubstituted monovalent organic group having a carbonyl, carbonyloxy or sulfonyl group attached directly to the terminal NH of the polymer, and G* is a substituted or unsubstituted divalent organic group having at least one carbonyl or sulfonyl group attached directly to the terminal N of the polymer;

(b) at least one photoacid generator; and
(c) at least a first basic compound selected from the group consisting of
tertiary amines of Structure XIV:

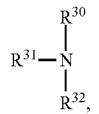

Structure XIV in which $R^{30}$, $R^{31}$, and $R^{32}$ are independently selected from the group consisting of a $C_1$-$C_{30}$ substituted or unsubstituted linear, branched, or cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ substituted or unsubstituted alkyl group containing at least one ether linkage, in which at least one of $R^{30}$, $R^{31}$, and $R^{32}$ is selected from the group consisting of a $C_1$-$C_{30}$ substituted or unsubstituted cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ substituted or unsubstituted alkyl group containing at least one ether linkage, and not all of $R^{30}$, $R^{31}$, and $R^{32}$ are a $C_6$-$C_{30}$ substituted or unsubstituted aryl;
wherein the acid sensitive group $R^1$ or $R^2$ is a group capable of reacting with an acid to form an aqueous base solubilizing group and the first basic compound is from about 0.001 wt % to about 3 wt % of the composition.

40. A composition, comprising:
(a) at least one polybenzoxazole precursor polymer, the polybenzoxazole precursor polymer has Structure I, II, or II*:

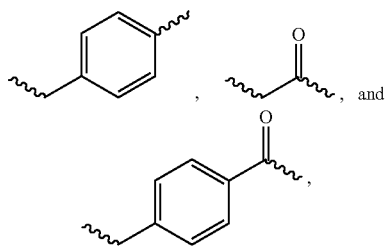

provided that $R^1$, in combination with the O atom attached to the $Ar^1$ group, is not a carbonate group; $k^3$ is a fractional number between 0.1 and 2, $k^4$ is a fractional number between 0 and 1.9 provided that $(k^3+k^4)=2$; G is a substituted or unsubstituted monovalent organic group having a carbonyl, carbonyloxy or sulfonyl group attached directly to the terminal NH of the polymer, and G* is a substituted or unsubstituted divalent organic group having at least one carbonyl or sulfonyl group attached directly to the terminal N of the polymer;
(b) at least one photoacid generator; and
(c) at least a first basic compound selected from the group consisting of
tertiary amines of Structure XIV:

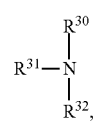

Structure XIV in which $R^{30}$, $R^{31}$, and $R^{32}$ are independently selected from the group consisting of a $C_1$-$C_{30}$ substituted or unsubstituted

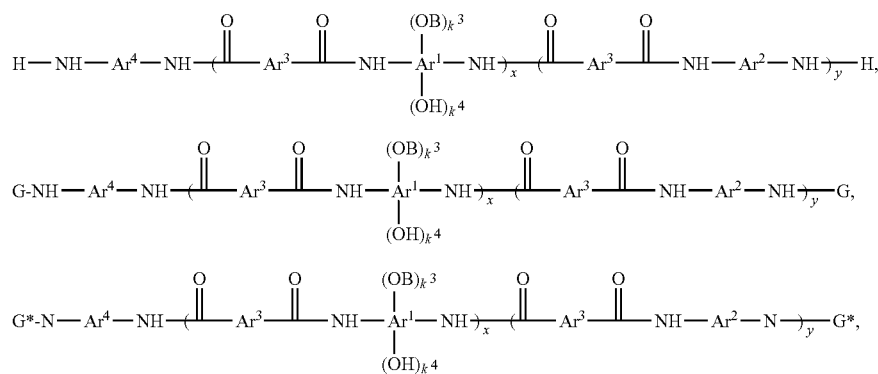

in which $Ar^1$ is a tetravalent aromatic group, a tetravalent heterocyclic group, or mixtures thereof; $Ar^2$ is a divalent aromatic, or a divalent heterocyclic, a divalent alicyclic, or a divalent aliphatic group that optionally contains silicon; $Ar^3$ is a divalent aromatic group, a divalent aliphatic group, a divalent heterocyclic group, or mixtures thereof; $Ar^4$ is $Ar^1(OB)_k^3(OH)_k^4$ or $Ar^2$; x is an integer from about 10 to about 1000, y is an integer from 0 to about 500, provided that $(x+y)\leq1000$; B is an acid sensitive group $R^1$ or a moiety E-O—$R^2$ containing an acid sensitive group $R^2$, E is a divalent group which is not acid labile and makes an -E-OH moiety an aqueous base solubilizing group, E being selected from the group consisting of linear, branched, or cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ substituted or unsubstituted alkyl group containing at least one ether linkage, in which at least one of $R^{30}$, $R^{31}$, and $R^{32}$ is selected from the group consisting of a $C_1$-$C_{30}$ substituted or unsubstituted cyclic alkyl, a $C_3$-$C_{30}$ tertiary aminoalkyl, a $C_2$-$C_{30}$ substituted or unsubstituted linear, branched, or cyclic hydroxyalkyl, a $C_6$-$C_{30}$ substituted or unsubstituted aryl, and a $C_1$-$C_{30}$ substituted or unsubstituted alkyl group containing at least one ether linkage, and not all of $R^{30}$, $R^{31}$, and $R^{32}$ are a $C_6$-$C_{30}$ substituted or unsubstituted aryl;

wherein the acid sensitive group $R^1$ or $R^2$ is a group capable of reacting with an acid to form an aqueous base solubilizing group and the first basic compound is from about 0.001 wt % to about 3 wt % of the composition.

* * * * *

UNITED STATES PATENT AND TRADEMARK OFFICE
CERTIFICATE OF CORRECTION

PATENT NO. : 9,519,216 B2  
APPLICATION NO. : 12/363492  
DATED : December 13, 2016  
INVENTOR(S) : Ahmad A. Naiini et al.

Page 1 of 1

It is certified that error appears in the above-identified patent and that said Letters Patent is hereby corrected as shown below:

In the Claims

Column 88
Line 59, in Claim 6, delete "methacryloxalkoxysilanes," and insert -- methacryloxyalkoxysilanes, --

Column 89
Line 8, in Claim 11, delete "methacryloxalkoxysilanes," and insert -- methacryloxyalkoxysilanes, --

Column 91

Lines 25-30, in Claim 38, delete " 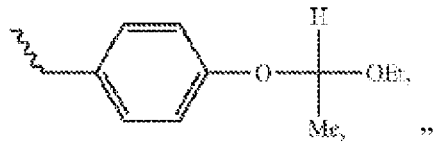 "

and insert -- 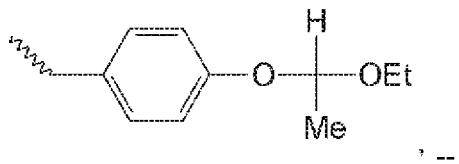 , --

Signed and Sealed this  
Twenty-eighth Day of February, 2017

Michelle K. Lee  
*Director of the United States Patent and Trademark Office*